US010129978B2

(12) United States Patent
Ishida et al.

(10) Patent No.: US 10,129,978 B2
(45) Date of Patent: Nov. 13, 2018

(54) PRINTED WIRING BOARD

(71) Applicants: FUJIKURA LTD., Tokyo (JP); DDK LTD., Tokyo (JP)

(72) Inventors: Yuki Ishida, Tokyo (JP); Masayuki Suzuki, Tokyo (JP); Harunori Urai, Tokyo (JP); Isao Kojima, Tokyo (JP)

(73) Assignees: FUJIKURA LTD., Tokyo (JP); DDK LTD., Tokyo (JP)

( * ) Notice: Subject to any disclaimer, the term of this patent is extended or adjusted under 35 U.S.C. 154(b) by 0 days.

(21) Appl. No.: 15/513,459

(22) PCT Filed: Sep. 15, 2015

(86) PCT No.: PCT/JP2015/076090
§ 371 (c)(1),
(2) Date: Mar. 22, 2017

(87) PCT Pub. No.: WO2016/047492
PCT Pub. Date: Mar. 31, 2016

(65) Prior Publication Data
US 2017/0303395 A1 Oct. 19, 2017

(30) Foreign Application Priority Data
Sep. 22, 2014 (JP) ................................ 2014-192485

(51) Int. Cl.
*H05K 1/11* (2006.01)
*H05K 1/02* (2006.01)
(Continued)

(52) U.S. Cl.
CPC ........... *H05K 1/111* (2013.01); *H05K 1/0218* (2013.01); *H05K 1/0245* (2013.01); *H05K 1/118* (2013.01);
(Continued)

(58) Field of Classification Search
CPC ........ H05K 1/111; H05K 3/22; H05K 1/0245; H05K 3/4644; H05K 2201/09236
See application file for complete search history.

(56) References Cited

U.S. PATENT DOCUMENTS 5,679,008 A 10/1997 Takahashi et al.
6,787,710 B2 * 9/2004 Uematsu ................ H05K 1/115 174/255
(Continued)

FOREIGN PATENT DOCUMENTS

CN 1972558 A 5/2007
CN 1993013 A 7/2007
(Continued)

OTHER PUBLICATIONS

Pre-report in corresponding Japanese Patent Application No. 2014-192485 dated Sep. 8, 2016 (6 pages).
(Continued)

*Primary Examiner* — Ishwarbhai B Patel
(74) *Attorney, Agent, or Firm* — Osha Liang LLP

(57) ABSTRACT

A printed wiring board includes one or more substrates, the one or more substrates including at least a first substrate, the first substrate being formed with a pad and a ground layer at any one of main surfaces of the first substrate, the pad being to be electrically connected to a connector as another component, the ground layer being formed to surround the pad from a circumference of the pad and have an inner edge at a location separated from an outer edge of the pad with a predetermined distance, the ground layer being to be grounded to a ground contact.

7 Claims, 70 Drawing Sheets

(51) Int. Cl.
*H05K 3/22* (2006.01)
*H05K 3/46* (2006.01)

(52) U.S. Cl.
CPC ............. *H05K 3/22* (2013.01); *H05K 3/4644* (2013.01); *H05K 1/0216* (2013.01); *H05K 1/0221* (2013.01); *H05K 1/0298* (2013.01); *H05K 1/117* (2013.01); *H05K 2201/09236* (2013.01); *H05K 2201/09363* (2013.01)

(56) References Cited

U.S. PATENT DOCUMENTS

| | | | | |
|---|---|---|---|---|
| 9,444,160 | B2 * | 9/2016 | Tamai | H01R 12/7082 |
| 2006/0014433 | A1 * | 1/2006 | Consoli | H01R 13/6485 439/607.07 |
| 2006/0046569 | A1 | 3/2006 | Kondou et al. | |
| 2007/0102830 | A1 | 5/2007 | Muto et al. | |
| 2007/0144773 | A1 | 6/2007 | Saitou et al. | |
| 2008/0038941 | A1 * | 2/2008 | Bartholomew | H05K 1/0219 439/76.1 |
| 2009/0000804 | A1 | 1/2009 | Kobayashi et al. | |
| 2009/0211088 | A1 | 8/2009 | Bartholomew | |
| 2009/0231816 | A1 | 9/2009 | Lin | |
| 2010/0175251 | A1 | 7/2010 | Muto et al. | |
| 2010/0182105 | A1 | 7/2010 | Hein et al. | |
| 2013/0175077 | A1 | 7/2013 | Kim et al. | |
| 2014/0048323 | A1 * | 2/2014 | Wada | H01L 23/49827 174/262 |
| 2014/0085856 | A1 | 3/2014 | Shirao et al. | |
| 2015/0013155 | A1 | 1/2015 | Kim et al. | |
| 2016/0366759 | A1 | 12/2016 | Kim et al. | |
| 2017/0181282 | A1 | 6/2017 | Ishida et al. | |

FOREIGN PATENT DOCUMENTS

| | | | |
|---|---|---|---|
| CN | 101502187 | A | 8/2009 |
| CN | 106256174 | A | 12/2016 |
| JP | H07-326842 | A | 12/1995 |
| JP | 2001-326440 | A | 11/2001 |
| JP | 2006-024618 | A | 1/2006 |
| JP | 2006-196849 | A | 7/2006 |
| JP | 2007-123741 | A | 5/2007 |
| JP | 2007-180292 | A | 7/2007 |
| JP | 2007/193999 | A | 8/2007 |
| JP | 2009-080972 | A | 4/2009 |
| JP | 2010-530690 | A | 9/2010 |
| JP | 2011-096954 | A | 5/2011 |
| JP | 2011-138845 | A | 7/2011 |
| JP | 2011-238883 | A | 11/2011 |
| JP | 2012-099587 | A | 5/2012 |
| JP | 2015-507358 | A | 3/2015 |
| WO | 2009/111660 | A1 | 9/2009 |
| WO | 2013/103437 | A1 | 7/2013 |

OTHER PUBLICATIONS

Decision of Refusal in corresponding Japanese Patent Application No. 2014-192485 dated May 17, 2016 (4 pages).
Declinement of an Amendment in corresponding Japanese Patent Application No. 2014-192485 dated May 17, 2016 (4 pages).
Office Action in corresponding Japanese Patent Application No. 2014-192485 dated Aug. 4, 2015 (9 pages).
Office Action in corresponding Japanese Patent Application No. 2014-192485 dated Dec. 15, 2015 (8 pages).
Office Action issued in corresponding Taiwanese Application No. 104130896 dated Aug. 16, 2017 (8 pages).
Office Action in counterpart Japanese Patent Application No. 2017-073592 dated Jan. 30, 2018 (6 pages).
Extended European Search Report in counterpart European Application No. 15843513.1 dated Apr. 19, 2018 (8 pages).
Office Action in counterpart Chinese Patent Application No. 201580044942.2 dated Aug. 3, 2018 (19 pages).

* cited by examiner

| MODEL NO. | | NUMBER OF LAYERS | GROOVES SURROUNDING PADS | FORM OF ANALYZED MODEL | | | ANTENNA CHARACTERISTICS MAXIMUM VALUE [dB] |
|---|---|---|---|---|---|---|---|
| | | | | (1) | (2) | (3) | |
| 1-2 | COMPARATIVE EXAMPLE 1 | 1 | ABSENT |  |  | | -3.4043 |
| 1 | WORKING EXAMPLE 1 | | PRESENT |  |  | | -4.2059 |
| 2-2 | COMPARATIVE EXAMPLE 2 | 2 | ABSENT |  |  |  | -27.683 |
| 2 | WORKING EXAMPLE 2 | | PRESENT |  |  |  | -30.406 |

| MODEL NO. | | NUMBER OF LAYERS | GROOVES SURROUNDING PADS | FORM OF ANALYZED MODEL | | | ANTENNA CHARACTERISTICS MAXIMUM VALUE [dB] |
|---|---|---|---|---|---|---|---|
| | | | | (1) | (2) | (3) | |
| 3-1 | COMPARATIVE EXAMPLE 3 | 3 | ABSENT |  |  |  | -25.845 |
| 3 | WORKING EXAMPLE 3 | | PRESENT |  |  |  | -29.234 |

| MODEL NO. | | NUMBER OF LAYERS | GROOVES SURROUNDING PADS/WIRINGS | FORM OF ANALYZED MODEL (1) | FORM OF ANALYZED MODEL (2) | FORM OF ANALYZED MODEL (3) | ANTENNA CHARACTERISTICS MAXIMUM VALUE [dB] |
|---|---|---|---|---|---|---|---|
| 4-21 | COMPARATIVE EXAMPLE 4-1 | 2 | ABSENT |  |  |  | -16.741 |
| 4-22 | COMPARATIVE EXAMPLE 4-2 | | ABSENT |  |  |  | -24.603 |
| 4 | WORKING EXAMPLE 4 | | PRESENT |  |  |  | -29.604 |

| MODEL NO. | | NUMBER OF LAYERS | GROOVES SURROUNDING PADS | FORM OF ANALYZED MODEL | | | ANTENNA CHARACTERISTICS MAXIMUM VALUE [dB] |
|---|---|---|---|---|---|---|---|
| | | | | (1) | (2) | (3) | |
| 5-21 | COMPARATIVE EXAMPLE 5-1 | 3 | ABSENT |  |  |  | -28.884 |
| 5-22 | COMPARATIVE EXAMPLE 5-2 | | ABSENT |  |  |  | -32.03 |
| 5 | WORKING EXAMPLE 5 | | PRESENT |  |  |  | -38.614 |

FIG.10A

SOFTWARE USED HFSS (VERSION 2014) AVAILABLE FROM ANSYS, INC.

ELECTROMAGNETIC FIELD ANALYSIS SOFTWARE USING FINITE ELEMENT METHOD (FEM)

PHYSICAL PROPERTY VALUES OF MATERIALS

| NAME OF COMPONENT | NAME OF MATERIAL | ELECTRICAL CONDUCTIVITY [s/m] | PERMITTIVITY | MAGNETIC PERMEABILITY | DIELECTRIC TANGENT (tan δ) |
|---|---|---|---|---|---|
| POLYAMIDE | POLYAMIDE | — | 3.5 | 1.0 | 0.008 |
| CONDUCTOR (FPC) | COPPER | 58000000 | 1.0 | 1.0 | — |
| AMBIENT ENVIRONMENT | AIR | — | 1.0 | 1.0 | — |

USING PHYSICAL PROPERTY VALUES INSTALLED IN STANDARD HFSS

| | |
|---|---|
| SOLUTION TYPE | DRIVEN TERMINAL |
| CALCULATION FREQUENCY | 20 GHz |
| ACTIVE MESH MAX NUMBER OF PASS | 30 |
| ACTIVE MESH MAX DELTA S | 0.01 |
| SOLUTION OPTION | ITERATIVE SOLVER |
| SOLUTION ORDER OF BASIS FUNCTION | MIX ORDER |
| CALCULATION FREQUENCY BAND | DC ~ 20 GHz, DATA PLOT INTERVAL OF 40 MHz (REFLECTING NUMBER OF DATA ITEMS OF 501 TO DATA OUTPUTS) |
| FREQUENCY SWEEP TYPE | INTERPOLATING SWEEP |
| THRESHOLD OF INTERPOLATING | INITIAL VALUE |
| I/O PORT FORM | LUMPED PORT |
| PORT IMPEDANCE | 50 Ω |
| DIFFERENTIAL IMPEDANCE | 100 Ω |
| COMMON IMPEDANCE | 25 Ω |

FIG.10B

| | | |
|---|---|---|
| EDIT SOURCE (FOR ANTENNA CHARACTERISTIC OUTPUT) | USING TOTAL VOLTAGE AS TERMINAL EXCITATION TYPE<br>INPUTTING DIFFERENTIAL SIGNALS TO Diff-1 DIFFERENTIAL PAIR IN THE FIGURE BELOW (MODEL 0)<br>(VOLTAGE 1, PHASE DIFFERENCE BETWEEN PAIR OF 180 DEGREES))<br>INPUTTING SIMILAR SIGNALS FURTHER TO DIFF-4 DIFFERENTIAL PART<br>TERMINATING Diff-2 AND Diff-3 WITH 50 Ω<br>FREQUENCY OF SIGNALS OF 20 GHz | |
| BOUNDARY CONDITION USED | PERFACT E | USED FOR DUMMY SHEET PART AS DUMMY REFERENCE GND (NECESSARY FOR INSTALLATION OF PORTS)<br>USED FOR CONNECTION BETWEEN DUMMY GND SHEET AND GND LAYER OF FPC |
| | RADIATION | SET AT SURFACE OF AIR MODEL |

MODEL

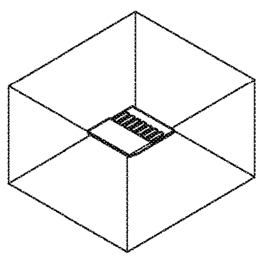

SETTING AIR MODEL LARGER BY 4 mm THAN OUTER SHAPE OF FPC IN EACH OF XYZ DIRECTIONS
SETTING RADIATION AT SURFACE OF AIR PART ASSUMING THAT ELECTROMAGNETIC WAVES PASS THERETHROUGH WITHOUT REFLECTION

MODEL-0 FOR COMPARISON

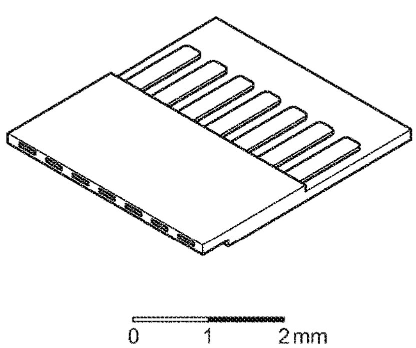

ARRANGEMENT OF Diff-1 TO Diff-4 COMMON IN ALL MODELS

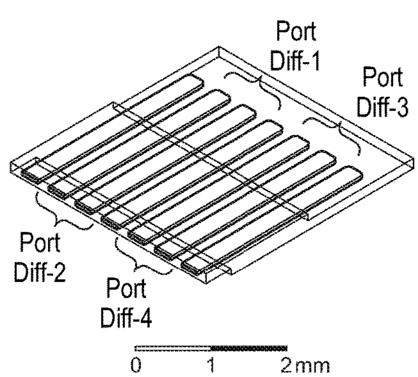

PRINTED WIRING BOARD

TECHNICAL FIELD

The present invention relates to a printed wiring board that is to be connected to another electronic component of an electronic device.

The contents of Patent Application No. 2014-192485, filed with Japan Patent Office on Sep. 22, 2014, are incorporated herein by reference in the designated countries in which the incorporation by reference is accepted.

BACKGROUND ART

Flexible printed wiring boards are known which are to be connected to electronic devices as other components with connectors. Such a printed wiring board may have a structure in which first wirings are provided at the lower surface side of a base film and second wirings are provided at the upper surface side of the base film.

PRIOR ART DOCUMENT

Patent Document

[Patent Document 1] JP2009-080972A

SUMMARY OF INVENTION

Problems to be Solved by Invention

Such type of a printed wiring board has a problem in that it is difficult to configure a shield structure having high shielding ability because pads, which are to be in contact with a connector, have to be exposed at the surface.

Problems to be solved by the present invention include providing a shield structure having high shielding ability in a printed wiring board that includes pads to be connected to a connector as another component.

Means for Solving Problems (1) The present invention solves the above problems by providing a printed wiring board comprising one or more substrates, the one or more substrates including at least a first substrate, the first substrate being formed with a pad and a ground layer at any one of main surfaces of the first substrate, the pad being to be electrically connected to a connector as another component, the ground layer being formed to surround the pad from a circumference of the pad and have an inner edge at a location separated from an outer edge of the pad with a predetermined distance, the ground layer being to be grounded to a ground contact.

(2) In the above invention, the above problems are solved by the first substrate having a wiring that is formed at the any one of main surfaces of the first substrate and that is electrically connected to the pad, and the wiring being formed such that an outer edge of the wiring is located at a location separated from the inner edge of the ground layer with a predetermined distance.

(3) In the above invention, the above problems are solved by the first substrate having a wiring that is formed at another main surface of the first substrate opposite to the any one of main surfaces and that is electrically connected to the pad, and a ground layer that has an inner edge at a location separated from an outer edge of the wiring formed at the other main surface with a predetermined distance and that is to be grounded to a ground contact.

(4) In the above invention, the above problems are solved by the one or more substrates further including at least one second substrate that is laminated directly on any one of main surfaces of the first substrate or laminated on the any one of main surfaces with another substrate, and the second substrate having a wiring that is electrically connected to the pad with a via penetrating through the one or more substrates including the first substrate and the second substrate, and a ground layer that has an inner edge at a location separated from an outer edge of the wiring formed at the second substrate with a predetermined distance and that is to be grounded to a ground contact.

(5) In the above invention, the above problems are solved by the one or more substrates including the first substrate and the second substrate, the first substrate having, at one main surface side of the first substrate, a plurality of pads that are to be electrically connected to the connector as another component and a ground layer that is formed to surround the pads from circumferences of the pads and have inner edges at locations separated from outer edges of the pads with a predetermined distance and that is to be grounded to a ground contact, and the second substrate having, at another main surface side of the second substrate opposite to the one main surface, a plurality of pads that are to be electrically connected to the connector as another component and a ground layer that is formed to surround the pads from circumferences of the pads and have inner edges at locations separated from outer edges of the pads with a predetermined distance and that is to be grounded to a ground contact.

(6) In the above invention, the above problems are solved by the printed wiring board further comprising a via that is formed within a connection end portion to be connected to the connector and has one end part in contact with the pad.

(7) In the above invention, the above problems are solved by the ground layer formed at the same main surface as that for the pad being formed such that an outer edge of the ground layer is located inside, with a predetermined offset amount, from an outer edge of the main surface of the substrate formed with the ground layer.

(8) In the above invention, when another ground layer is formed at a main surface different from the main surface formed with the pad, the above problems are solved by an outer edge of the main surface of the substrate formed with the other ground layer and an outer edge of the other ground layer being formed at the same location.

(9) In the above invention, the above problems are solved by the pad comprising a plurality of pads that include a pad connected to a wiring transmitting a first signal and a pad connected to a wiring transmitting a second signal different from the first signal.

Effect of Invention

According to the present invention, the pad to be connected to an external connector and the ground layer formed within a region that does not interfere with the pads are formed at the same main surface of the substrate, and a printed wiring board can thereby be provided which has a shield structure of a high shielding ability while including the pads to be connected to the connector as an another component.

BRIEF DESCRIPTION OF DRAWING(S)

FIG. 10A is a first view illustrating conditions of measurement of radiation levels in the working examples according to an embodiment.

FIG. 10B is a second view illustrating conditions of measurement of radiation levels in the working examples according to an embodiment.

MODE(S) FOR CARRYING OUT THE INVENTION

Figure 1A:
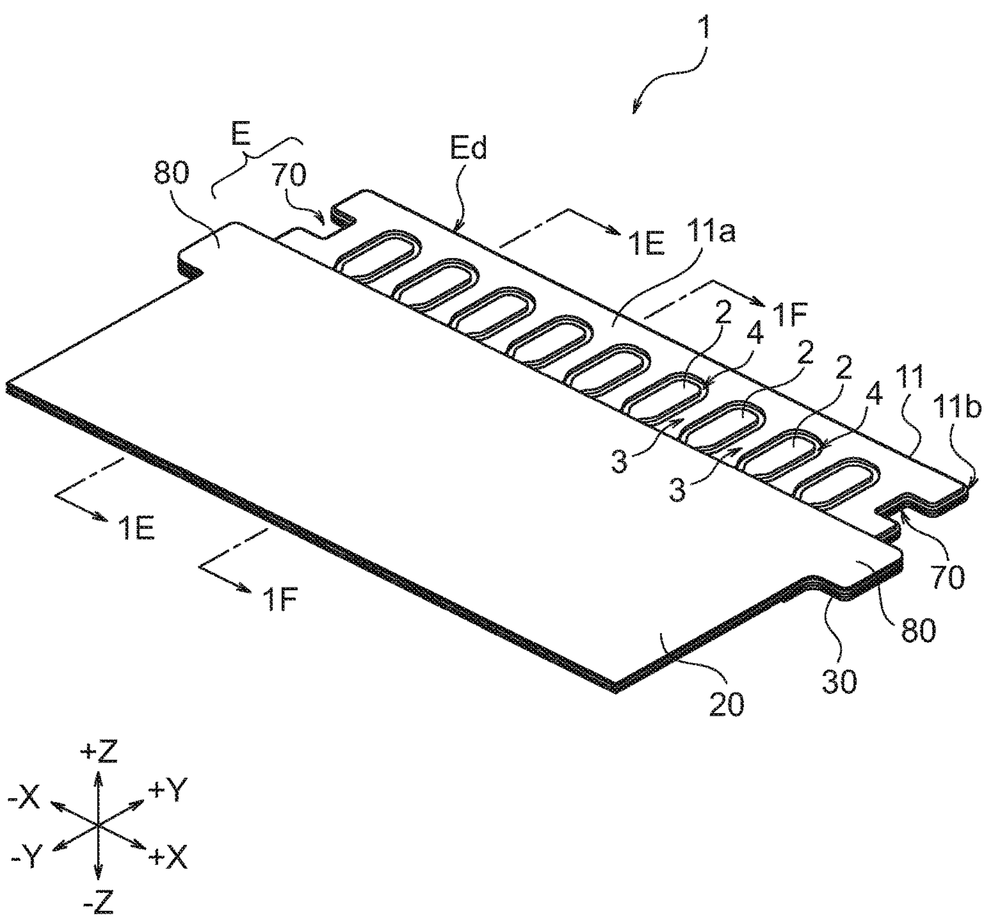
FIG. 1A is a top perspective view illustrating a connection portion of a printed wiring board of a first example according to an embodiment of the present invention.

The printed wiring board according to an embodiment of the present invention includes a shield structure. The printed wiring board 1 of the present embodiment has flexibility and is thus a flexible printed wiring board (i.e. flexible printed circuit board (FPC)). When used, the printed wiring board 1 of the present embodiment is inserted in a zero insertion force (ZIF) connector. The present invention is not limited to the above and the printed wiring board of the present embodiment can also be applied to a NON-ZIF connector that utilizes the thickness of the printed wiring board to obtain fitting force and other connectors, such as a back-board connector. The present embodiment will be described with reference to examples of flexible printed wiring boards, but the present invention can also be applied to any type of printed wiring boards, such as a rigid flexible printed wiring board. The form of a connector to be engaged with the printed wiring board of the present embodiment is not particularly limited.

Embodiments of the present invention will be described below with reference to the drawings. In the present embodiment, printed wiring boards 1 of first to eighth examples will be described in turn. In each figure, an end portion of the printed wiring board 1 of the present embodiment is cut out and illustrated. The end portion includes a connection end portion E at the side to be connected to a connector as another component. The printed wiring board 1 illustrated in each figure actually extends in −Y direction in the figure. The printed wiring board 1 is to be connected to a connector located at the side of the connection end portion E. A first substrate 11, second substrate 12 and third substrate 13 of the printed wiring board 1 of each example according to the present embodiment may be collectively referred to as a substrate 10 or substrates 10. The third substrate may be one or more substrates other than the first substrate 11 and second substrate 12.

In the present description, as for the laminating direction (Z direction in the figures) of the printed wiring board 1, the upper layer side or upper surface direction (+Z direction in the figures) in the laminate structure of the printed wiring board 1 is referred to as an upper side while the lower layer side or lower surface direction (−Z direction in the figures) in the laminate structure of the printed wiring board is referred to as a lower side, for descriptive purposes. When each substrate to be laminated has one main surface and the other main surface, the surface at the upper layer side of each substrate in the laminate structure is referred to as "the one main surface" while the surface at the lower layer side of each substrate in the laminate structure is referred to as "the other main surface." It is to be noted that "any one of main surfaces" refers to either the one main surface or the other main surface and is not limited to the one main surface or the other main surface.

First, with reference to FIG. 1A to FIG. 1F, the printed wiring board 1 of the first example will be described.

The printed wiring board 1 of the first example includes a single conductive layer 11*a* and is thus of a type of connection with a connector using one main surface (single-sided connection type). The printed wiring board 1 of the first example illustrated in FIG. 1A to FIG. 1F has wirings 5 (signal lines) that transmit single-ended signals.

FIG. 1A is a top perspective view of a connection portion that includes the connection end portion E of the printed wiring board 1 of the first example according to the present embodiment. The printed wiring board 1 illustrated in FIG. 1A includes at least a coverlay 20, first substrate 11, and reinforcement layer 30. The printed wiring board 1 of the present embodiment further includes one or more engageable parts 70 and one or more tab-like members 80.

As illustrated in FIG. 1A, the printed wiring board 1 of the present embodiment includes an engageable part 70 located at an end edge at least at one of right and left sides in the width direction (X direction in the figure) of the connection end portion E. The engageable part 70 is formed within the connection end portion E to be connected to a connector and is engaged with an engagement part of the connector. Specifically, the engageable part 70 is engaged with an engagement part (e.g. a tab-like member provided at the connector) of another electronic component, which is an object of connection with the printed wiring board 1, by force in the disconnecting direction of −Y direction in the figure. In this example, end edges at both the right and left sides of the connection end portion E may be provided with respective engageable parts 70 thereby to enhance the disconnection resistance and maintain a stable engagement state. Moreover, the right and left engageable parts 70 are formed at the same locations along the connecting direction (Y-axis direction in the figure), so that force components applied to the right and left engageable parts 70 can be uniformly distributed to maintain a stable engagement state.

The engageable parts 70 in this example are provided as notched parts that are formed at the side edge parts of the connection end portion E. The form of the engageable parts 70 is not limited. The notched parts which constitute the engageable parts 70 may be in a form in which laminated substrates 10 as a whole are notched into the same shape, or may also have a structure in which the area (area in XY plane) of the notched parts (parts to be removed) increases or decreases as approaching the upper surface or the lower surface. The notched parts may include the outer profile of the substrates 10 or may also be formed as through-holes that do not include the outer profile of the substrates 10. In an alternative embodiment, the engageable parts 70 may be formed as recessed parts with bottoms in which the lower side substrate or substrates are not opened, or may also be formed as recessed parts with lids in which the upper side substrate or substrates remain.

As illustrated in FIG. 1A, the printed wiring board 1 of the present embodiment includes a tab-like member 80 located at an end edge at least at one of right and left sides in the width direction (X direction in the figure) of the connection end portion E. The tab-like member 80 is formed within the connection end portion E to be connected to a connector and engages with an engageable part of the connector. Specifically, the tab-like member 80 engages with an engageable part (e.g. a notched part provided at the connector) of another electronic component, which is an object of connection with the printed wiring board 1, by force in the disconnecting direction of −Y direction in the figure. In this example, end edges at both the right and left sides of the connection end portion E may be provided with respective tab-like members 80 thereby to enhance the disconnection resistance and maintain a stable engagement state. Moreover, the right and left tab-like members 80 are formed at the same locations along the connecting direction (Y-axis direction in the figure), so that force components applied to the right and left tab-like members 80 can be uniformly distributed to maintain a stable engagement state.

The above-described engageable parts 70 and tab-like members 80 can cooperate to enhance the engagement strength between the printed wiring board 1 and a connector.

The present embodiment is described with reference to an example in which the engageable parts 70 and the tab-like members 80 are provided, but an alternative embodiment may employ an engagement structure that includes either the one or more engageable parts 70 or the one or more tab-like members 80. Since the engagement structure is not limited to having the engageable part or parts 70 and/or the tab-like member or members 80, the printed wiring board 1 of the present embodiment can be manufactured even when it does not include any of the engageable parts 70 and the tab-like members 80 in this example. The same applies to other examples which will be described later.

The tab-like members 80 of this example are composed of the substrate or substrates 10 which extend rightward and leftward at the side edge parts of the connection end portion E. The form of the tab-like members 80 is not limited. The tab-like members 80 may be formed by punching out the laminated substrates 10 into a desirable shape. The shape of the tab-like members 80 may also be designed such that the area (area in XY plane) of the tab-like members 80 increases or decreases as approaching the upper surface or the lower surface.

As illustrated in FIG. 1A, the coverlay 20 is laminated as the uppermost layer of the printed wiring board 1. The coverlay 20 can be formed by attaching an insulating resin film, such as a polyimide film, or applying and curing a thermoset ink, ultraviolet curable ink, or photosensitive ink.

The first substrate 11 is laminated as a lower layer on the coverlay 20. The first substrate 11 has a structure in which the conductive layer 11*a* is formed on a main surface of an insulating substrate 11*b*. The first substrate 11, and the substrates 10 including the second substrate 12 and third substrate 13 which will be described later, have flexibility. The insulating substrate 11*b* of each substrate 10 is formed of an insulating resin. Examples of the insulating resin include, for example, polyimide, polyester, polyethylene terephthalate, and polyethylene naphthalate. The insulating substrates of the substrates 10 may be made of the same resin or may also be made of different resins.

Figure 1B:
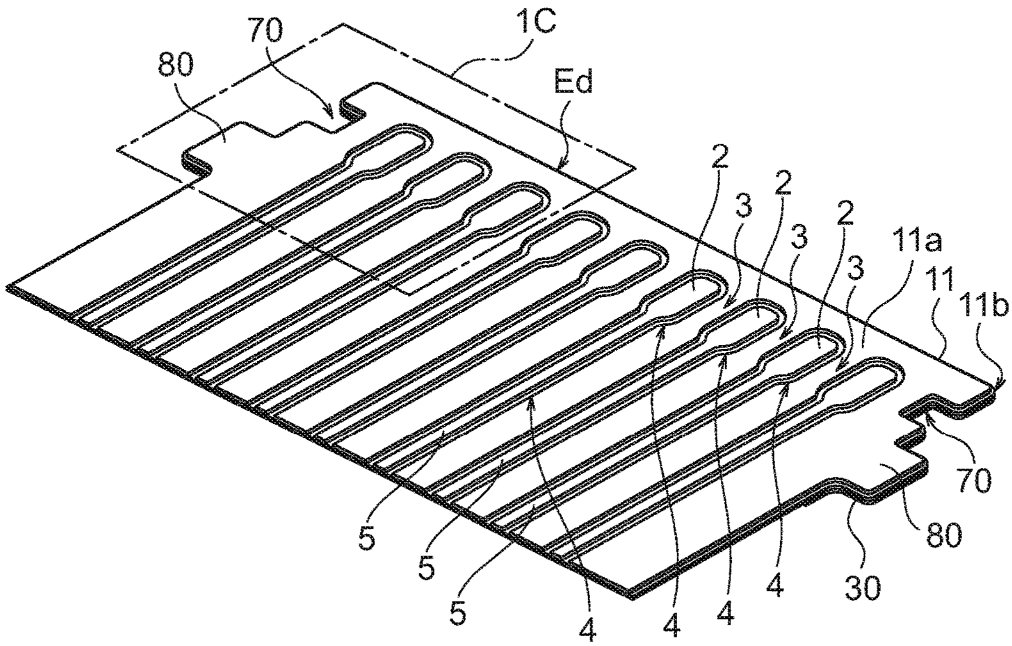
FIG. 1B is a top perspective view of a first substrate in which a coverlay of the printed wiring board illustrated in FIG. 1A is removed.

FIG. 1B is a top perspective view of the first substrate 11 in which the coverlay 20 of the printed wiring board illustrated in FIG. 1A is removed. As illustrated in FIG. 1B, one main surface of the insulating substrate 11*b* is formed with a conductive layer 11*a*, such as copper foil. The conductive layer 11*a* is formed such that copper is deposited or sputtered on the insulating substrate 11*b* and copper plating is then performed. The conductive layer 11*a* may also be that obtained by attaching copper foil to a polyimide substrate with an adhesive.

The conductive layer 11*a* of the first substrate 11 has a plurality of pads 2. Each of the pads 2 is to be electrically connected to a connector as another component which is not illustrated. The pads 2 are formed within the end portion which is to be connected to a connector as another component. As illustrated in FIG. 1A and FIG. 1B, the pads 2 are disposed in parallel along an end edge Ed of the printed wiring board 1 so as to be located within the connection end portion E of the printed wiring board 1 which is to be connected to a connector.

Figure 1C:
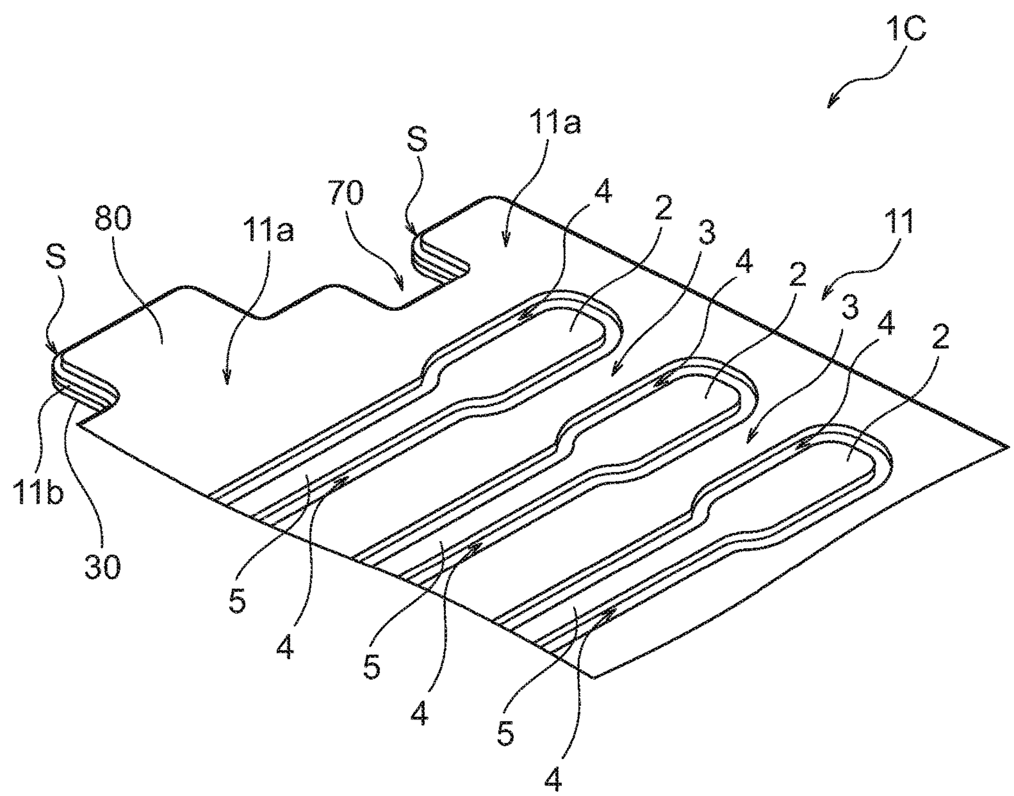
FIG. 1C is a partially enlarged view of the region 1C illustrated in FIG. 1B.

FIG. 1C is a partially enlarged view of the region 1C illustrated in FIG. 1B. As illustrated in FIG. 1B and FIG. 1C, one main surface at the upper side of the first substrate 11 is formed with the conductive layer 11*a* which includes the pads 2 and a ground layer 3. The pads 2 and the ground layer 3 are formed at the same main surface of the substrate 10. The ground layer 3 is to be connected to a ground contact that is grounded to a reference potential.

The ground layer 3 is formed in a shape having its inner edges at locations separated from outer edges of the pads 2 with a predetermined distance. From another point of view, the pads 2 are formed in shapes having their outer edges at locations separated from the inner edges of the ground layer 3 by the predetermined distance. The ground layer 3 is formed to surround the pads 2. As illustrated in FIG. 1C, grooves 4 having a width of the predetermined distance are formed between the pads 2 and the ground layer 3 which are included in the conductive layer 11*a*. The ground layer 3 surrounds the pads 2 from their circumferences to form the grooves 4. When the wirings 5 are connected to the pads 2 as in the present embodiment, the grooves 4 are formed to surround the entire circumferences of the pads 2 and wirings 5. When wirings 5 are not connected to the pads 2, the grooves 4 are formed to surround the entire circumferences of the pads 2.

In the present embodiment, the term "predetermined distance" between the inner edges of the ground layer 3 and the outer edges of the pads 2 refers to a "distance that does not vary over time," and is not limited to meaning that the distance between the ground layer 3 and the pads 2 is the same at any location. In other words, the "predetermined distance" between the ground layer 3 and the pads 2 can be different at each part. The same applies to other examples which will be described later. Although not particularly limited, insulating layers may be interposed between the pads 2 and the ground layer 3.

As illustrated in FIG. 1B, the first substrate 11 of the printed wiring board 1 according to the present embodiment has the wirings 5 which are formed at the one main surface and electrically connected to the pads 2. The wirings 5 are formed using a conductive material. Examples of the conductive material to be used include, for example, copper and copper alloy. The relationship of connection between the pads 2 and the wirings 5 is not particularly limited and a desired relationship of connection can be realized by appropriately applying a method of manufacturing printed wiring boards which is known in the art at the time of filing of the present application. The same applies to other examples which will be described later.

In the printed wiring board 1 of the present embodiment, the wirings 5 have their outer edges at locations separated from inner edges of the ground layer 3 with a predetermined distance. The ground layer 3 is formed to have its inner edges at locations separated from the outer edges of the wirings 5 by the predetermined distance. From another point of view, the wirings 5 are formed to have their outer edges at locations separated from the inner edges of the ground layer 3 by the predetermined distance. The ground layer 3 is formed to surround the wirings 5. As illustrated in FIG. 1C, the ground layer 3 is separated from the wirings 5 by the predetermined distance. That is, grooves 4 having a width of the predetermined distance are formed between the wirings 5 and the ground layer 3 which are included in the conductive layer 11*a*.

In the present embodiment, the term "predetermined distance" between the inner edges of the ground layer 3 and the outer edges of the wirings 5 refers to a "distance that does not vary over time," and is not limited to meaning that the distance between the ground layer 3 and the wirings 5 is the same at any location. In other words, the "predetermined distance" between the ground layer 3 and the wirings 5 can be different at each part. As will be understood, the previously-described distance between the ground layer 3 and the pads 2 can be different from the distance between the ground layer 3 and the wirings 5. The same applies to other examples which will be described later. Although not particularly limited, insulating layers may be interposed between the wirings 5 and the ground layer 3.

The "predetermined distance" between the inner edges of the ground layer 3 and the outer edges of the pads 2 may be or may not be the same as the "predetermined distance" between the inner edges of the ground layer 3 and the outer edges of the wirings 5. The same also applies to other examples which will be described later.

Figure 1D:
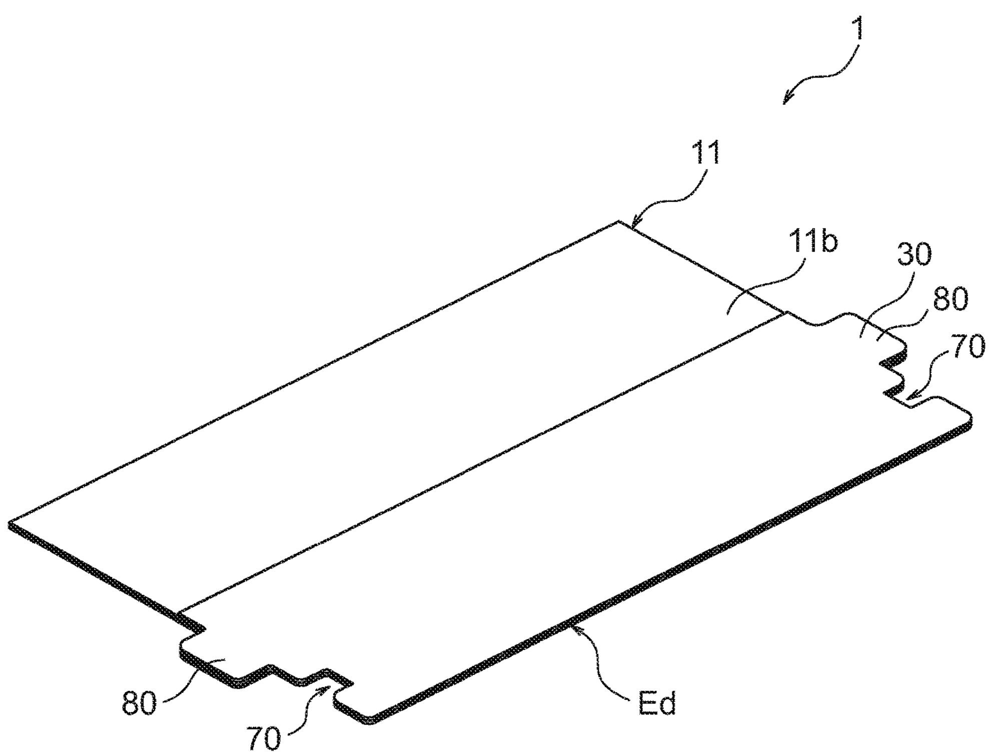
FIG. 1D is a bottom perspective view of the printed wiring board illustrated in FIG. 1A.

FIG. 1D is a bottom perspective view of the printed wiring board 1 illustrated in FIG. 1A. The reinforcement layer 30 is formed on the surface of the insulating substrate 11*b* at the other main surface side of the first substrate 11 with an adhesive layer. The reinforcement layer 30 is formed, for example, using a polyimide film. To clearly illustrate the relationship of each structure, such an adhesive layer is omitted to be illustrated in figures for describing this first example and the second to eighth examples. One or more adhesive layers may be interposed between substrates, as necessary.

Figure 1E:
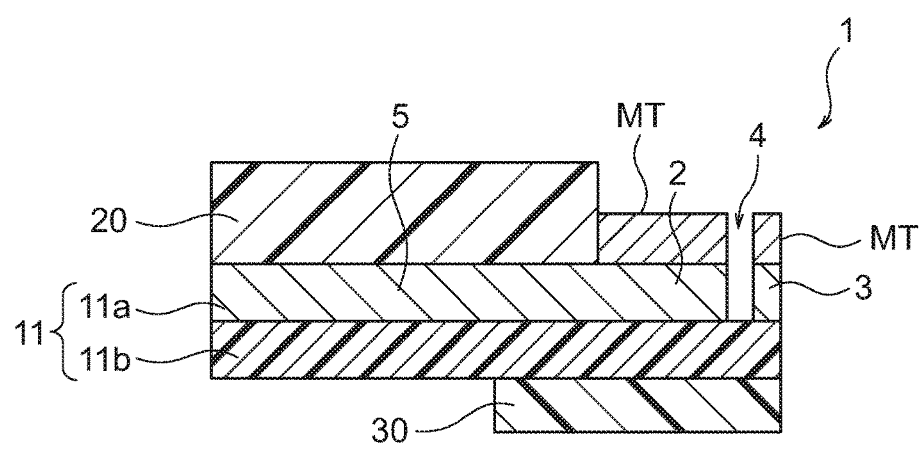
FIG. 1E is a cross-sectional view along the line 1E-1E of the printed wiring board illustrated in FIG. 1A.

FIG. 1E is a cross-sectional view along the line 1E-1E of the printed wiring board illustrated in FIG. 1A. That is, FIG. 1E is a cross-sectional view that includes a pad 2 and the ground layer 3. As illustrated in FIG. 1E, the grooves 4 are formed between the pads 2 and the ground layer 3.

A surface-treated layer MT is formed at the upper surface side of each of the pads 2 and ground layer 3. The surface-treated layers MT have conductivity. In the present embodiment, a plating process is performed as the surface treatment. The surface-treated layers MT have necessary properties, such as corrosion resistance and wear resistance, and protect the pads 2 and a part of the ground layer 3. In the present embodiment, a gold plating process is performed as the surface treatment. Materials used for formation of the gold plated layers formed by the gold plating process are not particularly limited. The gold plated layers may include nickel layers as underlying layers. Schemes for formation of the surface-treated layers MT, such as plated layers, are also not particularly limited. Materials and schemes which are known in the art at the time of filing of the present application can be appropriately used. The surface-treated layers MT may also be conductive carbon layers or solder layers.

Figure 1F:
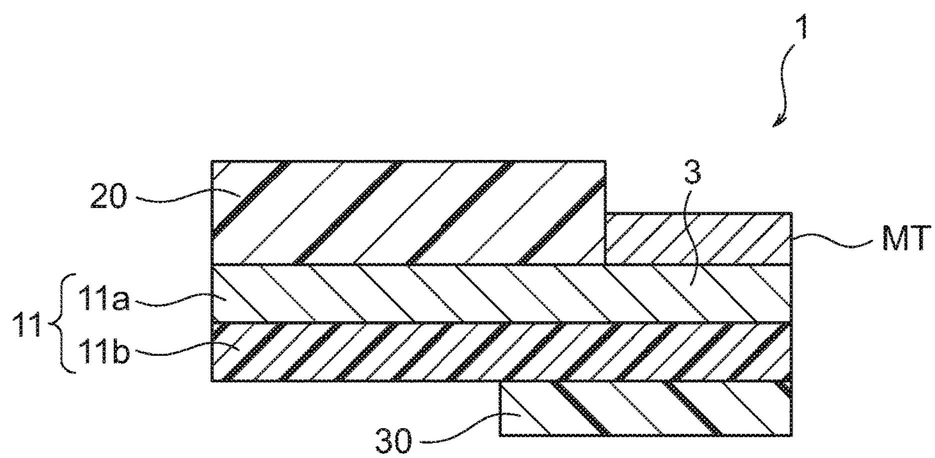
FIG. 1F is a cross-sectional view along the line 1F-1F of the printed wiring board illustrated in FIG. 1A.

FIG. 1F is a cross-sectional view along the line 1F-1F of the printed wiring board illustrated in FIG. 1A. That is, FIG. 1F is a cross-sectional view that includes the ground layer 3. No grooves appear because pads 2 are not present along the line 1F-1F.

In the first example illustrated in FIG. 1A to FIG. 1F, the printed wiring board 1 has been described in which the pads 2 and the wirings 5 are formed only at the one main surface of the first substrate 11.

The present invention is not limited to this and wirings 5 may be additionally or alternatively formed at the other main surface, of the both main surfaces of the first substrate 11, opposite to the one main surface formed with the pads 2. The wirings 5 formed at the other main surface may be electrically connected to the pads 2 with vias that penetrate through the first substrate 11. In addition, a ground layer 3 is also formed on the other main surface of the first substrate 11. This ground layer 3 has inner edges at locations separated from outer edges of the wirings 5 with a predetermined distance and is to be connected to a ground contact of a reference potential. This configuration allows provision of the printed wiring board 1 of a form in which pads 2 are provided at the one main surface and wirings 5 are provided at the other main surface side or a form in which pads 2 and wirings 5 are provided at the one main surface and wirings 5 are also provided at the other main surface side. This can enhance the degree of freedom in design and easily respond to the demand of a reduced size and reduced thickness of electronic devices.

Next, with reference to FIG. 2A to FIG. 2F, the printed wiring board 1 of the second example will be described.

The printed wiring board 1 of the second example is in common with the previously-described printed wiring board 1 of the first example except that pairs of wirings 5*a* and 5*b* (also described wirings 5*a*,5*b*) are provided which function as differential signal lines. That is, the printed wiring board 1 of the second example includes a single conductive layer 11*a* and is thus of a type of connection with a connector using one main surface (single-sided connection type). Description of matters in common with those of the first example is borrowed herein to avoid redundant description.

Figure 2A:
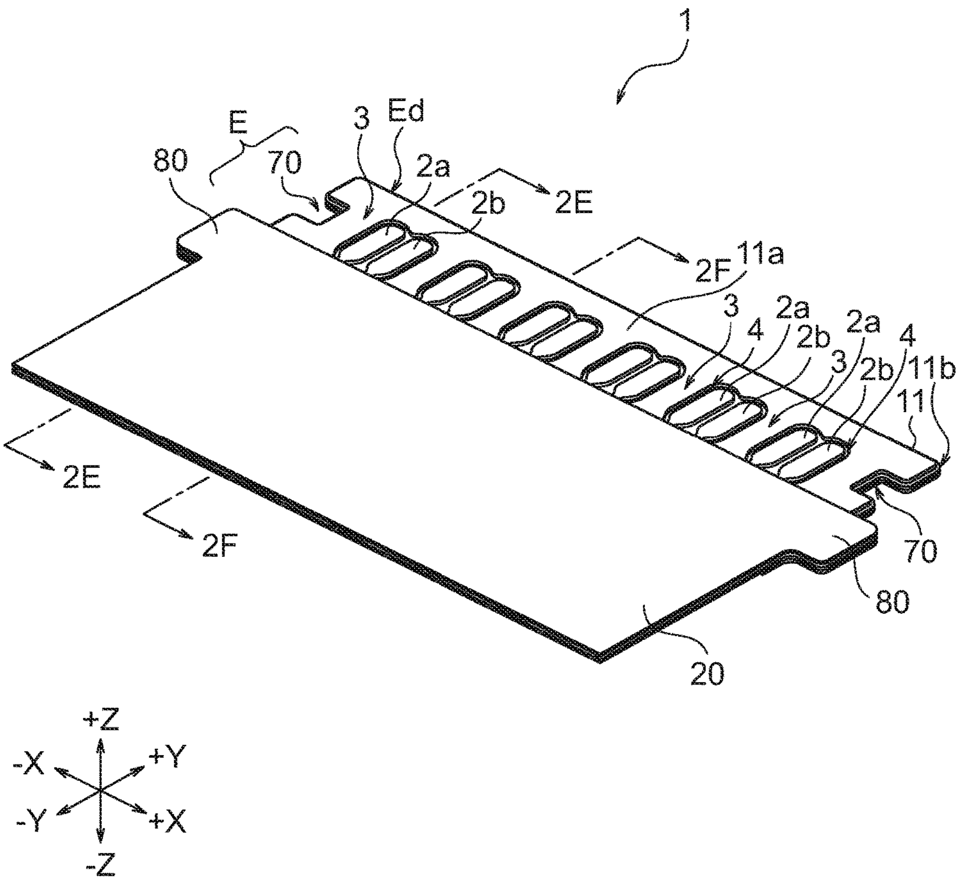
FIG. 2A is a top perspective view illustrating a connection end portion of a printed wiring board of a second example according to an embodiment of the present invention.

FIG. 2A is a top perspective view of a connection portion that includes the connection end portion E of the printed wiring board 1 of the second example according to the present embodiment. The printed wiring board 1 illustrated in FIG. 2A includes at least a coverlay 20, first substrate 11, and reinforcement layer 30. The coverlay 20 and reinforcement layer 30 of this example are in common with those of the first example. As in the first example, the printed wiring board 1 of this example further includes one or more engageable parts 70 and one or more tab-like members 80.

Figure 2B:
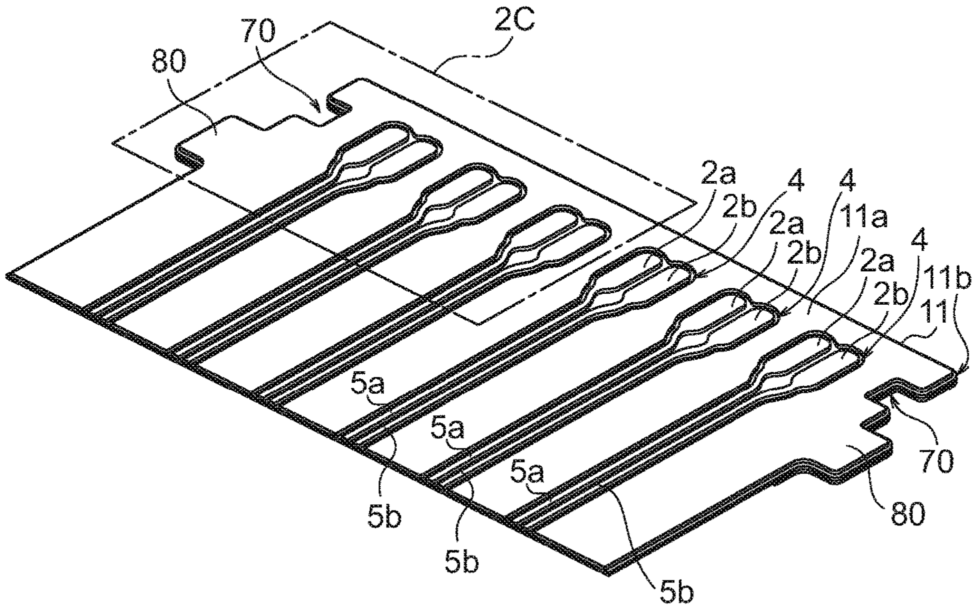
FIG. 2B is a top perspective view of a first substrate in which a coverlay of the printed wiring board illustrated in FIG. 2A is removed.

As illustrated in FIG. 2A, the coverlay 20 is laminated as the uppermost layer of the printed wiring board 1. The first substrate 11 is laminated as a lower layer on the coverlay 20. FIG. 2B is a top perspective view of the first substrate 11 in which the coverlay 20 of the printed wiring board illustrated in FIG. 2A is removed. As illustrated in FIG. 2A and FIG. 2B, the conductive layer 11*a*, which is formed at one main surface of the insulating substrate 11*b*, has pluralities of pads 2*a* and 2*b* (which may also be referred to as "pads 2" in a collective term). Each combination of pads 2*a* and 2*b* (also described pads 2*a*, 2*b*) forms a pair. As illustrated in FIG. 2A and FIG. 2B, the pairs of pads 2*a* and 2*b* are disposed in parallel along an end edge Ed of the printed wiring board 1 so as to be located within the connection end portion E of the printed wiring board 1 which is to be connected to a connector.

As illustrated in FIG. 2B, the pads 2 of the printed wiring board 1 of the second example include pads 2*a* connected to wirings 5*a* that transmit first signals and pads 2*b* connected to wirings 5*b* that transmit second signals different from the first signals. Each first signal and the corresponding second signal have different phases and thus are signals with a phase shift. Specifically, each first signal and the corresponding second signal are reverse-phase differential signals. The first signals and the second signals may have different frequencies.

Figure 2C:
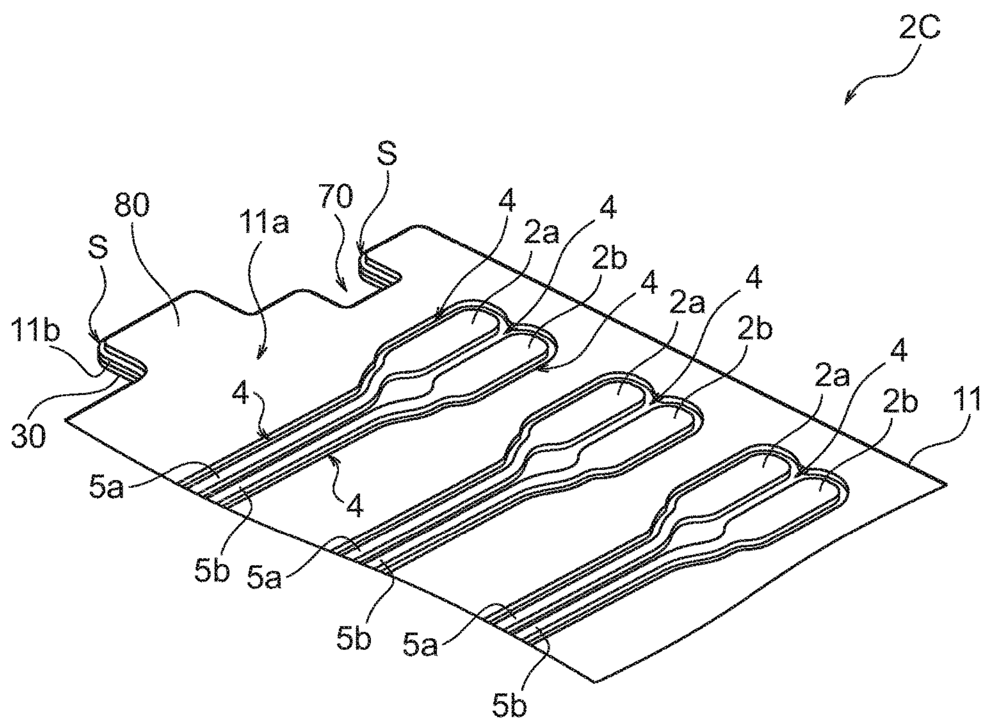
FIG. 2C is a partially enlarged view of the region 2C illustrated in FIG. 2B.

As illustrated in FIG. 2C which is an enlarged view of the region 2C illustrated in FIG. 2B, one main surface at the upper side of the first substrate 11 is formed with the conductive layer 11*a* which includes the plural pairs of pads 2*a*, 2B and a ground layer 3. The ground layer 3 is to be connected to a ground contact that is grounded to a reference potential.

The ground layer 3 is formed in a pattern having its inner edges at locations separated from outer edges of the pads 2*a* and 2*b* with a predetermined distance. From another point of view, the pads 2*a* and 2*b* are formed in patterns having their outer edges at locations separated from the inner edges of the ground layer 3 by the predetermined distance. In this example, it suffices that at least parts of the inner edges of the ground layer 3 are separated from at least parts of the outer edges of the pads 2*a* and 2*b* by the predetermined distance. The ground layer 3 of this example is formed to surround the pairs of pads 2*a* and 2*b*. In this example, each pair of pads 2*a* and 2*b* is grouped. As illustrated in FIG. 2C, grooves 4 having a width of the predetermined distance are formed between the pairs of pads 2*a*, 2*b* and the ground layer 3 which are included in the conductive layer 11*a*. When the wirings 5*a* and 5*b* are connected to the pads 2*a* and 2*b* as in this example, the grooves 4 are formed to surround the entire circumferences of the pads 2*a*, 2*b* and wirings 5*a* and 5*b*. When wirings 5*a* and 5*b* are not connected to the pads 2*a* and 2*b*, the grooves 4 may be formed to surround the entire circumferences of the pairs of pads 2*a* and 2*b*. As illustrated in FIG. 2C, the ground layer 3 and the pads 2*a* and pads 2*b* are separated by the grooves 4 at outer edges, of the outer edges of adjacent pads 2*a* and 2*b*, other than the outer edges at which the pads 2*a* face the counterpart pads 2*b*.

As illustrated in FIG. 2B, the first substrate 11 of the printed wiring board 1 according to the present embodiment has the wirings 5*a* which are electrically connected to the pads 2*a* and the wirings 5*b* which are electrically connected to the pads 2*a*. The wirings 5*a* and 5*b* are formed at the one main surface. The wirings 5*a* and 5*b*, which form pairs, have their outer edges at locations separated from inner edges of the ground layer 3 with a predetermined distance. The ground layer 3 is formed to have its inner edges at locations separated from the outer edges of the wirings 5*a* and 5*b* by the predetermined distance. The wirings 5*a* and 5*b* are formed to have their outer edges at locations separated from the inner edges of the ground layer 3 by the predetermined distance. The ground layer 3 of this example is formed to surround the pairs of wirings 5*a* and 5*b*. In this example, the region in which each pair of the wirings 5*a* and 5*b* is provided is grouped as one region. As illustrated in FIG. 2C, grooves 4 having a width of the predetermined distance are formed between the ground layer 3 included in the conductive layer 11*a* and the regions in which the wirings 5*a* and 5*b* are provided to be formed as pairs. In other words, each groove 4 having a width in accordance with the predetermined distance is formed between the ground layer 3 and the grouped pair of the wirings 5*a* and 5*b*. When the wirings 5*a* and 5*b* are connected to the pads 2*a* and 2*b* as in this example, the grooves 4 are formed to surround the entire circumferences of the wirings 5*a*, the wirings 5*b*, the pads 2*a* and the pads 2*b*. The ground layer 3 is not formed between the wirings 5*a* and wirings 5*b* which form pairs. The ground layer 3 is also not formed between the pads 2*a* and pads 2*b* which form pairs. As illustrated in FIG. 2C, the ground layer 3 and the wirings 5*a* and wirings 5*b* are separated by the grooves 4 at outer edges, of the outer edges of adjacent wirings 5*a* and 5*b*, other than the outer edges at which the wirings 5*a* face the counterpart wirings 5B.

Figure 2D:
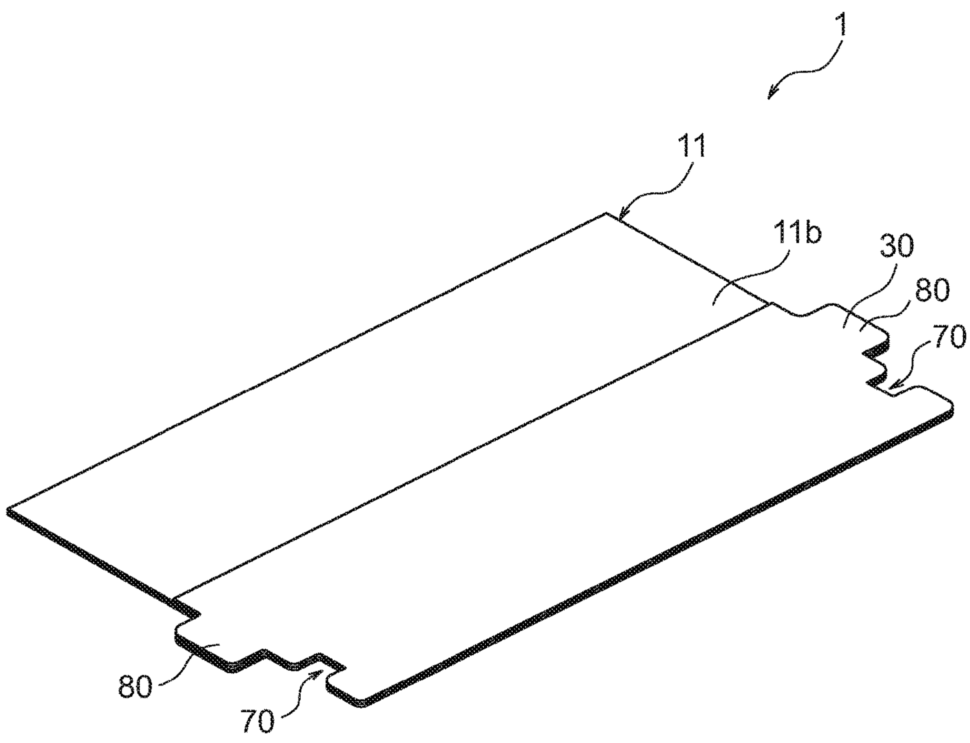
FIG. 2D is a bottom perspective view of the printed wiring board illustrated in FIG. 2A.

FIG. 2D is a bottom perspective view of the printed wiring board 1 illustrated in FIG. 2A. The reinforcement layer 30 is formed on the surface of the insulating substrate 11*b* at the other main surface side of the first substrate 11 with an adhesive layer.

Figure 2E:
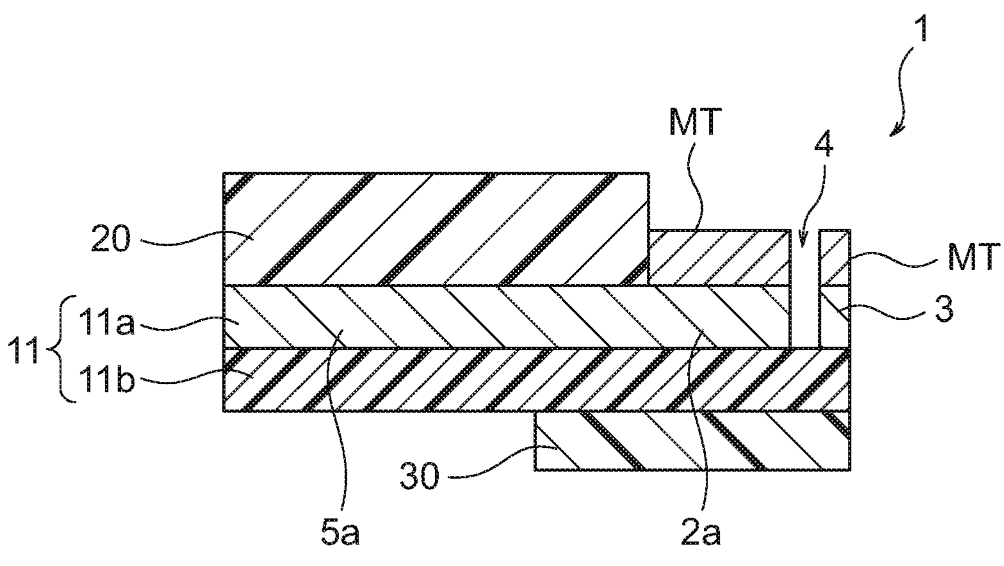
FIG. 2E is a cross-sectional view along the line 2E-2E of the printed wiring board illustrated in FIG. 2A.

FIG. 2E is a cross-sectional view along the line 2E-2E of the printed wiring board illustrated in FIG. 2A. That is, FIG. 2E is a cross-sectional view that includes a pad 2*a* and the ground layer 3. As illustrated in FIG. 2E, the grooves 4 are formed between the pads 2*a* and the ground layer 3. The cross section along the line passing through a pad 2*b* is in common with that illustrated in FIG. 2E. The grooves 4 are also formed between the pads 2*b* and the ground layer 3. As in the first example, a surface-treated layer MT is formed at the upper surface side of each of the pads 2*a*, 2*b* and ground layer 3.

Figure 2F:
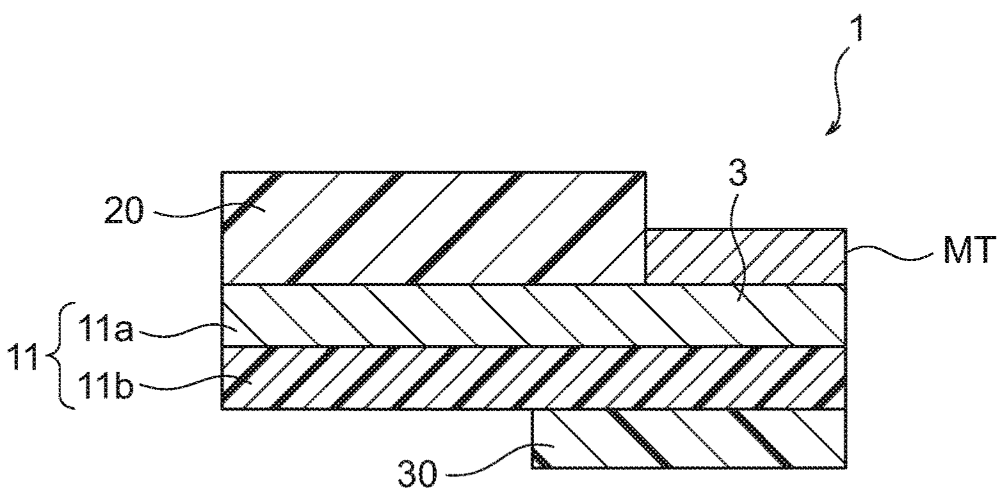
FIG. 2F is a cross-sectional view along the line 2F-2F of the printed wiring board illustrated in FIG. 2A.

FIG. 2F is a cross-sectional view along the line 2F-2F of the printed wiring board illustrated in FIG. 2A, that is, a cross-sectional view that includes the ground layer 3. No grooves appear because pads 2 are not present along the line 2F-2F.

Although not limited, the printed wiring boards 1 of the above described first example and second example may have a structure as below. That is, as illustrated in FIG. 1C and FIG. 2C, the ground layer 3 formed at the same main surface as that for the pads 2 (including the pads 2*a* and 2*b*, here and hereinafter) may be formed such that the outer edge of the ground layer 3 is located inside the outer edge of the main surface of the insulating substrate 11*b*, on which the ground layer 3 is formed, by a predetermined offset amount S. In the printed wiring board 1 of a laminate structure, it is highly possible that the conductive layer 11*a* including the pads 2 are provided as the uppermost layer or lowermost layer. When a punching process is performed using a metal die at the time of manufacturing the printed wiring board 1, the metal die directly shears the ground layer 3 as the uppermost layer or lowermost layer. The metal die is therefore readily worn away or damaged by shearing the ground layer 3 which is composed of metal, such as copper foil. The ground layer 3 is offset inside the outer edge of the insulating substrate 11*b* as in the present embodiment so that the ground layer 3 and the metal die do not come into contact with each other, and the metal die can thereby be suppressed from being worn away and damaged. This can result in a reduced production cost.

On the other hand, it is highly possible that a main surface other than the main surface formed with the pads 2 is provided as an inner layer other than the uppermost layer and lowermost layer. Thus, when a punching process is performed using a metal die at the time of manufacturing the printed wiring board 1, the cutting edge of metal die does not come into direct contact with the ground layer 3 as the inner layer, and the metal die can thereby be suppressed from being worn away and damaged. In the present embodiment, the ground layer 3 formed at a different main surface than the main surface on which the pads 2 are formed may be formed such that the outer edge of the ground layer 3 is located at the same location as that of the outer edge of the main surface of the insulating substrate (such as an insulating substrate 12*b* to be described later) on which the ground layer 3 is formed.

A method of manufacturing the printed wiring boards 1 of the above-described first example and second example according to the present embodiment will now be described. The method of manufacturing the printed wiring boards 1 of the present embodiment is not particularly limited, and a scheme of producing a printed wiring board known in the art at the time of filing of the present application can be appropriately used. The same applies to methods of manufacturing the printed wiring boards 1 of other examples.

First, a substrate is prepared which is formed with the conductive layer 11*a* on one surface of the insulating substrate 11*b*. In the present embodiment, a single-sided copper clad substrate is prepared in which copper foil is formed on one main surface of a polyimide substrate. The single-sided copper clad substrate may be, but is not limited to, any of those configured such that copper is deposited or sputtered on the polyimide substrate and copper plating is then performed. The single-sided copper clad substrate may also be that obtained by attaching copper foil to the polyimide substrate with an adhesive.

Desired pads 2, wirings 5 and ground layer 3 are formed on one main surface of the single-sided copper clad substrate using a common photolithography technique. The conductive layer 11*a* does not remain within regions corresponding to the grooves 4 between the pads 2 and the ground layer 3 and regions corresponding to the grooves between the wirings 5 and the ground layer 3. The pads 2 and the ground layer 3 are in a state of being insulated while the wirings 5 and the ground layer 3 are also in a state of being insulated. This allows the first substrate 11 to be obtained. In the first example, as illustrated in FIG. 1B, the pads 2 and the wirings 5 have wiring patterns of signal lines that transmit single-ended signals. In the second example, as illustrated in FIG. 2B, the pads 2*a*, the pads 2*b*, the wirings 5*a* and the wirings 5*b* have patterns of differential signal lines that form pairs. In the present embodiment, the first substrate 11 formed with desired wirings 5 and pads 2 is obtained through making a mask pattern on a main surface of the single-sided copper clad substrate in accordance with the wiring patterns of signal lines for the single-ended signals or the wiring patterns of differential signal lines and etching the copper foil.

The coverlay 20 is attached to the one main surface of the first substrate 11 to cover its portion including the wirings 5 thus formed. The reinforcement layer 30 is attached to a region that includes the connection end portion E at the other main surface of the first substrate 11. The coverlay 20 and the reinforcement layer 30 are attached with an appropriate adhesive. Curing treatment for the adhesive is performed as necessary.

A metal die is preliminarily prepared and used to punch out the printed wiring board 1 into a shape having the engageable parts 70 and tab-like members 80. Surfaces of the pads 2 (2*a*, 2*b*) are subjected to surface treatment, such as gold plating, to form the surface-treated layers. This allows the printed wiring boards 1 of the first example and second example according to the present embodiment to be obtained.

Incidentally, in accordance with reduction in size of electronic devices, connectors for connecting flexible printed circuit boards (FPC) to boards of various electronic devices are also significantly reduced in the weight, thickness and size. Similarly, reduction in thickness and size of connection end portions of printed wiring boards to be engaged with connectors progresses and it is thus demanded to narrow the pitch of wirings. Accordingly, printed wiring boards tend to have a narrowed wiring width and reduced thickness of wirings and it is difficult to maintain the strength. As the strength of connection end portions of printed wiring board deteriorates, printed wiring boards may possibly be damaged when receiving external force. Moreover, not only ZIF type connectors with which printed wiring boards receive a small load when connected to the connectors, but also LIF (Low Insertion Force) type connectors and NON-ZIF type connectors may be used with which printed wiring boards receive a relatively large load when connected to the connectors. Thus, when using connectors which impose a relatively large load, the wirings may crack or break and the connection end portions may also deform or break/damage.

In view of reducing the thickness, right-angle type connectors are used in electronic devices of reduced size. In such a right-angle type connector, the printed wiring board is slid from the front of the connector in the direction toward the connector and inserted into the connector. This operation requires a space in which the printed wiring board is slid in the right-angle type connector, but it is difficult to ensure such a space on a board of a highly-dense electronic device. In addition, since the space between the housing and board in an electronic device is narrow, the printed wiring board connected to the board may be incorporated in the housing in a state in which the printed wiring board is folded at 180 degrees near the end part of the housing. Given that the printed wiring board is folded with a small radius of curvature in such a manner, design constraints may be imposed, such as that inter-layer vias cannot be disposed.

Moreover, not only the above-described problems regarding the strength of the connection end portions of printed wiring boards should be solved, but also printed wiring boards may have to be provided with shield structures in accordance with the improved transmission speed and highly dense configuration of electronic devices. Communication devices such as smartphones are demanded to employ shield structures also for prevention of EMI (Electro Magnetic Interference) because they incorporate a number of wireless units. In such a shield structure, wirings acting as signal lines are provided on an inner layer and the shield layer is provided as an upper layer or lower layer. Furthermore, the structure of a connection end portion to be engaged with a connector requires physical contact with the connector and pads have to be provided which are exposed at the uppermost surface or lowermost surface.

Thus, it may not be easy to appropriately solve problems, such as maintaining and improving the reduced thickness and reduced size, strength of the connection end portion, EMI prevention and transmission characteristics, improving the workability, and improving the degree of freedom in design.

The printed wiring board 1 of the present embodiment includes a ground layer 3 that is formed such that the inner edges of the ground layer 3 are located at locations, which are separated with a predetermined distance from the outer edges of pads 2 and wirings 5 connected to the pads 2, so as to surround the pads 2 and the wirings 5. The ground layer 3 is grounded to a ground contact of a reference potential. This allows the ground layer 3 to be in a state of being insulated from the pads 2 and wirings 5. By forming the ground layer 3 of such a structure, the strength of the connection end portion E of the printed wiring board 1 can be enhanced to prevent deformation and breakage of the end edge Ed of the connection end portion E. The above problems can thus be solved in a balanced manner, regarding the reduction in thickness and size of the printed wiring board 1, improvement of the strength of the connection end portion E, EMI prevention, transmission characteristics, workability at the time of production, and degree of freedom in design. Moreover, by offsetting the ground layer 3 toward inside the insulating substrate 11*b*, the life of a metal die can be elongated and the production cost can be reduced.

Next, with reference to FIG. 3A to FIG. 3H, the printed wiring board 1 of the third example will be described.

The third example is an example of the printed wiring board 1 which includes two conductive layers. The printed wiring board 1 of the third example is different from those of the first example and second example in that pads 2 are provided at a conductive layer while wirings 5 are provided at another conductive layer. In the printed wiring board 1 of the third example, the pads 2 and the wirings 5 are formed as different layers. The third example is in common with the second example in that pairs of wirings 5*a* and 5*b* are provided which function as differential signal lines. The printed wiring board 1 of the third example includes a conductive layer 11*a* and conductive layer 11*c* and is of a type of connection with a connector using one main surface (single-sided connection type). Description of matters in common with those of the first example and second example is borrowed herein to avoid redundant description.

Figure 3A:
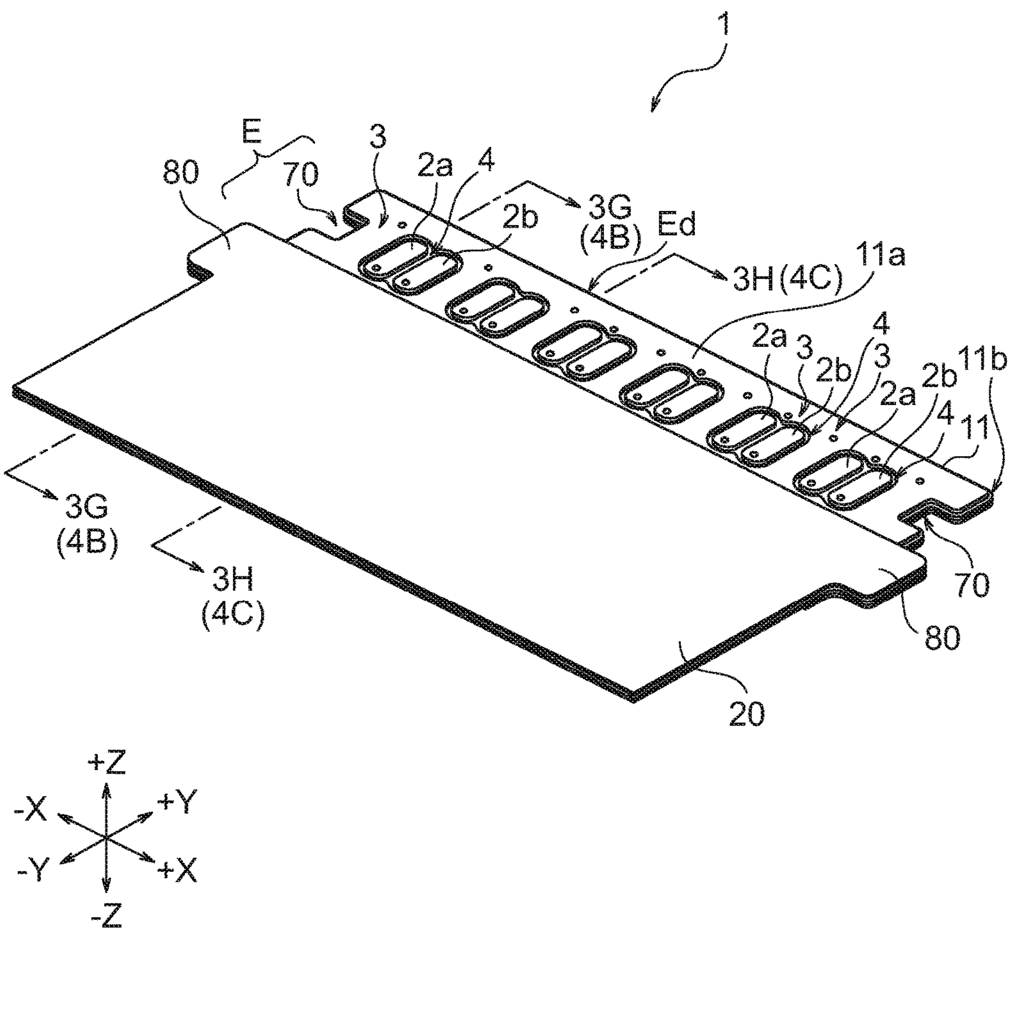
FIG. 3A is a top perspective view illustrating a connection portion of a printed wiring board of a third example according to an embodiment of the present invention.

FIG. 3A is a top perspective view of a connection portion that includes the connection end portion E of the printed wiring board 1 of the third example according to the present embodiment. The printed wiring board 1 illustrated in FIG. 3A includes at least a coverlay 20, first substrate 11, and reinforcement layer 30. The coverlay 20 and reinforcement layer 30 of this example are in common with those of the first example. As in the first example, the printed wiring board 1 of this example further includes one or more engageable parts 70 and one or more tab-like members 80.

Figure 3B:
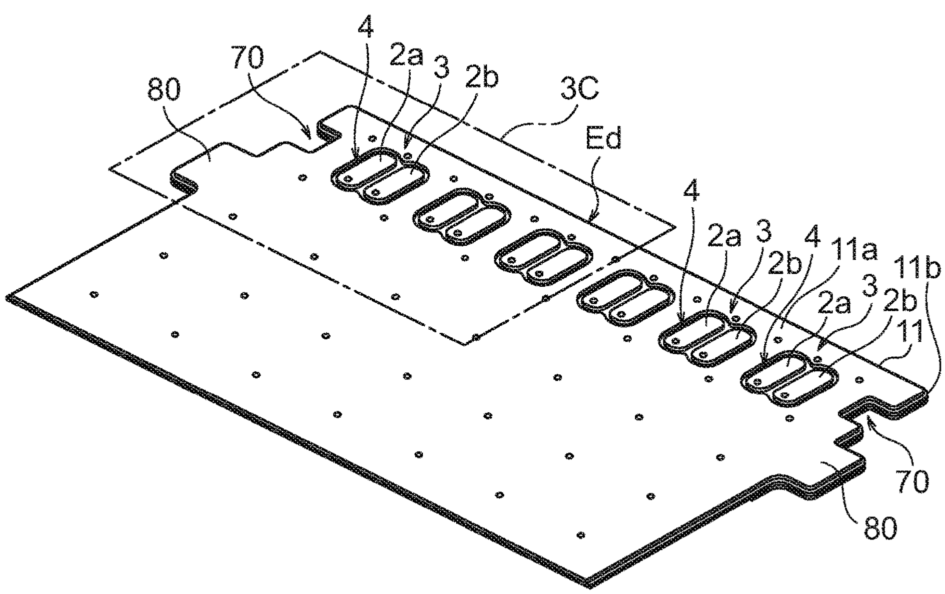
FIG. 3B is a top perspective view of a first substrate in which a coverlay of the printed wiring board illustrated in FIG. 3A is removed.

As illustrated in FIG. 3A, the coverlay 20 is laminated as the uppermost layer of the printed wiring board 1. The first substrate 11 is laminated as a lower layer on the coverlay 20. FIG. 3B is a top perspective view of the first substrate 11 in which the coverlay 20 of the printed wiring board illustrated in FIG. 3A is removed. As illustrated in FIG. 3B, the conductive layer 11*a* formed at one main surface of the first substrate 11 includes pads 2*a* and 2*b*, each combination of which forms a pair, and a ground layer 3. Wirings 5 are not formed. The conductive layer 11*a*, which is formed on one main surface of the insulating substrate 11*b*, has pluralities of pads 2*a* and 2*b* (which may also be referred to as "pads 2" in a collective term). The pairs of pads 2*a* and 2*b* are disposed in parallel along an end edge Ed of the printed wiring board 1 so as to be located within the connection end portion E of the printed wiring board 1 which is to be connected to a connector.

Figure 3C:
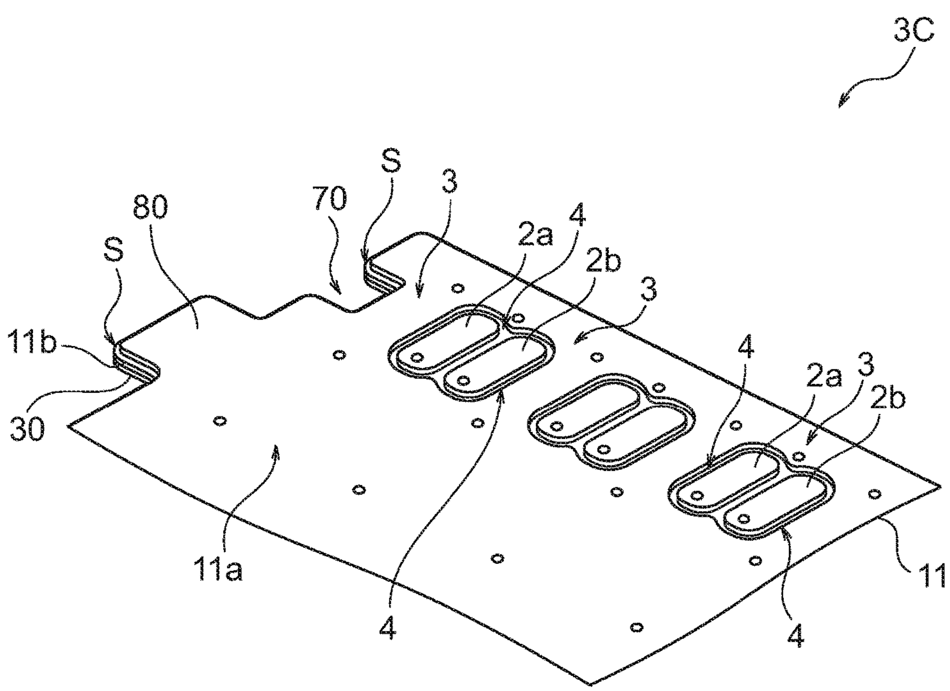
FIG. 3C is a partially enlarged view of the region 3C illustrated in FIG. 3B.

FIG. 3C is a partially enlarged view of the region 3C illustrated in FIG. 3B. As illustrated in FIG. 3B and FIG. 3C, the pads 2 of the printed wiring board 1 of the third example include pads 2*a* connected to wirings 5*a* that transmit first signals and pads 2*b* connected to wirings 5*b* that transmit second signals different from the first signals. The ground layer 3 is to be connected to a ground contact that is grounded to a reference potential. The pads 2*a* and 2*b* are connected respectively to the wirings 5*a* and 5*b*, which are formed at the other main surface of the first substrate 11, with vias TH that penetrate through the first substrate 11.

In the printed wiring board 1 of the third example, the ground layer 3 is formed in a pattern having its inner edges at locations separated from outer edges of the pads 2*a* and 2*b* with a predetermined distance. The pads 2*a* and 2*b* are formed in patterns having their outer edges at locations separated from the inner edges of the ground layer 3 by the predetermined distance. In this example, each pair of pads 2*a* and 2*b* is grouped. As illustrated in FIG. 3C, the ground layer 3 of this example is formed to surround the entire circumferences of regions that each include a pair of pads 2*a* and 2*b*. Grooves 4 having a width of the predetermined distance are formed between the pairs of pads 2*a*, 2*b* and the ground layer 3 which are included in the conductive layer 11*a*. The ground layer 3 forms the grooves 4 which surround the pairs of pads 2*a* and 2*b*.

Figure 3D:
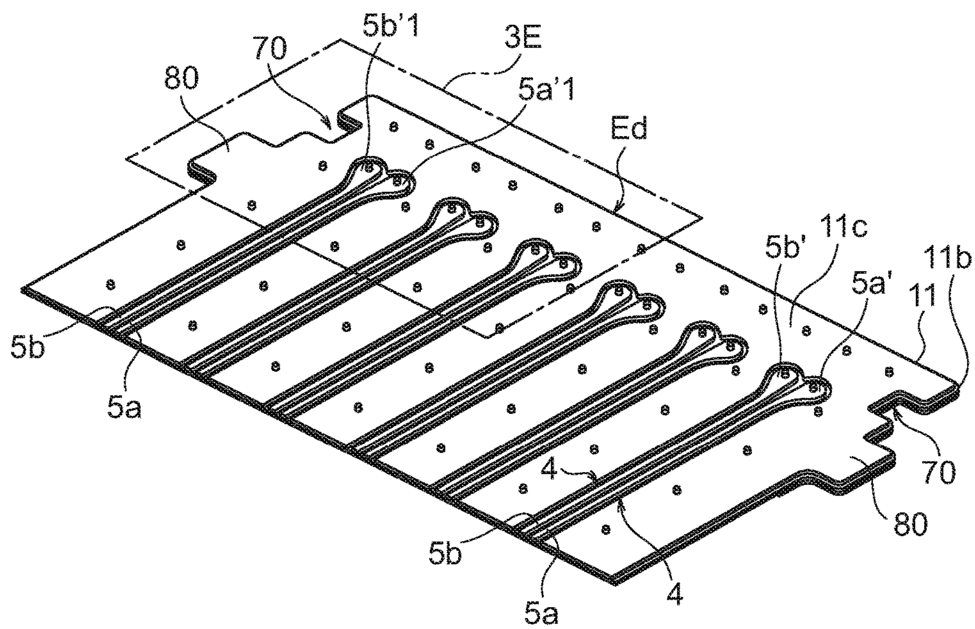
FIG. 3D is a bottom perspective view of a first substrate of the printed wiring board illustrated in FIG. 3A.
Figure 3E:
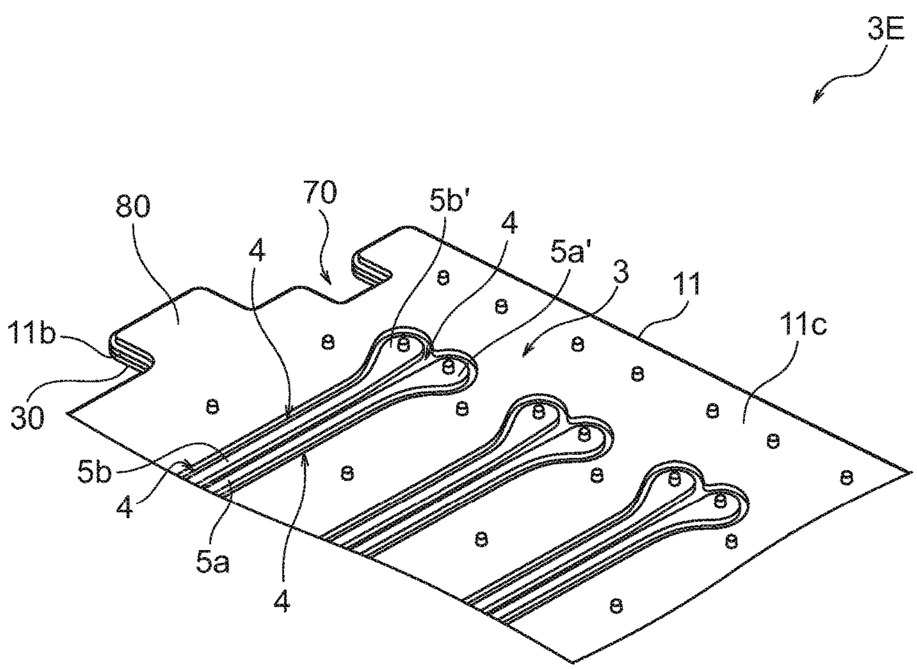
FIG. 3E is a partially enlarged view of the region 3E illustrated in FIG. 3D.

FIG. 3D is a bottom perspective view of the other main surface of the first substrate 11. FIG. 3E is a partially enlarged view of the region 3E illustrated in FIG. 3D. The first substrate 11 has the wirings 5*a* and 5*b*, which are electrically connected to the pads 2*a* and 2*b* with the vias TH penetrating through the first substrate 11, and a ground layer 3 that has its inner edges at locations separated from outer edges of the wirings 5*a* and 5*b* with a predetermined distance and that is to be connected to a ground contact.

As illustrated in FIG. 3D and FIG. 3E, the wirings 5*a*' and 5*b*' which form pairs are disposed in parallel along the width direction at the other main surface of the first substrate 11. End parts 5*a*' of the wirings 5*a* are electrically connected to the pads 2*a*, which are formed at the one main surface of the first substrate 11, with vias that penetrate through the first substrate 11. Similarly, end parts 5*b*' of the wirings 5*b* are electrically connected to the pads 2*b*, which are formed at the one main surface of the first substrate 11, with vias that penetrate through the first substrate 11.

As illustrated in FIG. 3D and FIG. 3E, the wirings 5*a* and 5*b*, which form pairs, have their outer edges at locations separated from inner edges of the ground layer 3 with a predetermined distance. The ground layer 3 is formed to have its inner edges at locations separated from the outer edges of the wirings 5*a* and 5*b* by the predetermined distance. The wirings 5*a* and 5*b* are formed to have their outer edges at locations separated from the inner edges of the ground layer 3 by the predetermined distance. The ground layer 3 of this example is formed to surround the pairs of wirings 5*a* and 5*b*. In this example, each pair of the wirings 5*a* and 5*b* are grouped. As illustrated in FIG. 3D and FIG. 3E, grooves 4 having a width of the predetermined distance are formed between the ground layer 3 included in the conductive layer 11*c* and the wirings 5*a* and 5*b* formed as pairs. In other words, each groove 4 having a width in accordance with the predetermined distance is formed between the ground layer 3 and the grouped pair of the wirings 5*a* and 5*b*. As illustrated in FIG. 3D and FIG. 3E, the ground layer 3 and the wirings 5*a* and wirings 5*b* are separated by the grooves 4 at outer edges, of the outer edges of adjacent wirings 5*a* and 5*b*, other than the outer edges at which the wirings 5*a* face the counterpart wirings 5B. That is, the ground layer 3 is not formed between each pair of the wiring 5*a* and wiring 5*b* which are adjacent to each other.

Figure 3F:
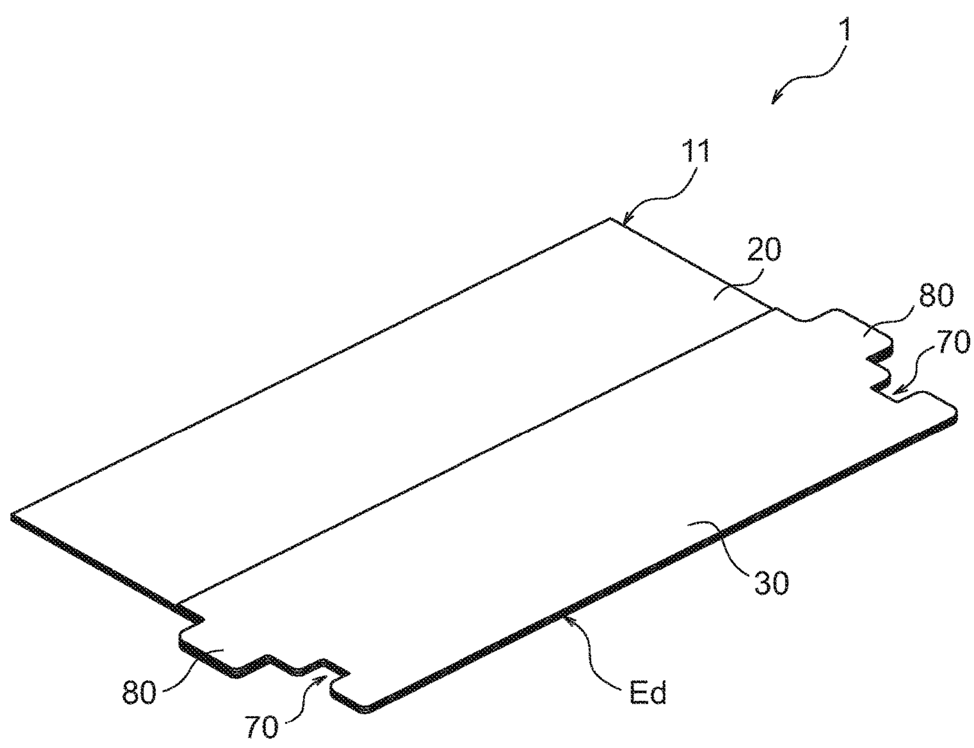
FIG. 3F is a bottom perspective view of the printed wiring board illustrated in FIG. 3A.

FIG. 3F is a bottom perspective view of the printed wiring board 1 illustrated in FIG. 3A. The reinforcement layer 30 is formed, with an adhesive layer, on the surface of a coverlay 20 that covers the other main surface of the first substrate 11.

Figure 3G:
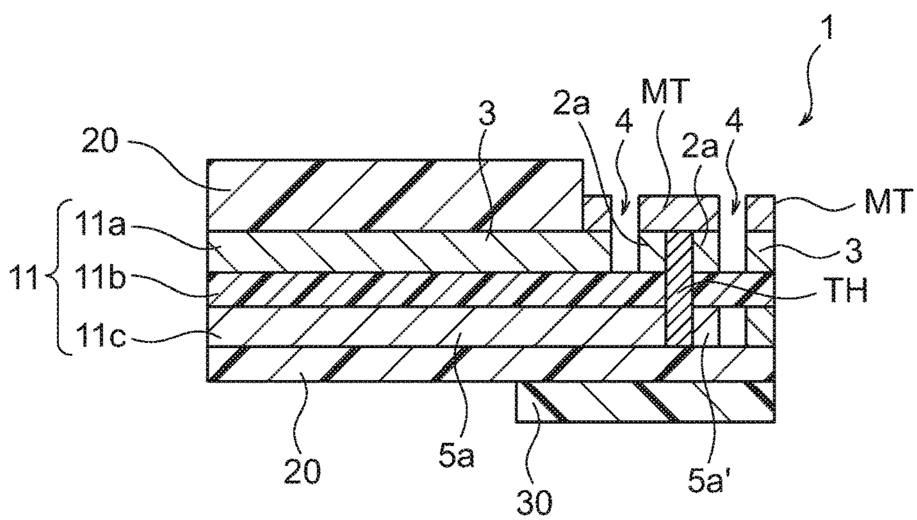
FIG. 3G is a cross-sectional view along the line 3G-3G of the printed wiring board illustrated in FIG. 3A.

FIG. 3G is a cross-sectional view along the line 3G-3G of the printed wiring board illustrated in FIG. 3A. That is, FIG. 3G is a cross-sectional view that includes a pad 2*a* and ground layer 3 of the first substrate 11. As illustrated in FIG. 3G, the grooves 4 are formed between the pads 2*a* and the ground layer 3. The cross section along the line passing through a pad 2*b* is in common with that illustrated in FIG. 3G Grooves 4 are also formed between the pads 2*b* and the ground layer 3. As in the first example, a surface-treated layer MT is formed at the upper surface side of each of the pads 2*a*, 2*b* and ground layer 3.

The wirings 5*a* and their end parts 5*a*' formed in the conductive layer 11*c* of the first substrate 11 are connected to the pads 2 at the upper side of the first substrate 11 with the vias TH.

Figure 3H:
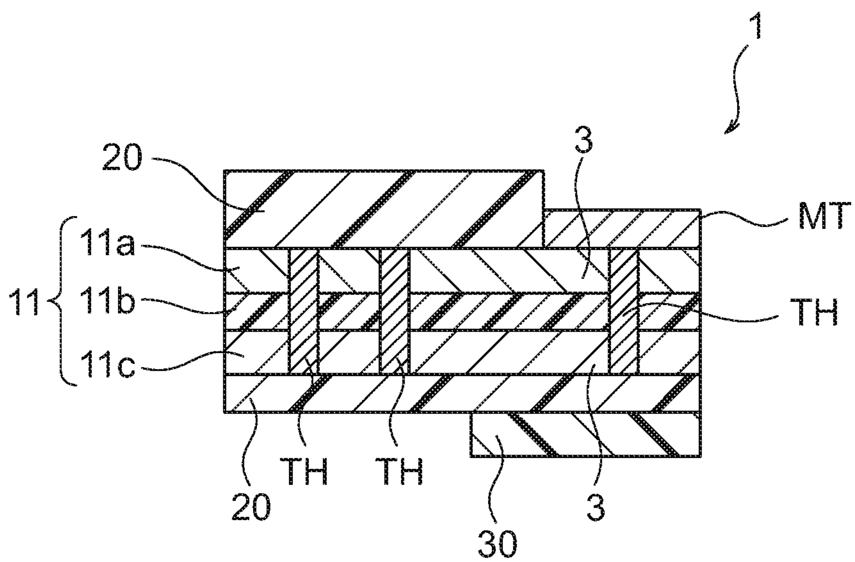
FIG. 3H is a cross-sectional view along the line 3H-3H of the printed wiring board illustrated in FIG. 3A.

FIG. 3H is a cross-sectional view along the line 3H-3H of the printed wiring board illustrated in FIG. 3A, that is, a cross-sectional view that includes the ground layer 3. No grooves appear because pads 2 and wirings 5 are not present along the line 3H-3H. The ground layer 3 of the conductive layer 11*a* is connected to the ground layer 3 of the conductive layer 11*c* with the vias TH. The ground layers 3 are grounded to a ground contact which is not illustrated.

A method of manufacturing the printed wiring board 1 of the above-described third example according to the present embodiment will now be described. First, a substrate is prepared which is formed with conductive layers on both main surfaces of an insulating substrate. In the present embodiment, a double-sided copper clad substrate is prepared in which copper foil layers are formed on both main surfaces of a polyimide substrate. Material of the insulating substrate and material of the conductive layers to be used may be the same as those in the first example and second example.

Via holes are formed to pass through the double-sided copper clad substrate at predetermined positions of the double-sided copper clad substrate, such as by laser machining and CNC drilling. The via holes pass through the double-sided copper clad substrate in the thickness direction. A process of DPP (Direct Plating Process) is performed to form conductive layers on the inner wall surfaces of these via holes. If necessary, a copper plated layer is formed on the whole surface of the double-sided copper clad substrate including the inner wall surfaces of these via holes. As will be understood, a partial plating process may be performed to include these via holes. Through this operation, vias TH are formed to electrically connect between one main surface and the other main surface of the double-sided copper clad substrate.

A common photolithography technique is used to form desired pads 2*a* and 2*b* in the conductive layer 11*a* at one main surface of the double-sided copper clad substrate and form wirings 5*a* and 5*b* in the conductive layer 11*c* at the other main surface. The conductive layers do not remain within regions corresponding to the grooves 4 between the pads 2*a*, 2*b* and the ground layer 3 and regions corresponding to the grooves between the wirings 5*a*, 5*b* and the ground layer 3. The pads 2*a*, 2*b* and the ground layer 3 are in a state of being insulated. The wirings 5*a*, 5*b* and the ground layer 3 are also in a state of being insulated. This allows the first substrate 11 to be obtained.

In the third example, as illustrated in FIG. 3B and FIG. 3D, the pads 2*a*, 2*b* and the wirings 5*a*, 5*b* have patterns of differential signal lines that form pairs. In the present embodiment, desired wirings 5*a* and 5*b* are formed through making a mask pattern on the other main surface of the double-sided copper clad substrate in accordance with the patterns of differential signal lines and etching the copper foil. Similarly, desired pads 2*a* and 2*b* are formed through making a mask pattern on the one main surface of the double-sided copper clad substrate in accordance with the patterns of pads 2*a*, 2*b* and etching the copper foil. This allows the first substrate 11 formed with desired wirings 5*a*, wirings 5*b*, pads 2*a* and pads 2*b* to be obtained.

The coverlays 20 are attached to the one main surface and the other main surface of the obtained first substrate 11 with adhesives. Curing treatment for the adhesives is performed as necessary.

Surface treatment, such as gold plating, is performed for the surfaces of the pads 2*a* and 2*b* to form the surface-treated layers MT. The reinforcement layer 30 is attached to the coverlay 20 at the other main surface with an adhesive. Curing treatment for the adhesive is performed as necessary. A metal die is preliminarily prepared and used to punch out the printed wiring board 1 into a shape having the engageable parts 70 and tab-like members 80. This allows the printed wiring board 1 of the third example according to the present embodiment to be obtained.

Next, with reference to FIG. 4A to FIG. 4I, the printed wiring board 1 of the fourth example will be described.

The fourth example is an example of the printed wiring board 1 which includes three conductive layers. The fourth example is in common with the second and third examples in that wirings 5*a* and 5*b* are provided which function as differential signal lines. The printed wiring board 1 of the fourth example includes a conductive layer 11*a*, conductive layer 11*c* and conductive layer 12*c* and is of a type of connection with a connector using one main surface (single-sided connection type). Description of matters in common with those of the first to third examples is borrowed herein to avoid redundant description.

Figure 4A:
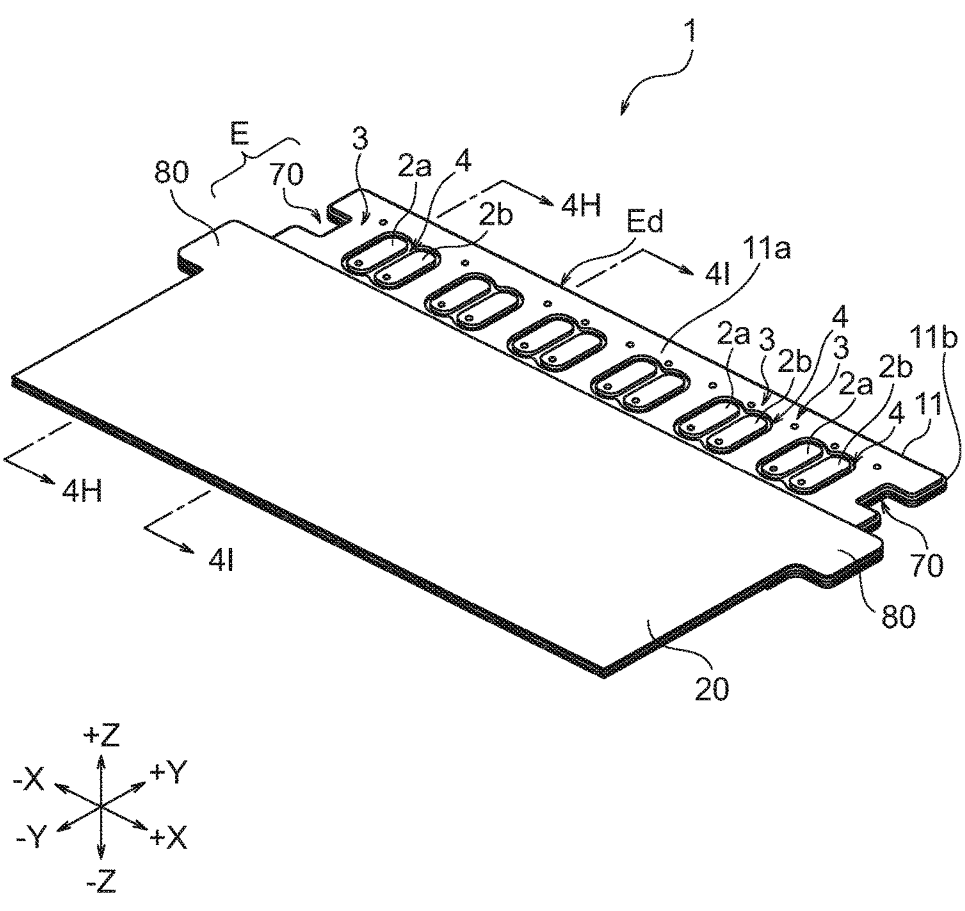
FIG. 4A is a top perspective view illustrating a connection portion of a printed wiring board of a fourth example according to an embodiment of the present invention.

FIG. 4A is a top perspective view of a connection portion that includes the connection end portion E of the printed wiring board 1 of the fourth example according to the present embodiment. The printed wiring board 1 illustrated in FIG. 4A includes at least a coverlay 20, first substrate 11, second substrate 12, and reinforcement layer 30. The coverlay 20 and reinforcement layer 30 of this example are in common with those of the first example. As in the first example, the printed wiring board 1 of this example further includes one or more engageable parts 70 and one or more tab-like members 80.

Figure 4B:
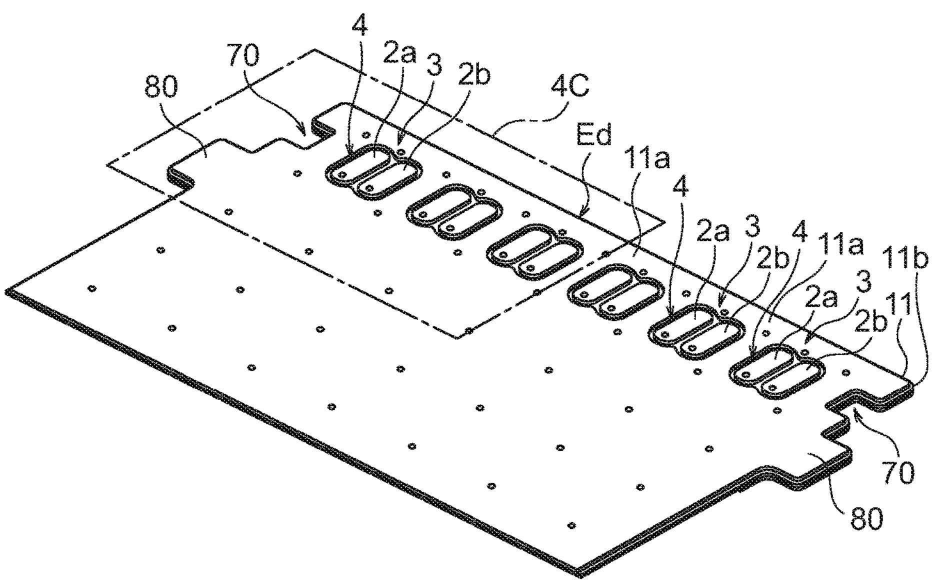
FIG. 4B is a top perspective view of a first substrate in which a coverlay of the printed wiring board illustrated in FIG. 4A is removed.

As illustrated in FIG. 4A, the coverlay 20 is laminated as the uppermost layer of the printed wiring board 1. The first substrate 11 is laminated as a lower layer on the coverlay 20. FIG. 4B is a top perspective view of the first substrate 11 in which the coverlay 20 of the printed wiring board illustrated in FIG. 4A is removed. As illustrated in FIG. 4B, the conductive layer 11*a* at one main surface of the first substrate 11 is formed with pads 2*a* and 2*b*, each combination of which forms a pair, and a ground layer 3. Wirings 5 are not formed. The conductive layer 11*a*, which is formed on one main surface of the insulating substrate 11*b*, has pluralities of pads 2*a* and 2*b* (which may also be referred to as "pads 2" in a collective term). The form of arrangement of the pads 2*a* and 2*b* is in common with that in the second example.

Figure 4C:
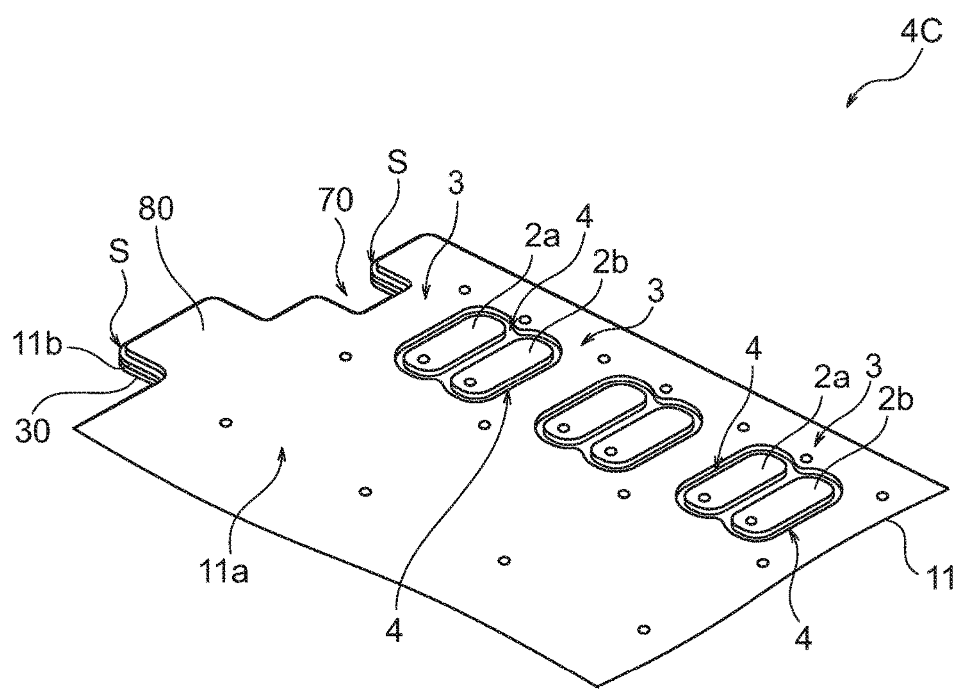
FIG. 4C is a partially enlarged view of the region 4C illustrated in FIG. 4B.

FIG. 4C is a partially enlarged view of the region 4C illustrated in FIG. 4B. The form of each of the pads 2*a* and 2*b*, ground layer 3 and grooves 4 of the printed wiring board 1 of the fourth example illustrated in FIG. 4B and FIG. 4C is in common with that in the third example.

Figure 4D:
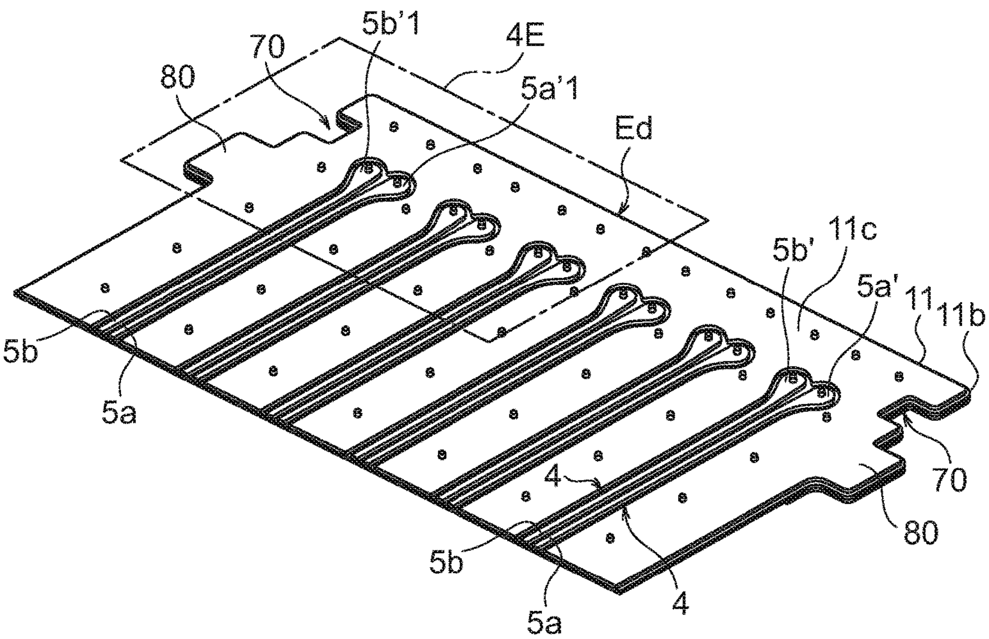
FIG. 4D is a top perspective view of the other main surface of the printed wiring board illustrated in FIG. 4A.
Figure 4E:
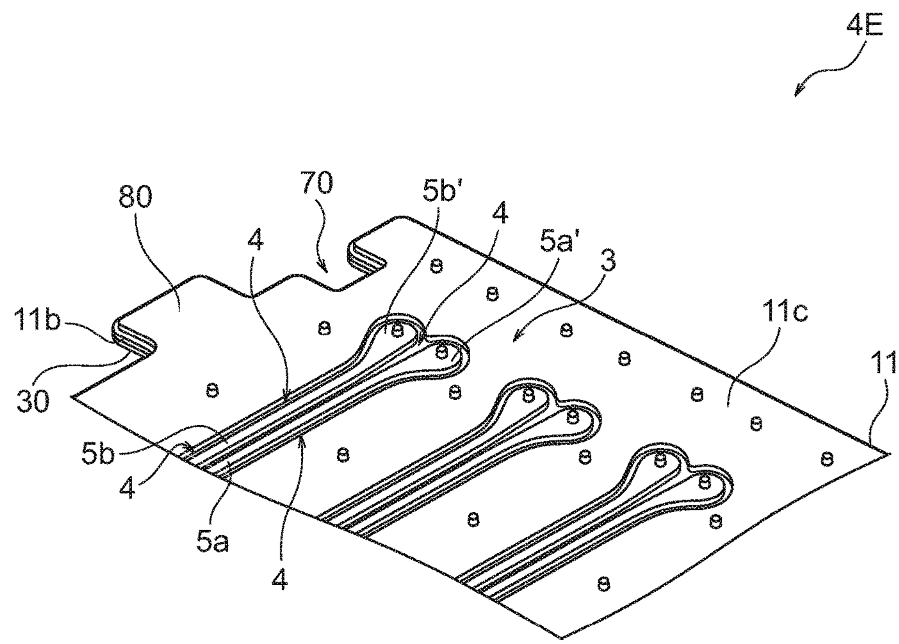
FIG. 4E is a partially enlarged view of the region 4E illustrated in FIG. 4D.

FIG. 4D is a bottom perspective view of the other main surface of the first substrate 11. FIG. 4E is a partially enlarged view of the region 4E illustrated in FIG. 4D.

As illustrated in FIG. 4D and FIG. 4E, the wirings 5*a* and 5*b* which form pairs are disposed in parallel along the width direction at the other main surface of the first substrate 11. End parts 5*a*' of the wirings 5*a* are electrically connected to the pads 2*a* as the upper layer of the first substrate 11 with vias that penetrate through the first substrate 11. Similarly, end parts 5*b*' of the wirings 5*b* are electrically connected to the pads 2*b* as the upper layer of the first substrate 11 with vias that penetrate through the first substrate 11. The form of each of the wirings 5*a* and 5*b*, ground layer 3 and grooves 4 of the printed wiring board 1 of the fourth example illustrated in FIG. 4D and FIG. 4E is in common with the form of each of the wirings 5*a* and 5*b*, ground layer 3 and grooves 4 which are formed at the other main surface side of the first substrate 11 in the third example.

Figure 4F:
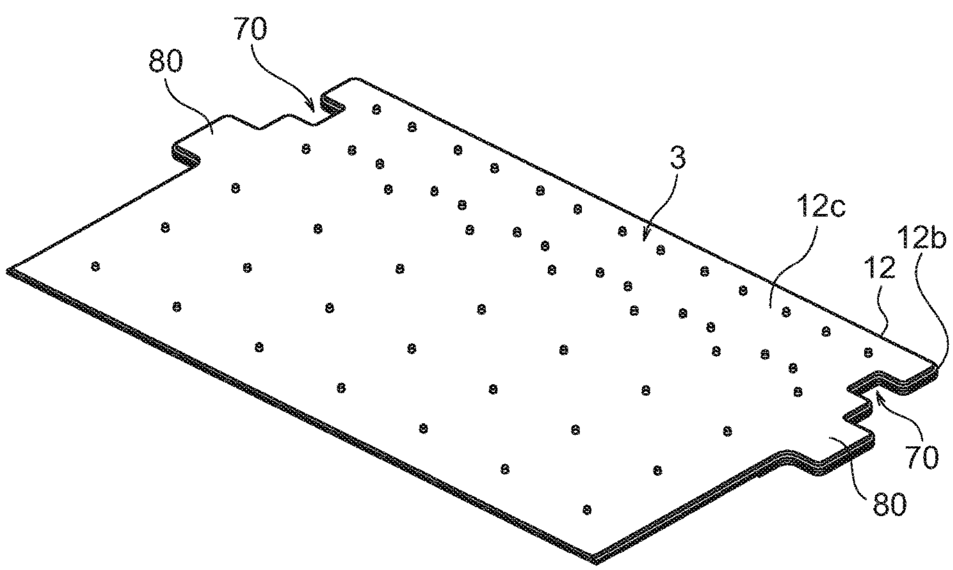
FIG. 4F is a bottom perspective view of a second substrate of the printed wiring board illustrated in FIG. 4A.
Figure 4G:
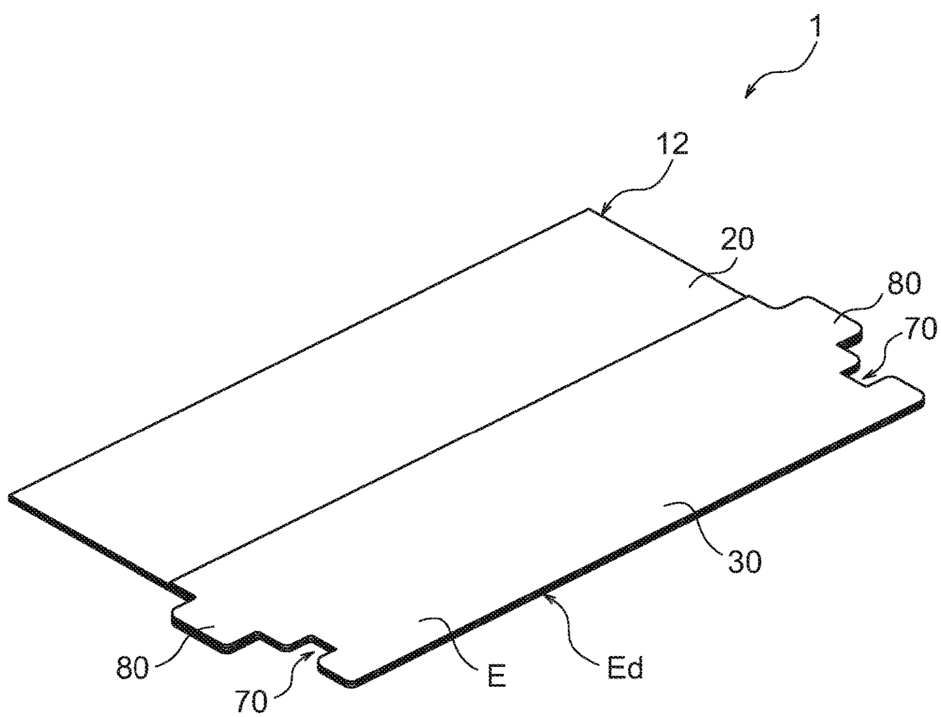
FIG. 4G is a bottom perspective view of the printed wiring board illustrated in FIG. 4A.

FIG. 4F is a bottom perspective view of the second substrate 12. The conductive layer 12*c* is formed at the other main surface of the second substrate 12. The conductive layer 12*c* is to be connected to a ground contact of a reference potential and functions as a ground layer 3.

Figure 4H:
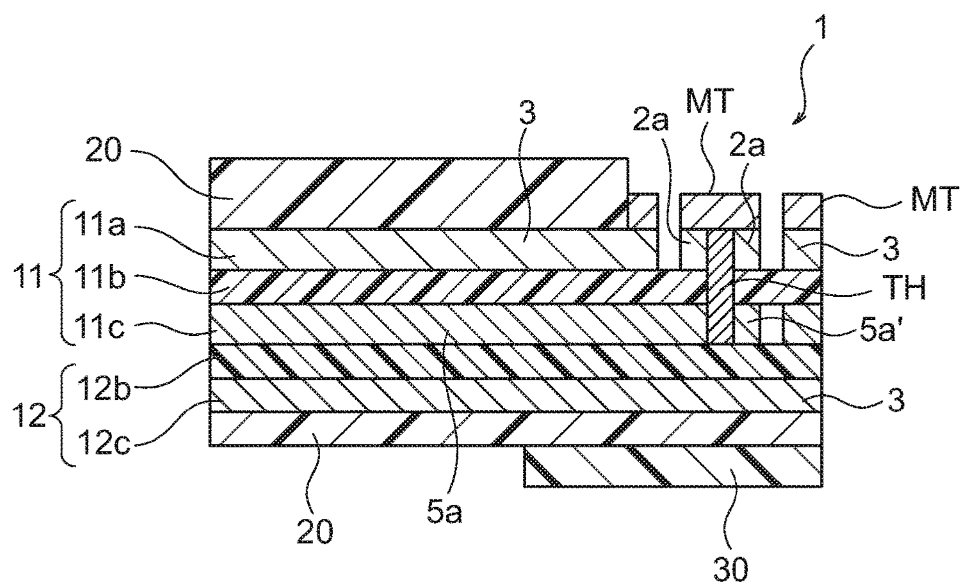
FIG. 4H is a cross-sectional view along the line 4H-4H of the printed wiring board illustrated in FIG. 4A.

FIG. 4H is a cross-sectional view along the line 4H-4H of the printed wiring board illustrated in FIG. 4A.

The printed wiring board 1 of the fourth example has a second substrate 12 that is directly laminated on any one of main surfaces of the first substrate 11. In a modified embodiment, one or more third substrates which are not illustrated may be disposed between the first substrate 11 and the second substrate 12. The number of the second substrate or substrates 12 to be laminated is not limited. The second substrate 12 is electrically connected to the ground layer 3 of the first substrate 11 which is to be connected to a ground contact with vias TH that penetrate through one or more substrates 10 including the first substrate 11 and the third substrate or substrates (not illustrated).

FIG. 4H is a cross-sectional view that includes a pad 2*a* and the ground layer 3 of the first substrate 11, a wiring 5*a* and the ground layer 3 of the first substrate 11, and the ground layer 3 of the second substrate 12. As illustrated in FIG. 4H, grooves 4 are formed between the pads 2*a* and the ground layer 3. The cross section along the line passing through a pad 2*b* is in common with that illustrated in FIG. 4H. Grooves 4 are also formed between the pads 2*b* and the ground layer 3. As in the first example, a surface-treated layer MT is formed at the upper surface side of each of the pads 2*a*, 2*b* and ground layer 3.

As illustrated in FIG. 4H, the wirings 5*a* and their end parts 5*a*' formed in the conductive layer 11*c* of the first substrate 11 are connected to the pads 2 at the upper side of the first substrate 11 with the vias TH.

Figure 4I:
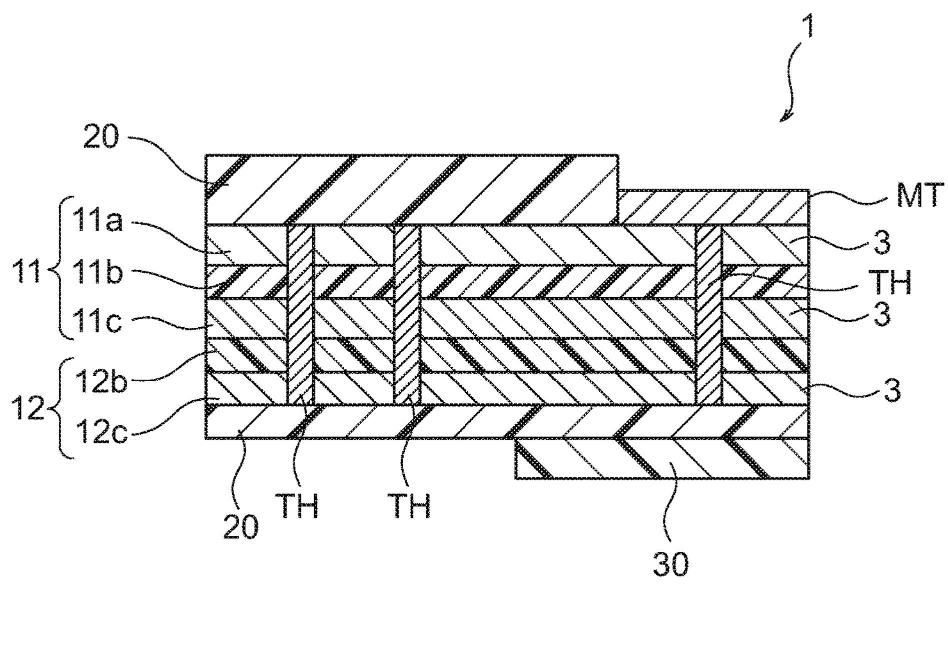
FIG. 4I is a cross-sectional view along the line 4I-4I of the printed wiring board illustrated in FIG. 4A.

FIG. 4I is a cross-sectional view along the line 4I-4I of the printed wiring board illustrated in FIG. 4A, that is, a cross-sectional view that includes the ground layers 3. No grooves appear because pads 2 and wirings 5 are not present along the line 4I-4I. The ground layers 3 at the one main surface and the other main surface of the first substrate 11 are connected to the ground layer 3 of the second substrate 12 with the vias TH. Each ground layer 3 is grounded to a ground contact which is not illustrated.

In general, a connector is provided with a shield for EMI prevention. However, the vias TH for interlayer connection in the multilayer printed wiring board 1 to be connected to a connector are located outside the connector and therefore the vias TH cannot be protected by the shield layer or layers of the printed wiring board and also may not be protected by the shield of the connector. Such insufficient protection causes noises, which may deteriorate the transmission characteristics. In particular, since the transmission speed is currently high, even low noises affect the transmission characteristics and such influence cannot be neglected.

In the present embodiment, the vias TH for achieving the interlayer connection are formed within the connection end portion E in the printed wiring board 1 of a multilayer structure. In other words, the vias TH for achieving the interlayer connection are disposed just below the pads 2, which are provided within the connection end portion E, rather than being disposed short of the end edge Ed (at the opposite side to the end edge Ed) of the connection end portion E of the printed wiring board 1. One-end parts of the vias TH penetrating through layers are in contact with back surfaces of the pads 2 (back sides to the contact surfaces of the pads 2).

The pads 2 of the printed wiring board 1 according to the present embodiment are surrounded by the ground layer 3. The shield structure of the printed wiring board 1 according to the present embodiment can therefore shield the signal transmission paths between layers. Even when the high-speed transmission and EMI characteristics are demanded, the transmission paths can be protected so as not to be exposed to outside the shield structure.

The shield structure of the printed wiring board 1 of a multilayer structure according to the present embodiment can maintain a shielded state until signals are transmitted to the pads 2. That is, in the printed wiring board 1 of the present embodiment, the signals are exposed to outside the shield structure only at the pads 2 which are to be in contact with a connector. Thus, the printed wiring board 1 of the present embodiment can be provided with a shield structure that realizes ultimate shielding ability, that is, can maintain a shielded state up to the pads 2 which are to be in physical contact with a connector.

Moreover, the printed wiring board 1 can be folded in the vicinity of the fitting part with a connector because the vias TH can transmit signals to the surficial pads 2 within the connection end portion E of the printed wiring board 1. The connector can therefore be disposed near the wall surface of the housing without consideration for the folding angle of the printed wiring board 1. Thus, even in the printed wiring board 1 of a multilayer structure, the above problems can be solved in a balanced manner, regarding the reduction in thickness and size of the printed wiring board 1, improvement of the strength of the connection end portion E, EMI prevention, transmission characteristics, workability at the time of production, degree of freedom in design, and reduced space in the board layout. Furthermore, by offsetting the ground layer 3 toward inside the insulating substrate 11*b*, the life of a metal die can be elongated and the production cost can be reduced.

A method of manufacturing the printed wiring board 1 of the above-described fourth example according to the present embodiment will now be described. First, to produce the first substrate 11, a substrate is prepared which is formed with the conductive layers 11*a* and 11*c* on both main surfaces of the insulating substrate 11*b*. A double-sided copper clad substrate as in the third example may be used.

As in the same scheme as that in the third example, a common photolithography technique is used to form wirings 5*a* and 5*b* in the conductive layer 11*c* at the other main surface of the double-sided copper clad substrate. The conductive layer 11*c* does not remain within regions corresponding to the grooves between the wirings 5*a*, 5*b* and the ground layer 3. The wirings 5*a*, 5*b* and the ground layer 3 are in a state of being insulated. This allows the first substrate 11 to be obtained.

Then, to produce the second substrate 12, a single-sided copper clad substrate is prepared which is formed with the conductive layer 12*c* on the other main surface of an insulating substrate.

The ground layer 3 is formed on the other main surface of the second substrate 12. In this example, the conductive layer 12*c* remains to function as the ground layer 3.

Subsequently, the first substrate 11 and the second substrate 12 are laminated on each other and, as in the same scheme as that in the third example, a common photolithography technique is used to form desired pads 2*a* and 2*b* in the conductive layer 11*a* at the one main surface of the double-sided copper clad substrate. The conductive layer 11*a* does not remain within regions corresponding to the grooves 4 between the pads 2*a*, 2*b* and the ground layer 3. The pads 2*a*, 2*b* and the ground layer 3 are in a state of being insulated. As in the same scheme as that in the third example, vias TH are formed to electrically connect between the one main surface and the other main surface of the first substrate 11 and vias TH are also formed to electrically connect between the one main surface and the other main surface of the first substrate 11 and the other main surface of the second substrate 12.

A coverlay 20 is attached to the uppermost surface at the one main surface side of the first substrate 11 with an adhesive. Another coverlay 20 is attached to the other main surface of the second substrate 12 with an adhesive. Curing treatment for the adhesives is performed as necessary.

Surface treatment, such as gold plating, is performed for the surfaces of the pads 2*a*, 2*b* and ground layer 3 at the one main surface side of the first substrate 11 to form the surface-treated layers MT. The reinforcement layer 30 is attached to the coverlay 20, which is attached to the other main surface of the second substrate 12, with an adhesive. Curing treatment for the adhesive is performed as necessary. A metal die is preliminarily prepared and used to punch out the printed wiring board 1 into a shape having the engageable parts 70 and tab-like members 80. This allows the printed wiring board 1 of the fourth example according to the present embodiment to be obtained.

Next, with reference to FIG. 5A to FIG. 5J, the printed wiring board 1 of the fifth example will be described.

The fifth example is an example of the printed wiring board 1 which includes three conductive layers. The fifth example is in common with the first example in that wirings 5 have wiring patterns of signal lines for single-ended signals. The printed wiring board 1 of the fifth example includes a conductive layer 11*a*, conductive layer 12*a* and conductive layer 12*c* and is of a type of connection with a connector using both surfaces of the top and back surfaces (double-sided connection type). Description of matters in common with those of the first to fourth examples is borrowed herein to avoid redundant description.

Figure 5A:
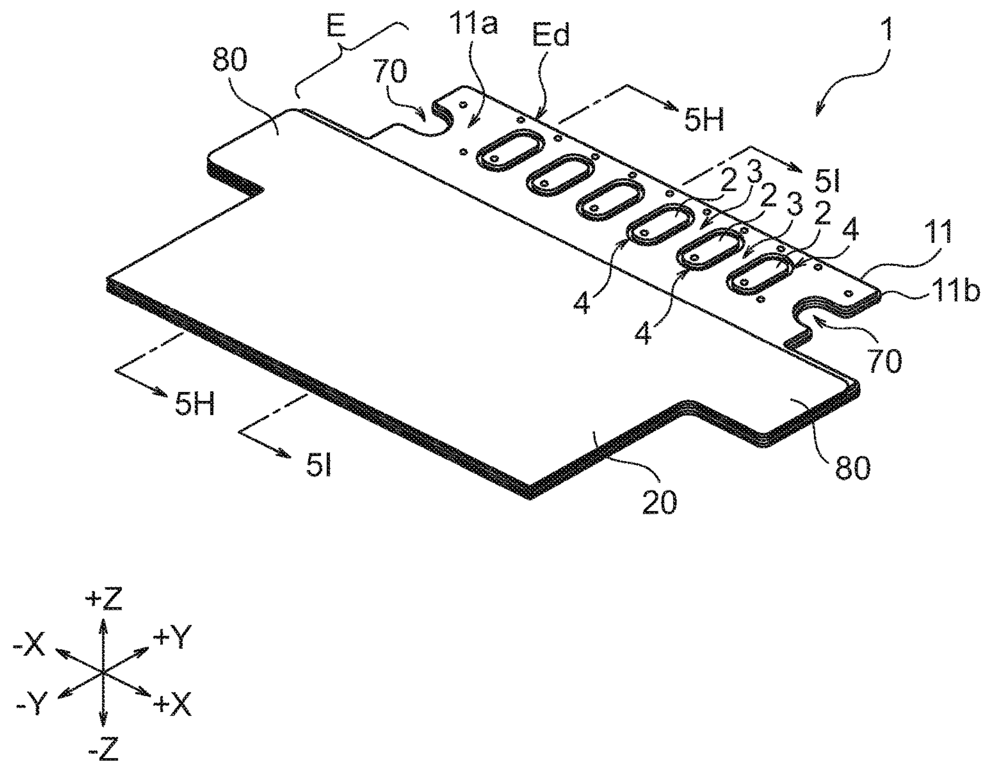
FIG. 5A is a top perspective view illustrating a connection portion of a printed wiring board of a fifth example according to an embodiment of the present invention.

FIG. 5A is a top perspective view of a connection portion that includes the connection end portion E of the printed wiring board 1 of the fifth example according to the present embodiment. The printed wiring board 1 illustrated in FIG. 5A includes at least a coverlay 20, first substrate 11, and one second substrate 12. The coverlay 20 of this example is in common with that in the first example. As in the first example, the printed wiring board 1 of this example further includes one or more engageable parts 70 and one or more tab-like members 80.

Figure 5B:
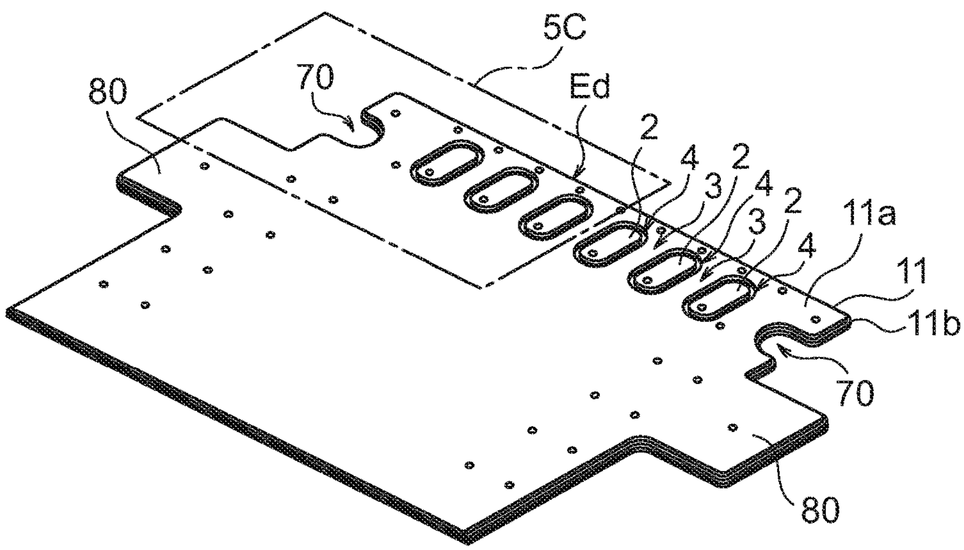
FIG. 5B is a top perspective view of a first substrate in which a coverlay of the printed wiring board illustrated in FIG. 5A is removed.

As illustrated in FIG. 5A, the coverlay 20 is laminated as each of the uppermost layer and lowermost layer of the printed wiring board 1. The first substrate 11 is disposed as a lower layer on the coverlay 20 as the uppermost layer. FIG. 5B is a top perspective view of the first substrate 11 in which the coverlay 20 of the printed wiring board illustrated in FIG. 5A is removed. As illustrated in FIG. 5A and FIG. 5B, the conductive layer 11*a*, which is formed on one main surface of the insulating substrate 11*b*, has a plurality of pads 2. As illustrated in FIG. 5A and FIG. 5B, the pads 2 are disposed in parallel along an end edge Ed of the printed wiring board 1 so as to be located within the connection end portion E of the printed wiring board 1 which is to be connected to a connector. The form of arrangement of the pads 2 is in common with that in the first example. As illustrated in FIG. 5B, the conductive layer 11*a*, which includes the pads 2 and the ground layer 3, is formed at the one main surface of the first substrate 11 at the upper side. Wirings 5 are not formed.

Figure 5C:
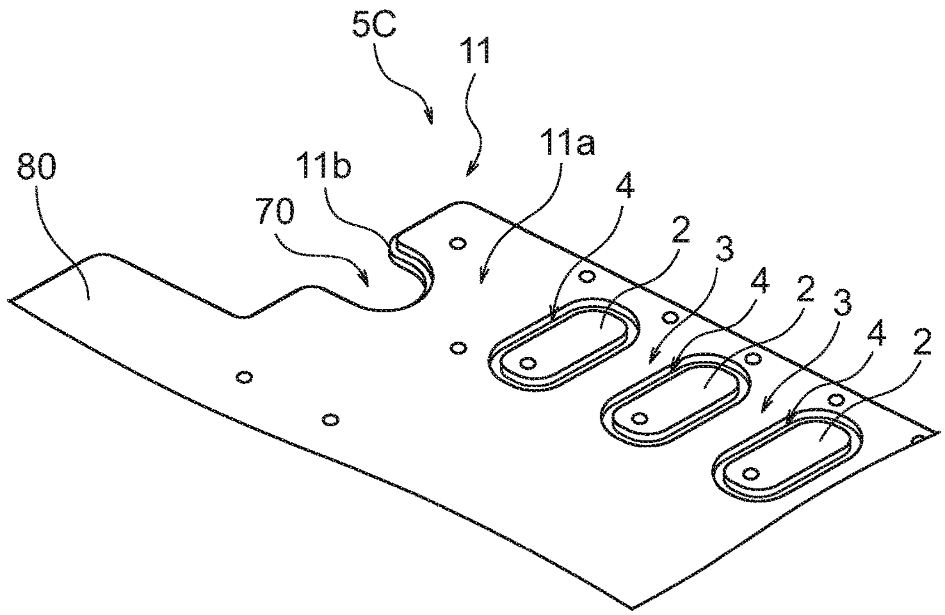
FIG. 5C is a partially enlarged view of the region 5C illustrated in FIG. 5B.

FIG. 5C is a partially enlarged view of the region 5C illustrated in FIG. 5B. The conductive layer 11*a*, which is formed on one main surface of the insulating substrate 11*b*, has a plurality of pads 2. The form of arrangement of the pads 2 is in common with that in the first example. In the printed wiring board 1 of the fifth example, the ground layer 3 is formed in a pattern having its inner edges at locations separated from outer edges of the pads 2 with a predetermined distance. As illustrated in FIG. 5C, the ground layer 3 of this example is formed to surround the entire circumferences of the pads 2. Grooves 4 having a width of the predetermined distance are formed between the pads 2 and the ground layer 3 which are included in the conductive layer 11*a*. The ground layer 3 forms the grooves 4 which surround the pads 2.

Figure 5D:
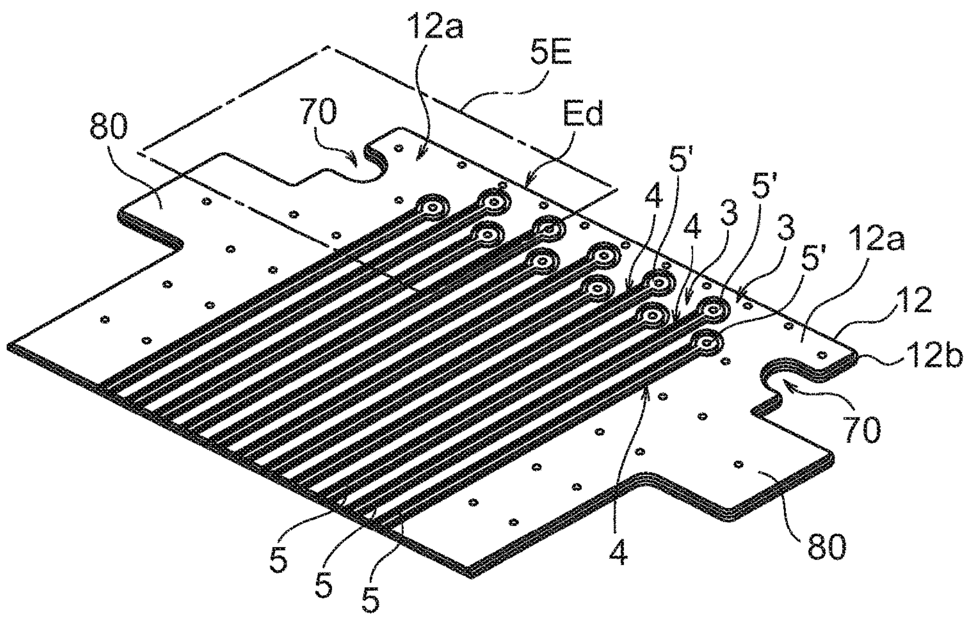
FIG. 5D is a top perspective view of a second substrate of the printed wiring board illustrated in FIG. 5A.
Figure 5E:
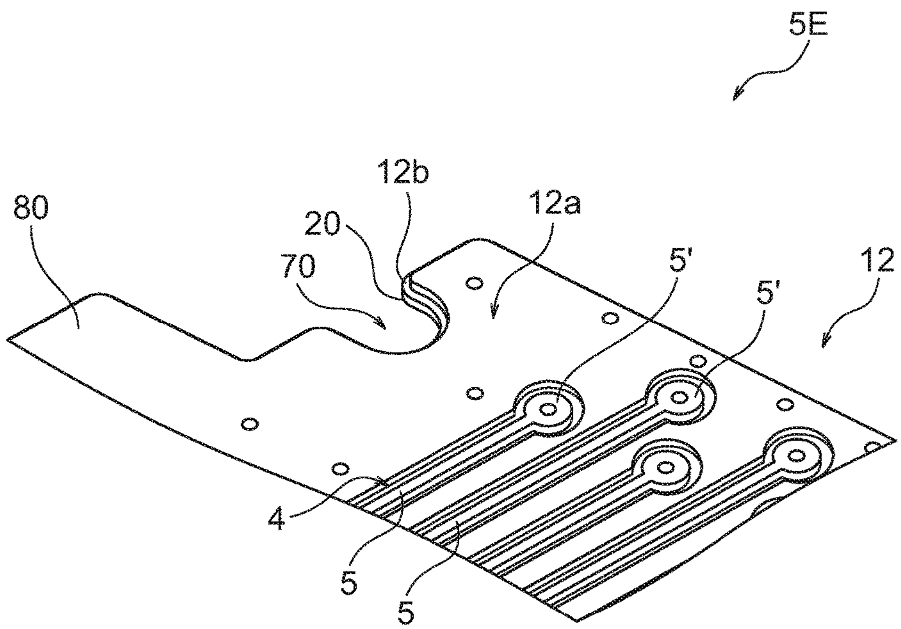
FIG. 5E is a partially enlarged view of the region 5E illustrated in FIG. 5D.

FIG. 5D is a top perspective view at the one main surface side of the second substrate 12. FIG. 5E is a partially enlarged view of the region 5E illustrated in FIG. 5D. The printed wiring board 1 of the fifth example has a second substrate 12 that is directly laminated on any one of main surfaces of the first substrate 11. In a modified embodiment, one or more third substrates may be interposed between the first substrate 11 and the second substrate 12. The number of the second substrate or substrates 12 to be laminated is not limited. The second substrate 12 has wirings 5 and a ground layer 3. The wirings 5 are electrically connected to the pads 2 with vias TH that penetrate through one or more substrates 10. The ground layer 3 has its inner edges at locations separated from outer edges of the wirings 5 with a predetermined distance and is to be connected to a ground contact.

As illustrated in FIG. 5D and FIG. 5E, the wirings 5 are disposed in parallel along the width direction of the printed wiring board 1 at the one main surface of the second substrate 12. End parts 5' of the wirings 5 are electrically connected to the pads 2 at the one main surface of the first substrate 11 with vias that penetrate through the first substrate 11. In addition, end parts 5' of the wirings 5 are also electrically connected to the pads 2 at the other main surface of the second substrate 12 with vias that penetrate through the second substrate 12. In the printed wiring board 1 of the fifth example according to the present embodiment, end parts 5' of the odd-numbered wirings 5 are electrically connected to the pads 2 at the one main surface of the first substrate 11 while end parts 5' of the even-numbered wirings 5 are electrically connected to the pads 2 at the other main surface of the second substrate 12.

The printed wiring board 1 according to the fifth example is to be connected to a connector at both surfaces of the printed wiring board 1. In this example, the pads 2 and ground layer 3 are formed at the one main surface side of the first substrate 1 while the pads 2 and ground layer 3 are also formed on the other main surface side of the second substrate 12.

Figure 5F:
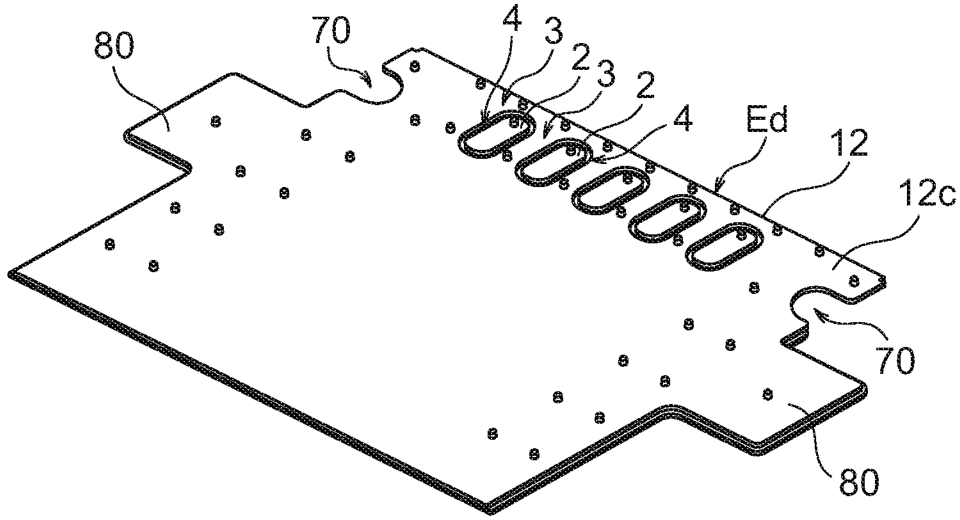
FIG. 5F is a bottom perspective view of a second substrate of the printed wiring board illustrated in FIG. 5A.

FIG. 5F is a bottom perspective view of the other main surface side of the second substrate 12. The pads 2 and ground layer 3 are formed at the other main surface side of the second substrate 12. As in the first substrate 11 of the first example, grooves 4 having a width of a predetermined distance are formed between the pads 2 and the ground layer 3. Thus, the second substrate 12 in the fifth example has a structure and function as those of the first substrate 11. The substrate having the pads 2 is described as being called the second substrate 12 for descriptive purposes, but the second substrate 12 in the fifth example corresponds to the first substrate of the present invention.

Figure 5G:
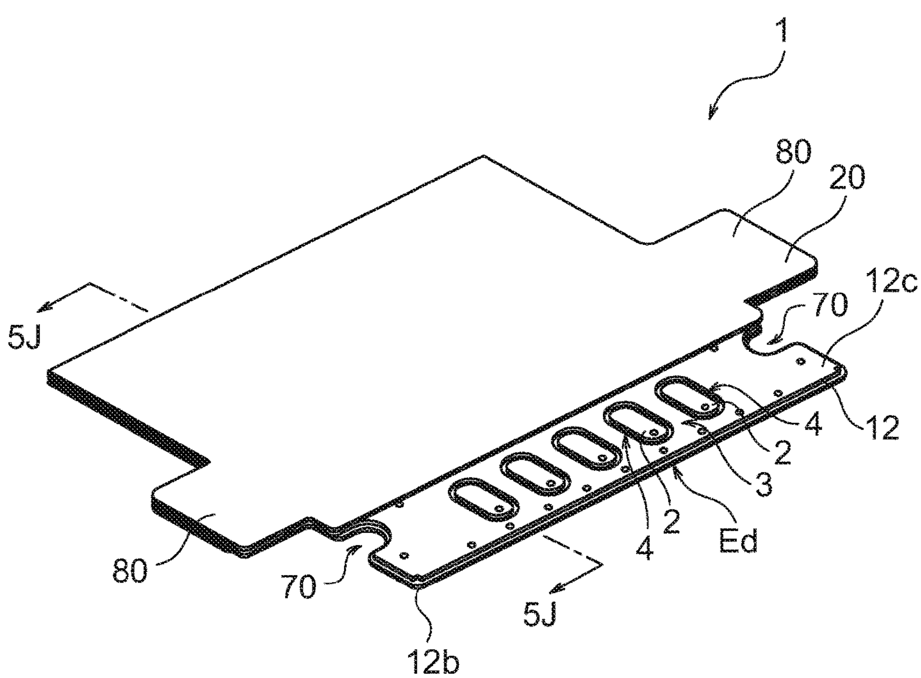
FIG. 5G is a bottom perspective view of the printed wiring board illustrated in FIG. 5A.

FIG. 5G is a bottom perspective view of the printed wiring board 1 illustrated in FIG. 5A. The conductive layer 12*c* at the other main surface side of the second substrate 12, which constitutes the bottom surface, is covered by a coverlay 20 except the region within which the pads 2 are formed. As illustrated in FIG. 5G, the pads 2 formed at the other main surface of the second substrate 12 are exposed at the bottom surface side of the printed wiring board 1 thereby to enable electrical contact with a connector also at the bottom surface.

Figure 5H:
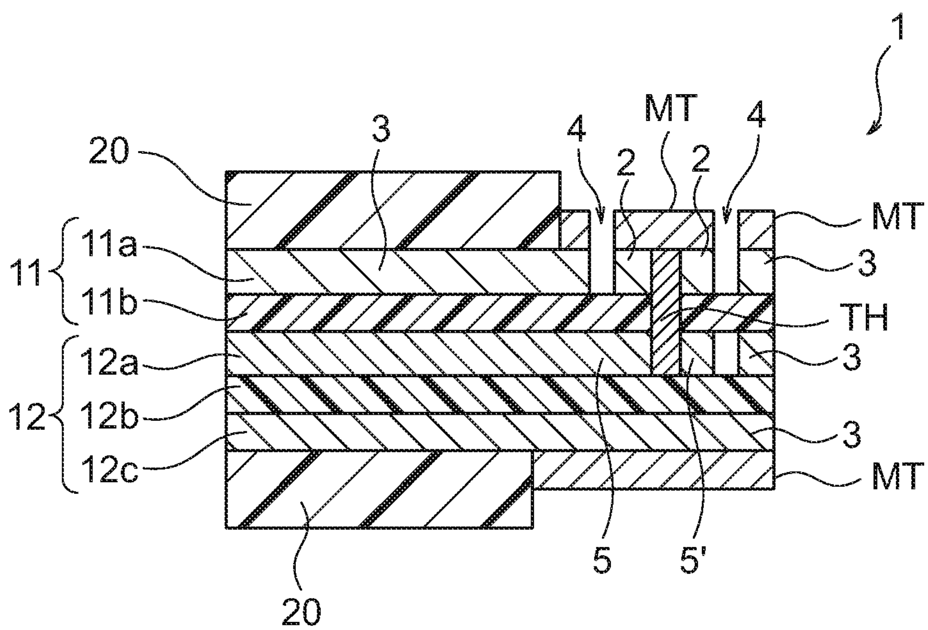
FIG. 5H is a cross-sectional view along the line 5H-5H of the printed wiring board illustrated in FIG. 5A.

FIG. 5H is a cross-sectional view along the line 5H-5H of the printed wiring board illustrated in FIG. 5A. That is, FIG. 5H is a cross-sectional view that includes a pad 2*a* and the ground layer 3 of the first substrate 11, a wiring 5 and the ground layer 3 formed at the one main surface of the second substrate 12, and the ground layer 3 formed at the other main surface of the second substrate 12. As illustrated in FIG. 5H, the grooves 4 are formed between the pads 2 and the ground layer 3. As in the first example, a surface-treated layer MT is formed at the upper surface side of each of the pads 2 and ground layer 3. The wirings 5 and their end parts 5' formed in the conductive layer 12*a* of the second substrate 12 are connected to the pads 2 at the upper side of the first substrate 11 with the vias TH.

Figure 5I:
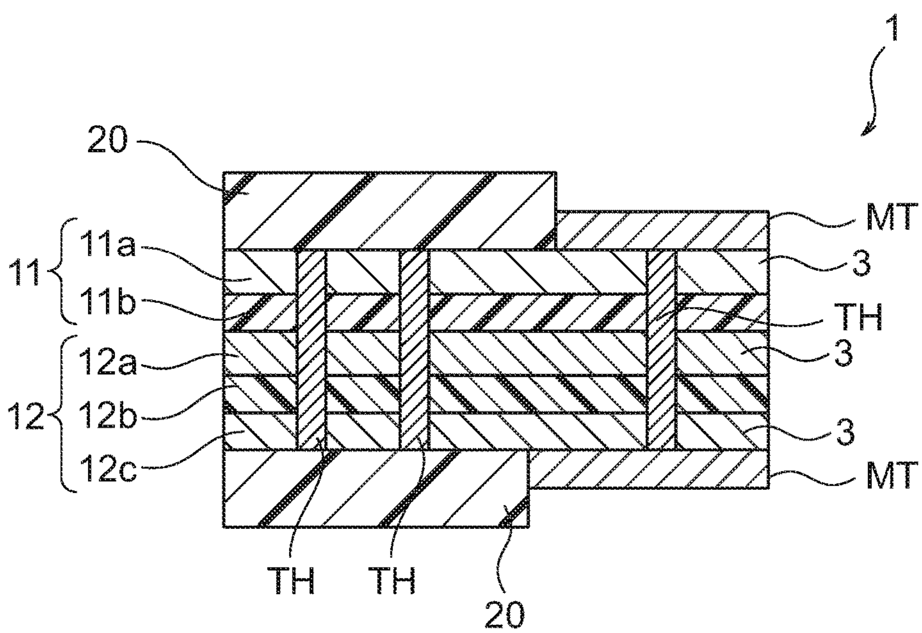
FIG. 5I is a cross-sectional view along the line 5I-5I of the printed wiring board illustrated in FIG. 5A.

FIG. 5I is a cross-sectional view along the line 5I-5I of the printed wiring board illustrated in FIG. 5A, that is, a cross-sectional view that includes the ground layers 3. No grooves 4 appear because pads 2 and wirings 5 are not present along the line 5I-5I. The ground layer 3 formed at the one main surface of the first substrate 11 is connected to the ground layers 3 formed on both main surfaces of the second substrate 12 with the vias TH. Each ground layer 3 is grounded to a ground contact which is not illustrated.

Figure 5J:
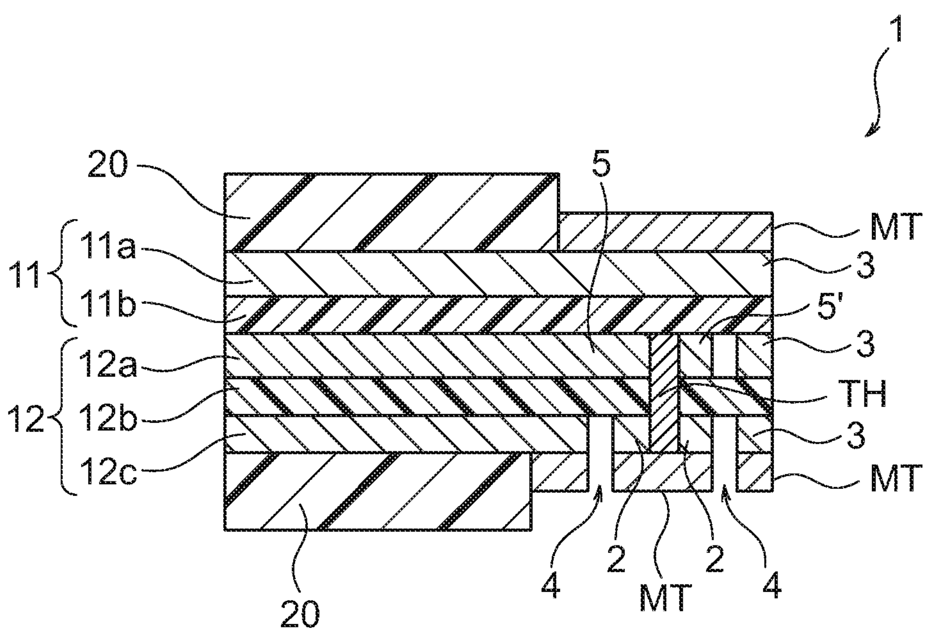
FIG. 5J is a cross-sectional view along the line 5J-5J of the printed wiring board illustrated in FIG. 5G.

FIG. 5J is a cross-sectional view along the line 5J-5J of the printed wiring board illustrated in FIG. 5G. That is, FIG. 53 is a cross-sectional view that includes a pad 2 and the ground layer 3 at the bottom surface side of the printed wiring board 1 in the figure and a wiring 5 and the ground layer 3 of the second substrate 12. As illustrated in FIG. 5J, the grooves 4 are formed between the pads 2 and the ground layer 3 at the bottom surface side. A surface-treated layer MT is formed at the top surface side of each of the pads 2 and ground layer 3 at the bottom surface side. The wirings 5 and their end parts 5' formed in the first substrate 11 are connected to the pads 2 of the second substrate 12 at the lower side with the vias TH. In the cross section illustrated in FIG. 5J, the second substrate 12 located as the uppermost layer in FIG. 5G is illustrated to be turned over so that the second substrate 12 is located as the lowermost layer in FIG. 5J. This is to match the up-and-down direction to those in FIG. 5H and FIG. 5I. The substrate referred to as the "second substrate 12" in the fifth example for descriptive purposes corresponds substantially to the "first substrate" of the present invention having the pads 2 and the ground layer 3.

A method of manufacturing the printed wiring board 1 of the above-described fifth example according to the present embodiment will now be described.

First, to produce the second substrate 12, a double-sided copper clad substrate is prepared in which the conductive layer 12*a* is formed on one main surface of an insulating substrate and the conductive layer 12*c* is formed on the other main surface. The double-sided copper clad substrate as in the third example and fourth example may be used.

As in the same scheme as that in the third example, a common photolithography technique is used to form wirings 5 in the conductive layer 12*a* which forms the one main surface (surface at the upper side in the figures). The conductive layer 12*a* does not remain within regions corresponding to the grooves between the wirings 5 and the ground layer 3. The wirings 5 and the ground layer 3 are in a state of being insulated.

Then, to produce the first substrate 11, a single-sided copper clad substrate is prepared which is formed with the conductive layer 11*a* on one main surface of an insulating substrate.

Subsequently, the first substrate 11 and the second substrate 12 are laminated on each other and a similar scheme to that in the third example is used to form vias TH that electrically connect between the one main surface of the first substrate 11 and the one main surface of the second substrate 12, vias TH that electrically connect between the one main surface of the first substrate 11 and the one main surface and the other main surface of the second substrate 12, and vias TH that electrically connect between the one main surface and the other main surface of the second substrate 12. As in the same scheme as that in the third example, a common photolithography technique is used to form desired pads 2 in the conductive layer 11*a* at the one main surface of the first substrate 11 and desired pads 2 in the conductive layer 12*c* at the other main surface of the second substrate 12. The conductive layer 11*a* does not remain within regions corresponding to the grooves 4 between the pads 2 and the ground layer 3. The pads 2 and the ground layer 3 are in a state of being insulated.

A coverlay 20 is attached to the uppermost surface at the one main surface side of the first substrate 11 so as to expose the pads 2. Similarly, another coverlay 20 is attached to the other main surface side of the second substrate 12 to expose the pads 2. Appropriate adhesives are used to attach the coverlays 20. Curing treatment is performed as necessary.

Surface treatment, such as gold plating, is performed for the surfaces of the pads 2 and ground layers 3 of the first substrate 11 and second substrate 12 to form the surface-treated layers MT. A metal die is preliminarily prepared and used to punch out the printed wiring board 1 into a shape having the engageable parts 70 and tab-like members 80. This allows the printed wiring board 1 of the fifth example according to the present embodiment to be obtained.

Next, with reference to FIG. 6A to FIG. 6I, the printed wiring board 1 of the sixth example will be described.

The sixth example is an example of the printed wiring board 1 which includes three conductive layers. The sixth example is in common with the second example in that wirings 5 are pairs of differential signal line. The printed wiring board 1 of the sixth example includes a conductive layer 11*a*, conductive layer 12*a* and conductive layer 12*c* and is of a type of connection with a connector using both surfaces of the top and back surfaces (double-sided connection type). Description of matters in common with those of the first to fifth examples is borrowed herein to avoid redundant description.

Figure 6A:
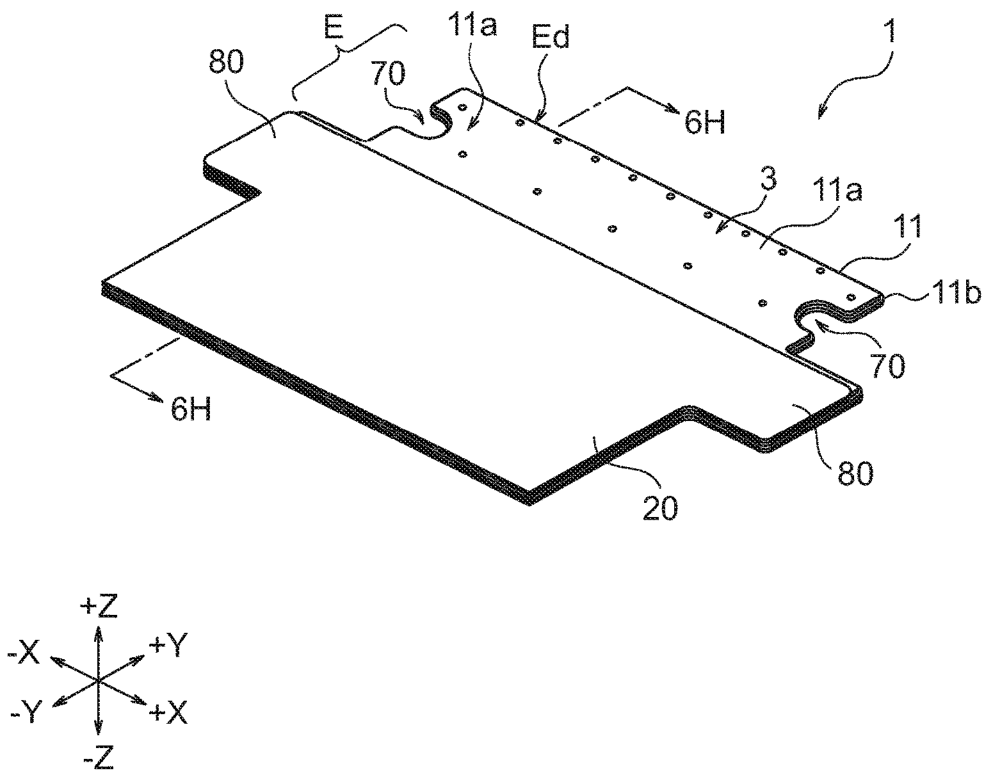
FIG. 6A is a top perspective view illustrating a connection portion of a printed wiring board of a sixth example according to an embodiment of the present invention.

FIG. 6A is a top perspective view of a connection portion that includes the connection end portion E of the printed wiring board 1 of the sixth example according to the present embodiment. The printed wiring board 1 illustrated in FIG. 6A includes at least a coverlay 20, first substrate 11, and one second substrate 12. As in the first example, the printed wiring board 1 of this example further includes one or more engageable parts 70 and one or more tab-like members 80.

Figure 6B:
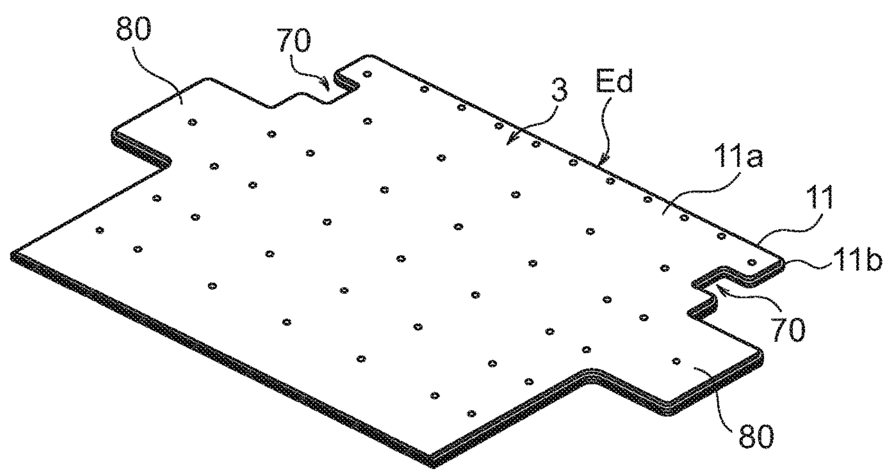
FIG. 6B is a top perspective view of another substrate in which a coverlay of the printed wiring board illustrated in FIG. 6A is removed.

As illustrated in FIG. 6A, the coverlay 20 is laminated as each of the uppermost layer and lowermost layer of the printed wiring board 1. The first substrate 11 is disposed as a lower layer on the coverlay 20 as the uppermost layer. FIG. 6B is a top perspective view of the first substrate 11 in which the coverlay 20 of the printed wiring board illustrated in FIG. 6A is removed. As illustrated in FIG. 6A and FIG. 6B, pads 2 and wirings 5 are not provided in the conductive layer 11*a* which is formed at one main surface of an insulating substrate 11*b*. The conductive layer 11*a* functions as a ground layer 3.

Figure 6C:
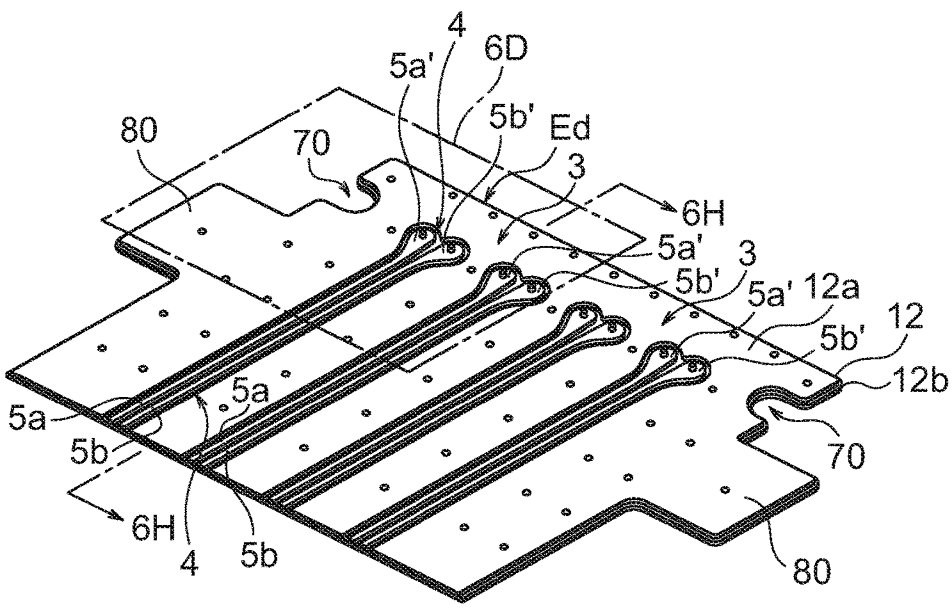
FIG. 6C is a top perspective view of a second substrate of the printed wiring board illustrated in FIG. 6A.
Figure 6D:
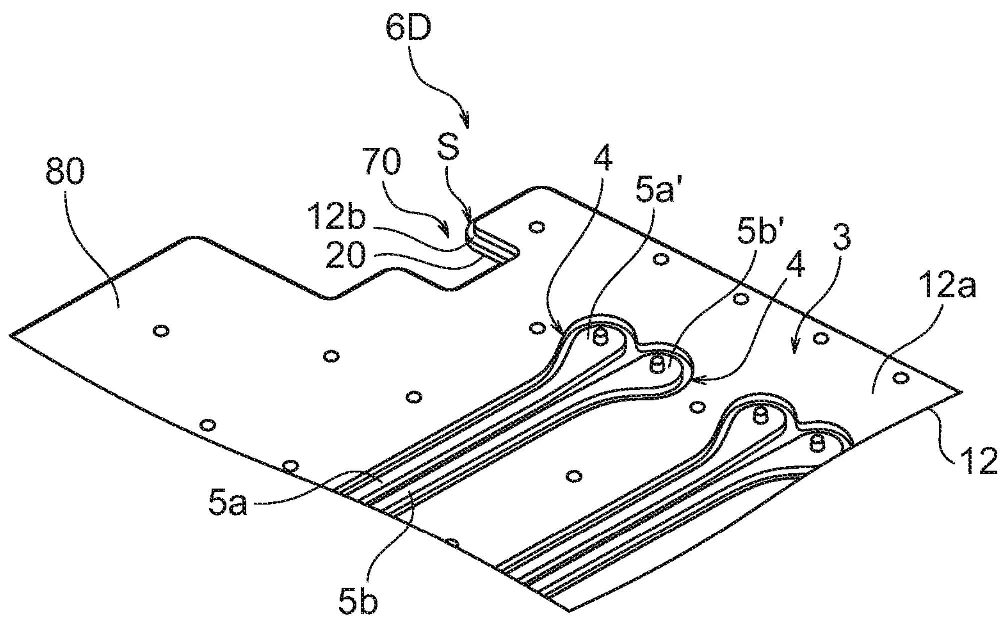
FIG. 6D is a partially enlarged view of the region 6D illustrated in FIG. 6C.

FIG. 6C is a top perspective view at the one main surface side of the second substrate 12 which is laminated at the other main surface side of the first substrate 11. FIG. 6D is a partially enlarged view of the region 6D illustrated in FIG. 6C. The printed wiring board 1 of the sixth example has a second substrate 12 that is directly laminated on any one of main surfaces of the first substrate 11. The second substrate 12 has wirings 5*a*, 5*b* and a ground layer 3. The wirings 5*a* and 5*b* are electrically connected to the pads 2*a* and 2*b* with vias TH that penetrate through one or more substrates 10. The ground layer 3 has its inner edges at locations separated from outer edges of the wirings 5*a* and 5*b* with a predetermined distance and is to be connected to a ground contact.

As illustrated in FIG. 6C and FIG. 6D, the wirings 5*a* and 5*b* are disposed in parallel along the width direction of the printed wiring board 1 at the one main surface of the second substrate 12. End parts 5*a*' and 5*b*' of the wirings 5*a* and 5*b* are electrically connected to the pads 2*a* and 2*b* at the other main surface of the second substrate 12 with vias that penetrate through the second substrate 12.

Figure 6E:
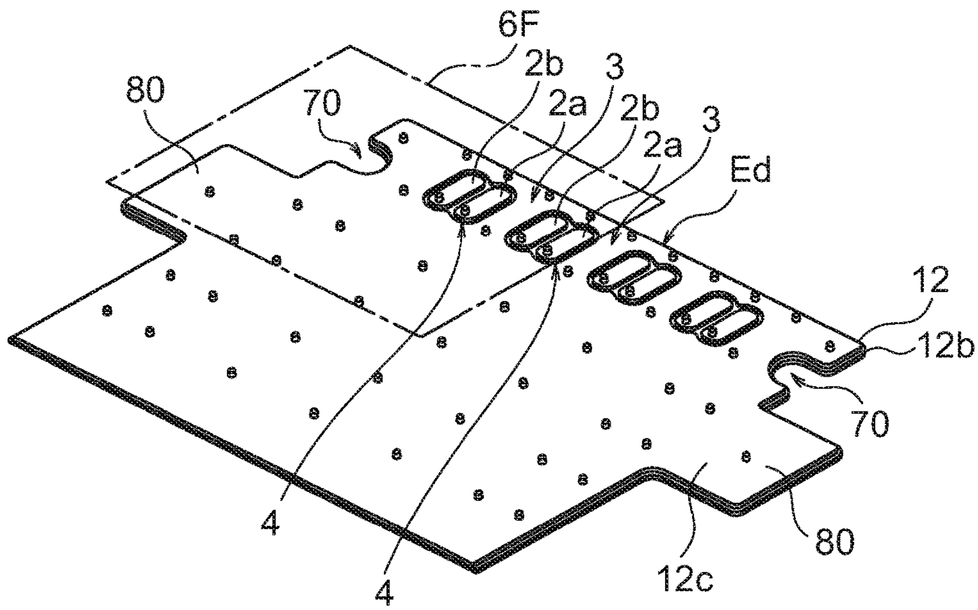
FIG. 6E is a bottom perspective view of a first substrate of the printed wiring board illustrated in FIG. 6A.
Figure 6F:
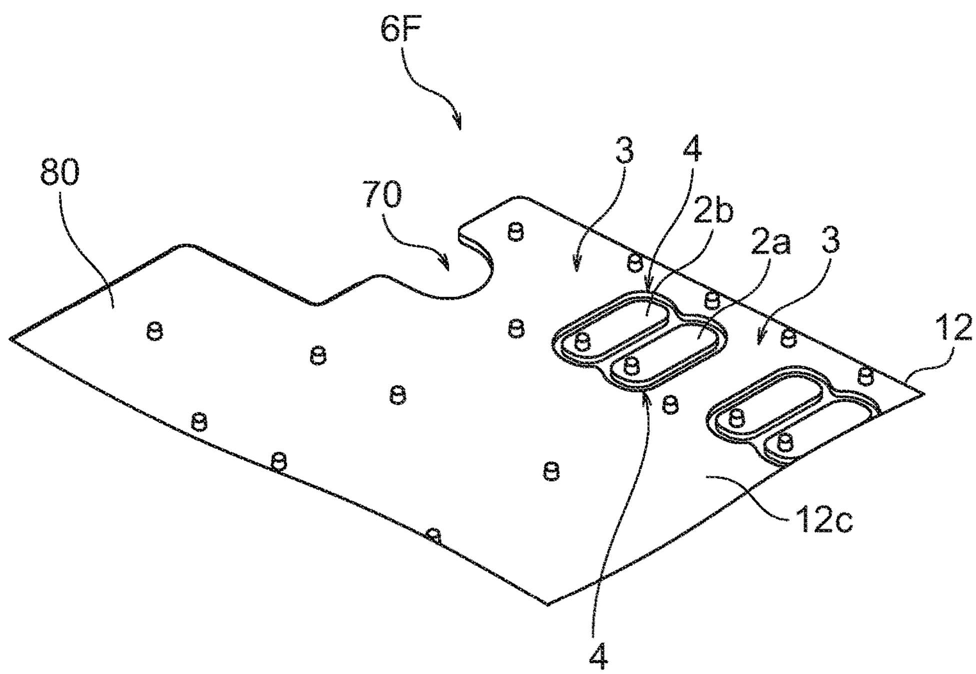
FIG. 6F is a partially enlarged view of the region 6F illustrated in FIG. 6E.

FIG. 6E is a bottom perspective view of the other main surface side of the second substrate 12 and FIG. 6F is a partially enlarged view of the region 6F illustrated in FIG. 6F. The pads 2*a*, 2*b* and ground layer 3 are formed at the other main surface side of the second substrate 12. The conductive layer 12*c* of the second substrate 12 illustrated in the figure is disposed at the lower surface side of the printed wiring board 1. Accordingly, locations of the pads 2*b* of the conductive layer 12*c* at the other main surface of the second substrate 12 illustrated in FIG. 6E correspond to locations of the end parts 5*b*' of the wirings 5*b* of the conductive layer 12*a* at the one main surface side of the second substrate 12, which is the opposite side to the other main surface side. As in the first substrate 11 of the second example, grooves 4 having a width of a predetermined distance are formed between the pads 2*a*, 2*b* and the ground layer 3.

Figure 6G:
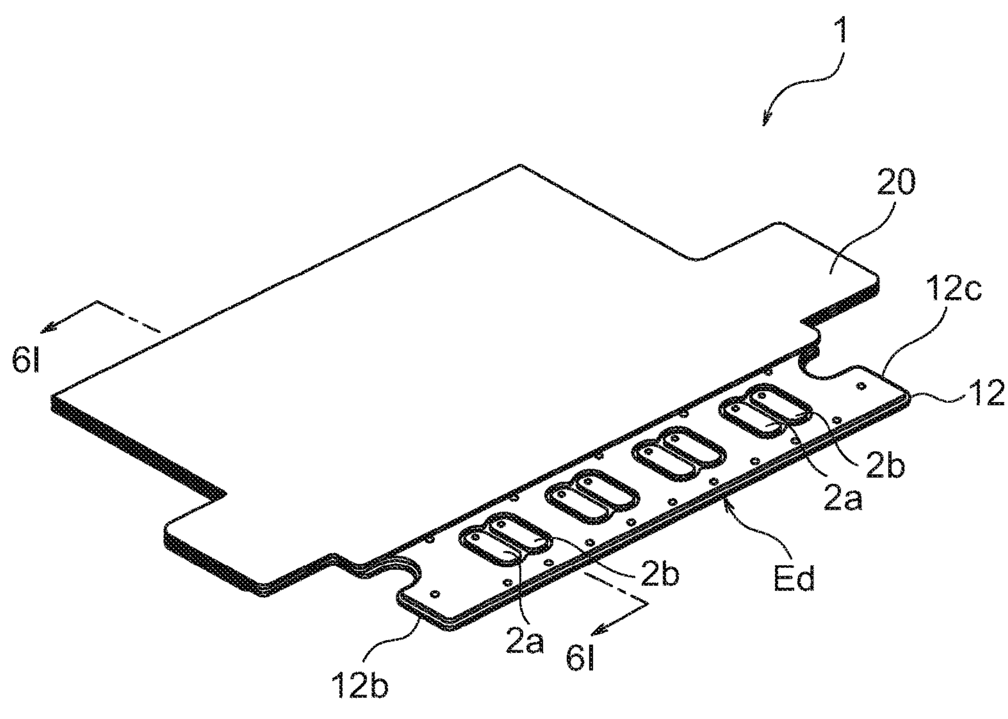
FIG. 6G is a bottom perspective view of the printed wiring board illustrated in FIG. 6A.

FIG. 6G is a bottom perspective view of the printed wiring board 1 illustrated in FIG. 6A. The conductive layer 12*c* at the other main surface side of the second substrate 12, which constitutes the bottom surface, is covered by a coverlay 20 except the region within which the pads 2*a* and 2*b* are formed. As illustrated in FIG. 6G, the pads 2*a* and 2*b* formed at the other main surface of the second substrate 12 are exposed at the bottom surface side of the printed wiring board 1 thereby to enable electrical contact with a connector also at the bottom surface side of the printed wiring board 1. In the printed wiring board 1 according to the sixth example, the ground layer 3 at the uppermost surface is to be connected to a ground contact while the pads 2*a* and 2*b* at the lowermost surface are to be connected to a connector.

Figure 6H:
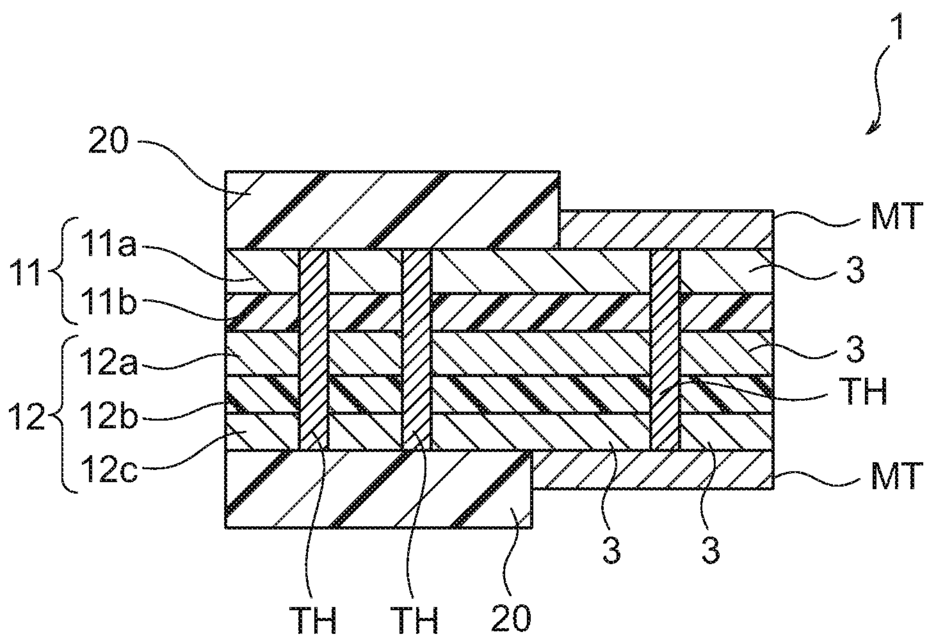
FIG. 6H is a cross-sectional view along the line 6H-6H of the printed wiring board illustrated in FIG. 6A.

FIG. 6H is a cross-sectional view along the line 6H-6H of the printed wiring board illustrated in FIG. 6A. That is, FIG. 6H is a cross-sectional view that includes the ground layer 3 of the first substrate 11, the ground layer 3 formed at the one main surface of the second substrate 12, and the ground layer 3 formed at the other main surface of the second substrate 12. No grooves 4 appear because pads 2*a*, 2*b* and wirings' end parts 5*a*', 5*b*' are not present along the line 6H-6H. The ground layer 3 formed at the one main surface of the first substrate 11 is connected to the ground layer 3 formed at the one main surface of the second substrate 12 and the ground layer 3 formed at the other main surface of the second substrate 12 with the vias TH. Each ground layer 3 is grounded to a ground contact which is not illustrated.

Figure 6I:
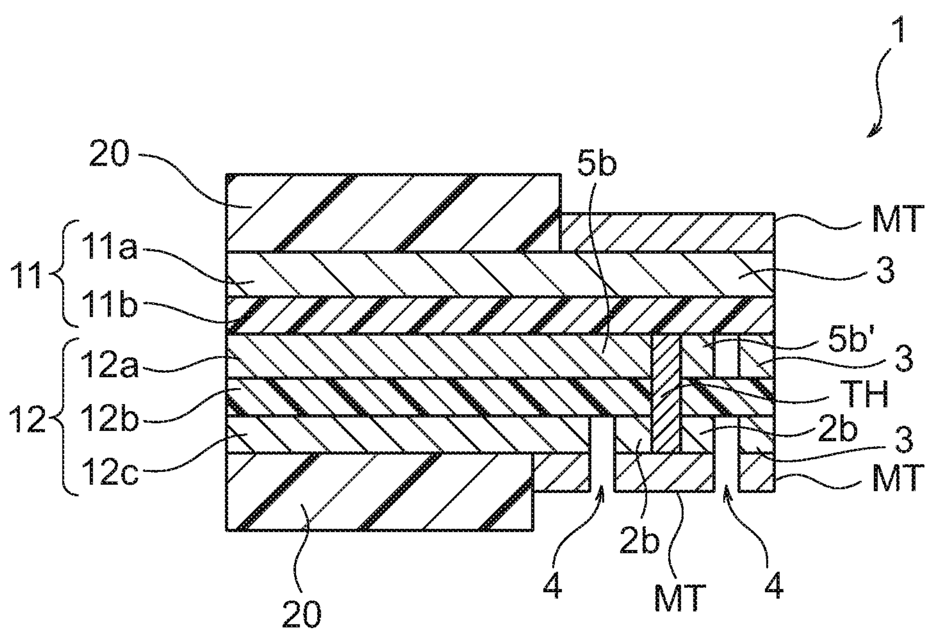
FIG. 6I is a cross-sectional view along the line 6I-6I of the printed wiring board illustrated in FIG. 6G.

FIG. 6I is a cross-sectional view along the line 6I-6I of the printed wiring board illustrated in FIG. 6G, that is, a cross-sectional view that includes a pad 2*b* and the ground layer 3. As illustrated in FIG. 6I, the grooves 4 are formed between the pads 2*b* and the ground layer 3. As in the first example, a surface-treated layer MT is formed at the upper surface side of each of the pads 2*b* and ground layer 3. The wirings 5*b* and their end parts 5*b*' formed in the conductive layer 12*a* of the second substrate 12 are connected to the pads 2*b* formed in the conductive layer 12*c* at the other main surface side of the second substrate 12 with the vias TH. In the cross section illustrated in FIG. 6I, the second substrate 12 located as the uppermost layer in FIG. 6G is illustrated to be turned over so that the second substrate 12 is located as the lowermost layer in FIG. 6I. This is to match the up-and-down direction with that in FIG. 6H. The second substrate 12 having the pads 2*a*, 2*b* and ground layer 3 in the sixth example is a substrate that corresponds to the "first substrate" of the present invention.

In the sixth example, an example is described in which a contact point or contact points of the ground layer 3 is disposed at the uppermost surface of the printed wiring board 1 and the pads 2*a* and 2*b* are disposed at the lowermost surface, but the printed wiring board 1 may be used such that the up-and-down direction is turned over to dispose the pads 2*a* and 2*b* at the uppermost layer and dispose a contact point or contact points of the ground layer 3 at the lowermost surface.

A method of manufacturing the printed wiring board 1 of the above-described sixth example according to the present embodiment will now be described. First, to produce the second substrate 12, a double-sided copper clad substrate is prepared in which the conductive layer 12*a* is formed on one main surface of an insulating substrate and the conductive layer 12*c* is formed on the other main surface.

As in the same scheme as that in the third example, a common photolithography technique is used to form wirings 5*a* and 5*b* in the conductive layer 12*a* which forms the one main surface (surface at the upper side in the figures) of the double-sided copper clad substrate. The conductive layer 12*a* does not remain within regions corresponding to the grooves between the wirings 5*a*, 5*b* and the ground layer 3. The wirings 5*a*, 5*b* and the ground layer 3 are in a state of being insulated.

Then, to produce the first substrate 11, a single-sided copper clad substrate is prepared which is formed with the conductive layer 11*a* on one main surface of an insulating substrate. The conductive layer 11*a* functions as a ground layer 3.

Subsequently, the first substrate 11 and the second substrate 12 are laminated on each other and a similar scheme to that in the third example is used to form vias TH that electrically connect between the one main surface of the first substrate 11 and the one main surface and the other main surface of the second substrate 12 and vias TH that electrically connect between the one main surface and the other main surface of the second substrate 12. As in the same scheme as that in the third example, a common photolithography technique is used to form desired pads 2*a* and 2*b* in the conductive layer 12*c* at the other main surface of the second substrate 12. The conductive layer 11*a* does not remain within regions corresponding to the grooves 4 between the pads 2*a*, 2*b* and the ground layer 3. The pads 2*a*, 2*b* and the ground layer 3 are in a state of being insulated.

A coverlay 20 is attached to a region except the connection end portion E on the uppermost surface at the one main surface side of the first substrate 11. Similarly, another coverlay 20 is attached to the other main surface side of the second substrate 12 to expose the pads 2*a* and 2*b*. Appropriate adhesives are used to attach the coverlays 20. Curing treatment is performed as necessary.

Surface treatment, such as gold plating, is performed for the surfaces of the pads 2*a* and 2*b* of the second substrate 12 and the exposed portion of the first substrate 11 to form the surface-treated layers MT. A metal die is preliminarily prepared and used to punch out the printed wiring board 1 into a shape having the engageable parts 70 and tab-like members 80. This allows the printed wiring board 1 of the sixth example according to the present embodiment to be obtained.

Next, with reference to FIG. 7A to FIG. 7H, the printed wiring board 1 of the seventh example will be described.

The printed wiring board 1 of the seventh example is not to be connected to a connector using a conductive layer 12*a* located at the uppermost layer among the conductive layers, but to be connected to a connector using a conductive layer 11*a* that is the second layer located below the conductive layer 12*a*. The printed wiring board 1 of the seventh example includes three conductive layers: the conductive layer 11*a*; conductive layer 11*c*; and conductive layer 12*a*, and is of a type of connection with a connector using at one side. The seventh example is in common with the first example and fifth example in that the wirings 5 have wiring patterns of signal lines that transmit single-ended signals. Description of matters in common with those of the first to sixth examples is borrowed herein to avoid redundant description.

Figure 7A:
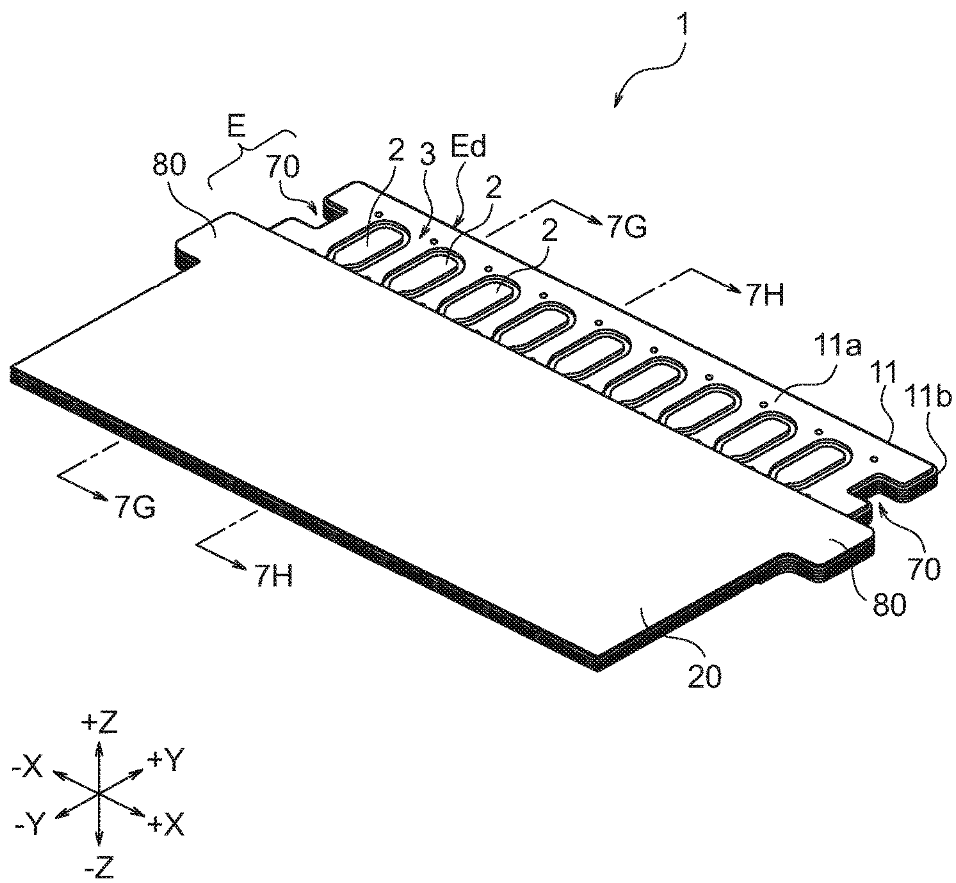
FIG. 7A is a top perspective view illustrating a connection portion of a printed wiring board of a seventh example according to an embodiment of the present invention.
Figure 7B:
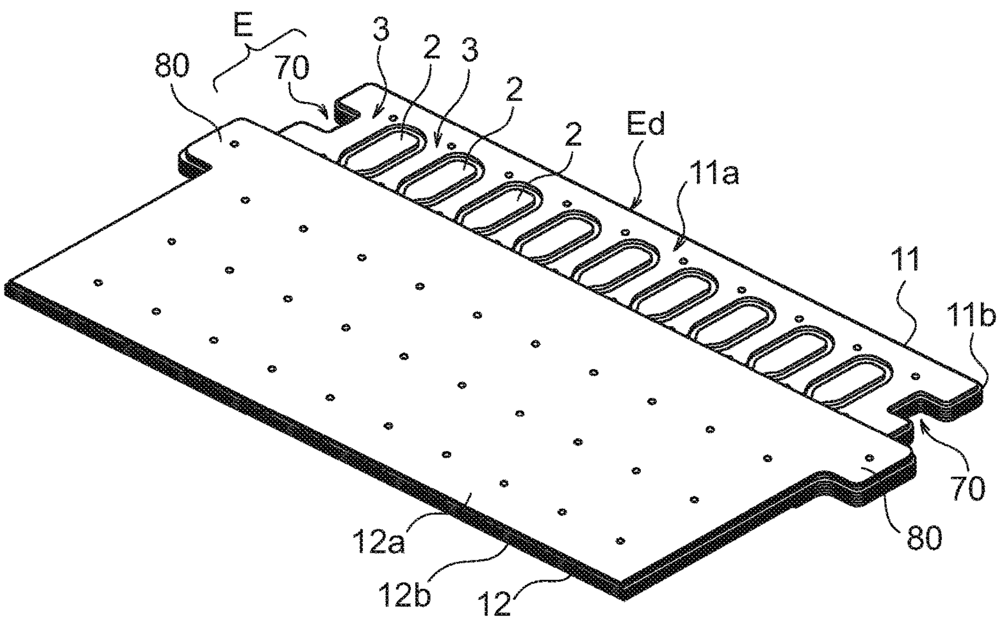
FIG. 7B is a top perspective view of another substrate in which a coverlay of the printed wiring board illustrated in FIG. 7A is removed.

FIG. 7A is a top perspective view of a connection portion that includes the connection end portion E of the printed wiring board 1 of the seventh example according to the present embodiment. FIG. 7B is a top perspective view illustrating a state in which the coverlay 20 of the printed wiring board illustrated in FIG. 7A is removed. The printed wiring board 1 illustrated in FIG. 7A and FIG. 7B includes at least a coverlay 20, first substrate 11, and second substrate 12. As illustrated in FIG. 7A, the coverlay 20 is attached as the uppermost layer of the printed wiring board 1. The second substrate 12 is disposed below the coverlay 20 as the uppermost layer and the first substrate 11 is disposed below the second substrate 12. As in the first example, the printed wiring board 1 of this example further includes one or more engageable parts 70 and one or more tab-like members 80.

As illustrated in FIG. 7B, the conductive layer 12*a* and insulating substrate 12*b* of the second substrate 12 are removed to expose pads 2. The pads 2 formed in the conductive layer 11*a* of the first substrate 11 according to this example are to be connected to a connector. The conductive layer 12*a* of the second substrate 12 is to be connected to a ground contact.

Figure 7C:
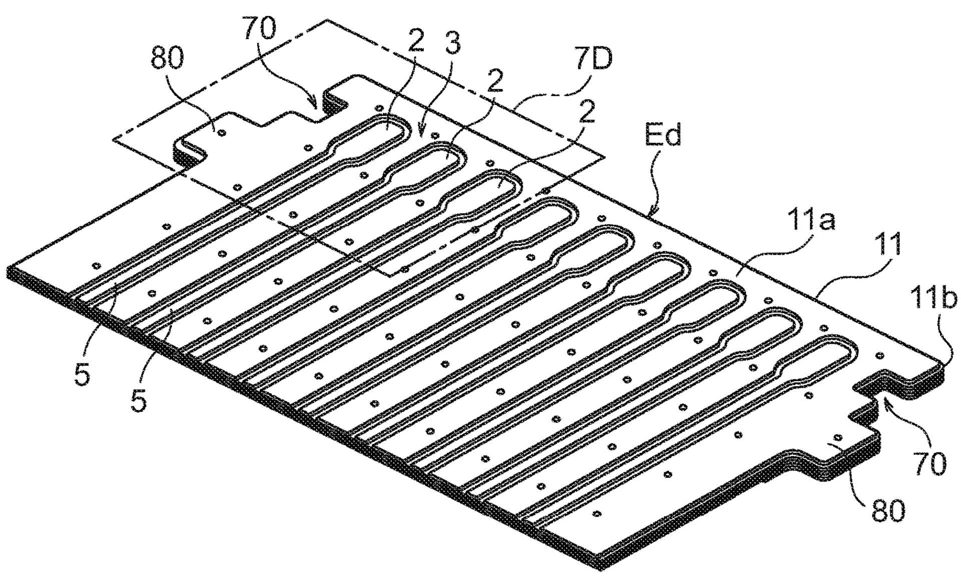
FIG. 7C is a top perspective view of a first substrate of the printed wiring board illustrated in FIG. 7A.
Figure 7D:
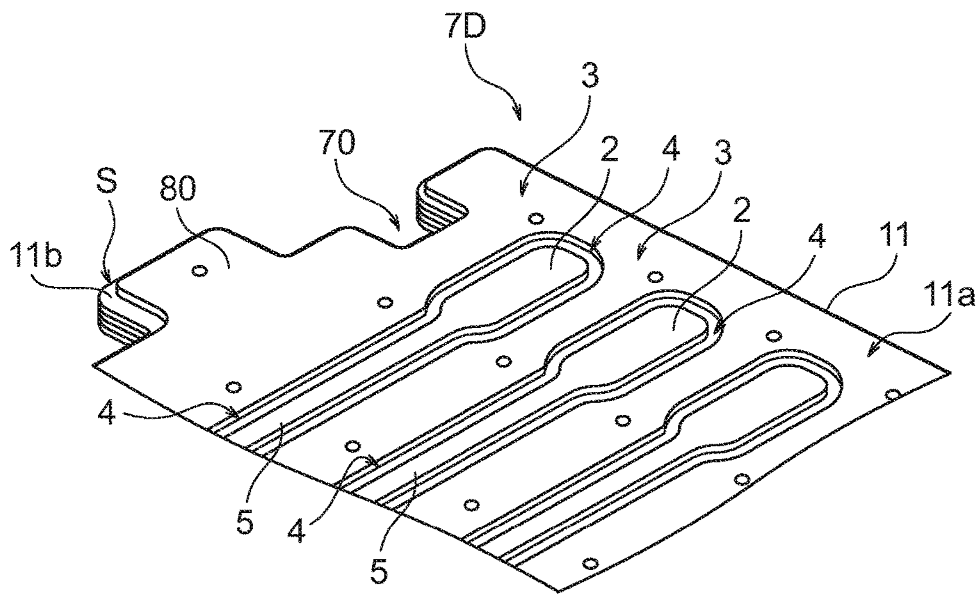
FIG. 7D is a partially enlarged view of the region 7D illustrated in FIG. 7C.

FIG. 7C is a top perspective view of the one main surface of the first substrate 11. The conductive layer 11*a* formed on one main surface of the insulating substrate 11*b* is provided with the pads 2 and wirings 5. FIG. 7D is a partially enlarged view of the region 7D illustrated in FIG. 7C. The pads 2 and a ground layer 3 are formed at the one main surface side of the first substrate 11. As in the first example and fifth example, grooves 4 having a width in accordance with a predetermined distance are formed between the pads 2 and the ground layer 3.

Figure 7E:
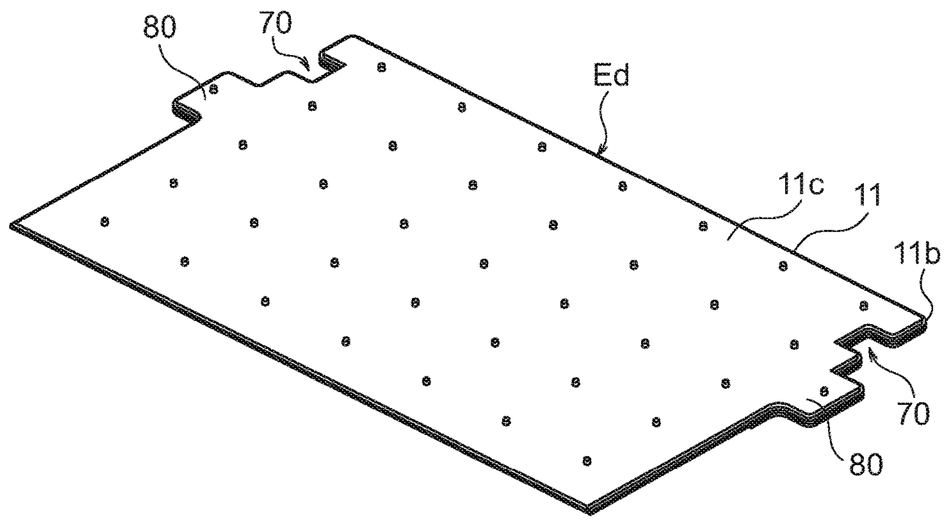
FIG. 7E is a top perspective view of another substrate of the printed wiring board illustrated in FIG. 7A.

FIG. 7E is a top perspective view of the conductive layer 11*c* formed at the other main surface side of the first substrate 11. The conductive layer 11*c* has a shield function and is to be connected to a ground contact.

Figure 7F:
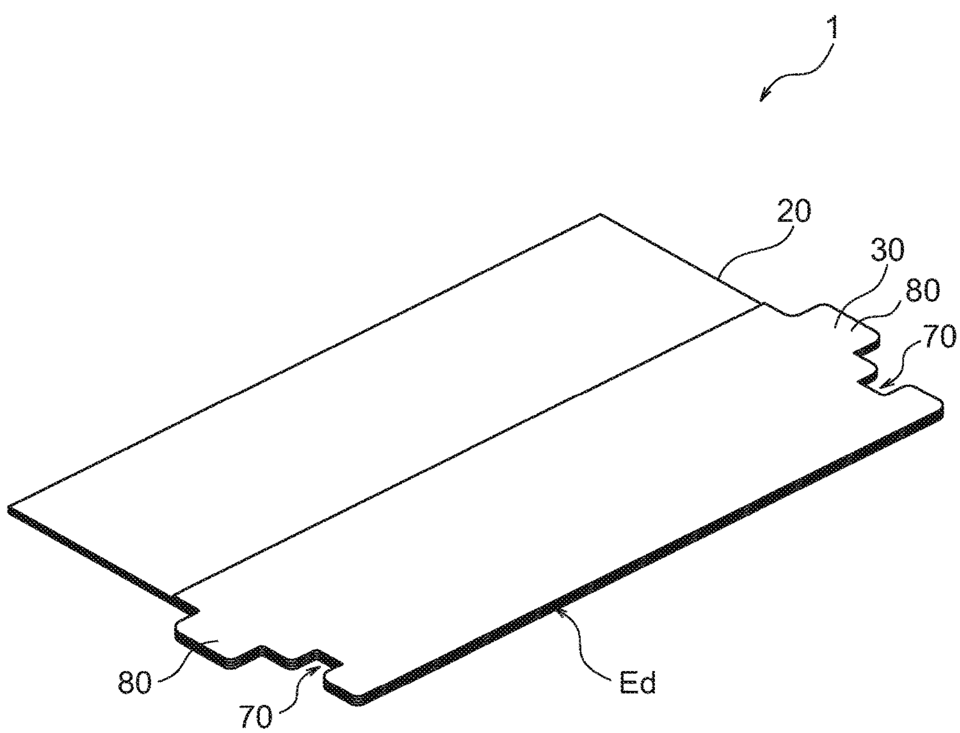
FIG. 7F is a bottom perspective view of the printed wiring board illustrated in FIG. 7A.

FIG. 7F is a bottom perspective view of the printed wiring board 1 illustrated in FIG. 7A. The coverlay 20 covers the whole surface of the conductive layer 11*c* at the other main surface side of the first substrate 11 which constitutes the bottom surface of the printed wiring board 1. A reinforcement layer 30 is formed within a region above which the pads 2 are formed.

Figure 7G:
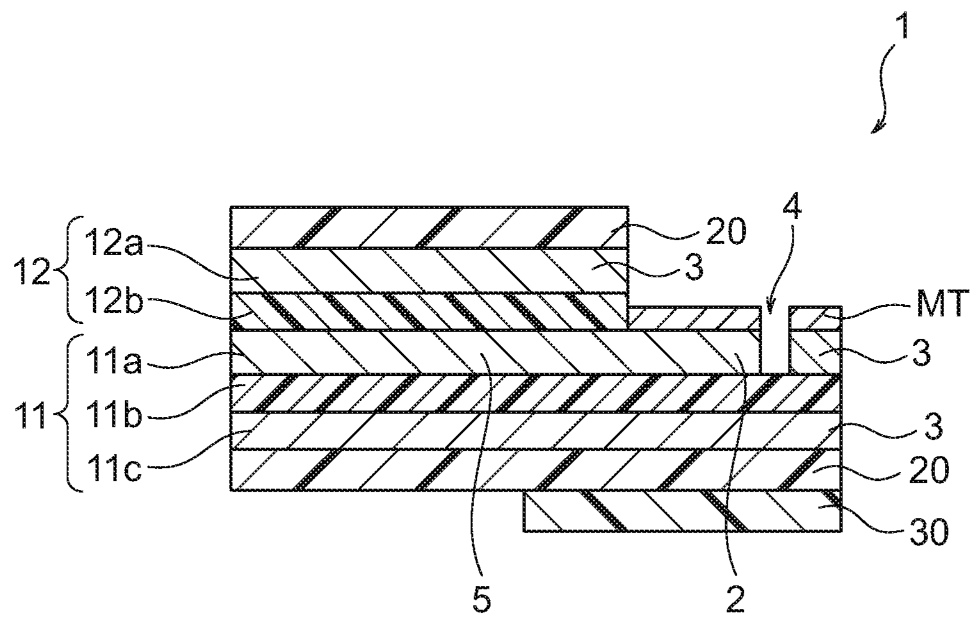
FIG. 7G is a cross-sectional view along the line 7G-7G of the printed wiring board illustrated in FIG. 7A.

FIG. 7G is a cross-sectional view along the line 7G-7G of the printed wiring board illustrated in FIG. 7A. That is, FIG. 7G is a cross-sectional view that includes the ground layer 3 formed at the one main surface of the second substrate 12, a pad 2 and wiring 5 formed at the one main surface of the first substrate 11, and the ground layer 3 formed at the other main surface of the first substrate 11. The pad 2, the wiring 5 and ground layers 3 appear along the line 7G-7G. The grooves 4 are present between the ground layer 3 and the pads 2. Surface-treated layers MT are formed on the pads 2 of the first substrate 11. The pads 2 are to be connected to a connector with the surface-treated layers MT.

Figure 7H:
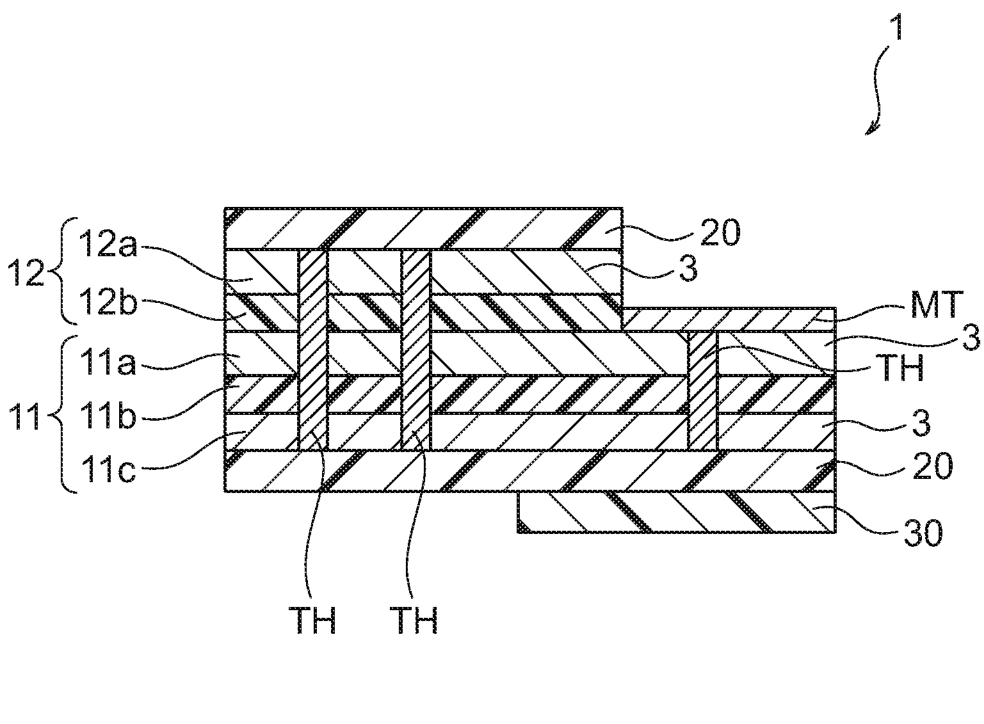
FIG. 7H is a cross-sectional view along the line 7H-7H of the printed wiring board illustrated in FIG. 7A.

FIG. 7H is a cross-sectional view along the line 7G-7G of the printed wiring board illustrated in FIG. 7A, that is, a cross-sectional view that includes the ground layer 3 of the conductive layer 11*a*. As illustrated in FIG. 7H, vias TH connect between the ground layer 3 at the one main surface side of the second substrate 12 and the ground layers 3 at both the one main surface and the other main surface of the first substrate 11, and these ground layers 3 are to be connected to a ground contact which is not illustrated.

In the seventh example, an example is described in which the wirings 5 formed in the first substrate 11 have wiring patterns of signal lines for single-ended signals, but the wirings 5 may be pairs of wirings 5*a* and 5*b* that function as differential signal lines.

A method of manufacturing the printed wiring board 1 of the above-described seventh example according to the present embodiment will now be described. First, to produce the first substrate 11, a double-sided copper clad substrate is prepared in which the conductive layers 11*a* and 11*c* are formed on both surfaces of an insulating substrate. A common photolithography technique is used to form the pads 2 and wirings 5 at the main surface (provided by the conductive layer 11*a* in this example), which will be in contact with the main surface of the second substrate 12, of the both main surfaces of the first substrate 11. The conductive layer 11*a* does not remain within regions corresponding to the grooves 4 between the pads 2 and the ground layer 3. The pads and the ground layer 3 are in a state of being insulated.

In parallel with this, to produce the second substrate 12, a single-sided copper clad substrate is prepared which is formed with the conductive layer 12*a* on one surface of an insulating substrate. In this example, the conductive layer 12*a* functions as the ground layer 3.

An adhesive layer is applied to the whole surface of the insulating substrate 12*b* of the second substrate 12 and then the adhesive layer within a predetermined region corresponding to locations to be formed with the pads 2 is removed. The scheme of removing the adhesive layer within the predetermined region is not limited and the adhesive layer may be punched out by a metal die or removed using laser. Thereafter the first substrate 11 and the second substrate 12 are laminated on each other. In this laminating step, a state can be obtained in which the adhesive layer does not exist between the first substrate 11 and the second substrate 12 within a region including the locations to be formed with the pads 2, because the adhesive layer has been removed from the predetermined region corresponding to the locations to be formed with the pads 2. After such an operation, the conductive layer 12*a* and insulating substrate 12*b* of the second substrate 12 can be removed from the predetermined region corresponding to the locations to be formed with the pads 2, thereby exposing the pads 2 formed in the conductive layer 11*a*.

After the lamination, a similar scheme to that in the third example is used to form the vias TH. Then, as in the same scheme as that in the third example, a common photolithography technique may be used to form wirings or the like in the conductive layer 12*a* of the second substrate 12 and/or in the conductive layer 11*c* of the first substrate 11, as necessary.

Finally, the conductive layer 12*a* and insulating substrate 12*b* of the second substrate 12 are removed from the predetermined region corresponding to the locations to be formed with the pads 2. The scheme of removing them is not limited and they may be punched out by a metal die or removed using laser.

A coverlay 20 is attached to the one main surface of the second substrate 12. The second substrate 12 and the coverlay 20 do not cover the connection end portion E. The pads 2 of the first substrate 11 below the second substrate 12 are exposed. Another coverlay 20 is attached to the other main surface of the first substrate 11. Further, a reinforcement layer 30 is attached to the region of the surface of the coverlay 20 which includes the connection end portion E at the other main surface of the first substrate 11. Appropriate adhesives are used to attach the coverlays 20 and the coverlays 20. Curing treatment for the adhesives is performed as necessary. Surface treatment, such as gold plating, is performed for the surfaces of the exposed portions of the conductive layer 11*a* including the pads 2 of the first substrate 11 to form the surface-treated layers MT. A metal die is preliminarily prepared and used to punch out the printed wiring board 1 into a shape having the engageable parts 70 and tab-like members 80. This allows the printed wiring board 1 of the seventh example according to the present embodiment to be obtained.

Next, with reference to FIG. 8A to FIG. 8H, the printed wiring board 1 of the eighth example will be described.

The printed wiring board 1 of the eighth example is in common with the seventh example in that the printed wiring board 1 is not to be connected to a connector using a conductive layer 12*a* located at the uppermost layer among the conductive layers, but to be connected to a connector using a conductive layer 11*a* that is the second layer located below the conductive layer 12*a*. The printed wiring board 1 of the eighth example is different from the seventh example in that a conductive layer 11*c* to provide the lowermost surface is also used to connection with the connector. In other words, the printed wiring board 1 of the eighth example is of a type of capable of double-sided connection with a connector using one main surface and the other main surface. In this regard, the eighth example is in common with the fifth example and sixth example.

The eighth example includes three conductive layers. The eighth example is in common with the fourth example and sixth example in that the wirings 5 are pairs of differential signal lines. Description of matters in common with those of the first to seventh examples is borrowed herein to avoid redundant description.

Figure 8A:
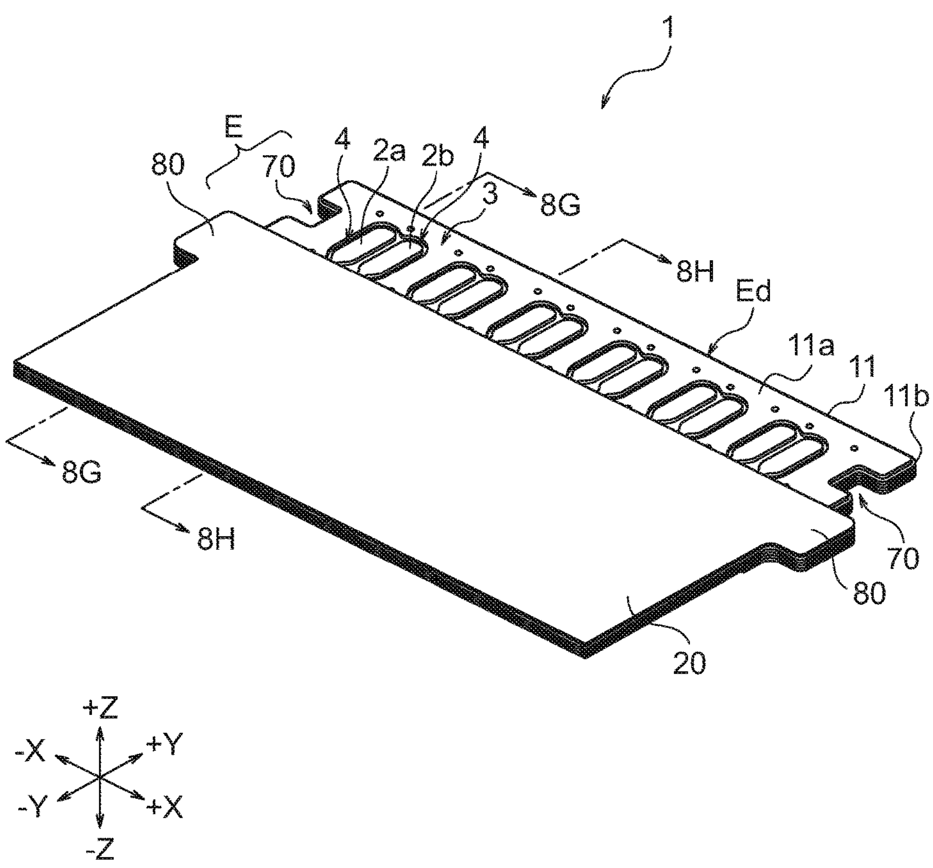
FIG. 8A is a top perspective view illustrating a connection portion of a printed wiring board of an eighth example according to an embodiment of the present invention.
Figure 8B:
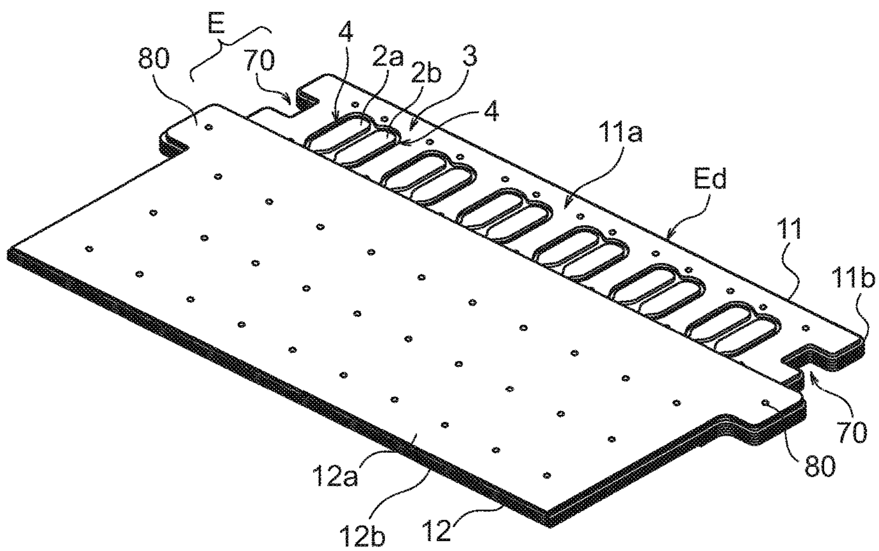
FIG. 8B is a top perspective view of another substrate in which a coverlay of the printed wiring board illustrated in FIG. 8A is removed.

FIG. 8A is a top perspective view of a connection portion that includes the connection end portion E of the printed wiring board 1 of the eighth example according to the present embodiment. FIG. 8B is a top perspective view illustrating a state in which the coverlay 20 of the printed wiring board illustrated in FIG. 8A is removed. The printed wiring board 1 illustrated in FIG. 8A and FIG. 8B includes at least a coverlay 20, first substrate 11, and second substrate 12. As illustrated in FIG. 8A, the coverlay 20 is attached as the uppermost layer of the printed wiring board 1. The second substrate 12 is disposed below the coverlay 20 as the uppermost layer and the first substrate 11 is disposed below the second substrate 12. As in the first example, the printed wiring board 1 of this example further includes one or more engageable parts 70 and one or more tab-like members 80.

As illustrated in FIG. 8A and FIG. 8B, the conductive layer 12*a* and insulating substrate 12*b* of the second substrate 12 are removed to expose pads 2*a* and 2*b*. The pads 2*a* and 2*b* formed in the conductive layer 11*a* of the first substrate 11 according to this example are to be connected to a connector. The conductive layer 12*a* of the second substrate 12 is to be connected to a ground contact.

Figure 8C:
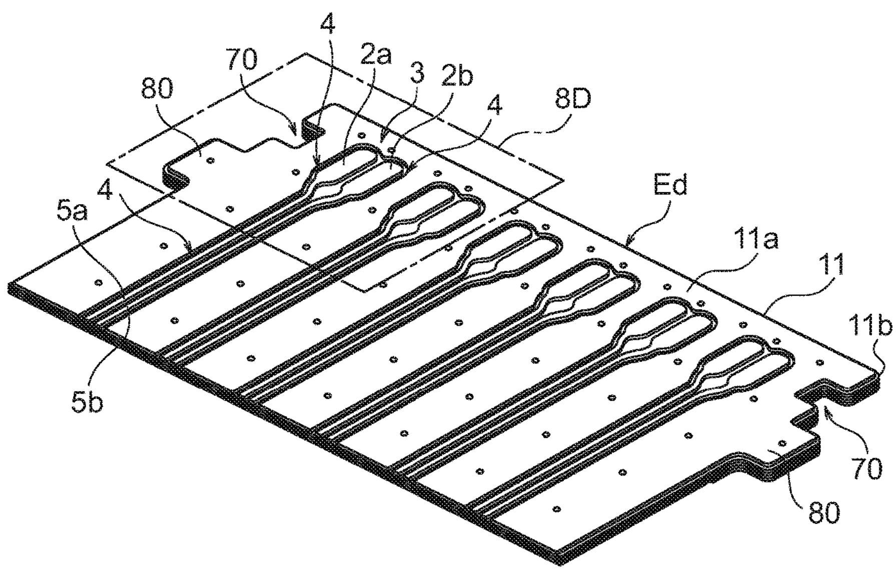
FIG. 8C is a top perspective view of a first substrate of the printed wiring board illustrated in FIG. 8A.
Figure 8D:
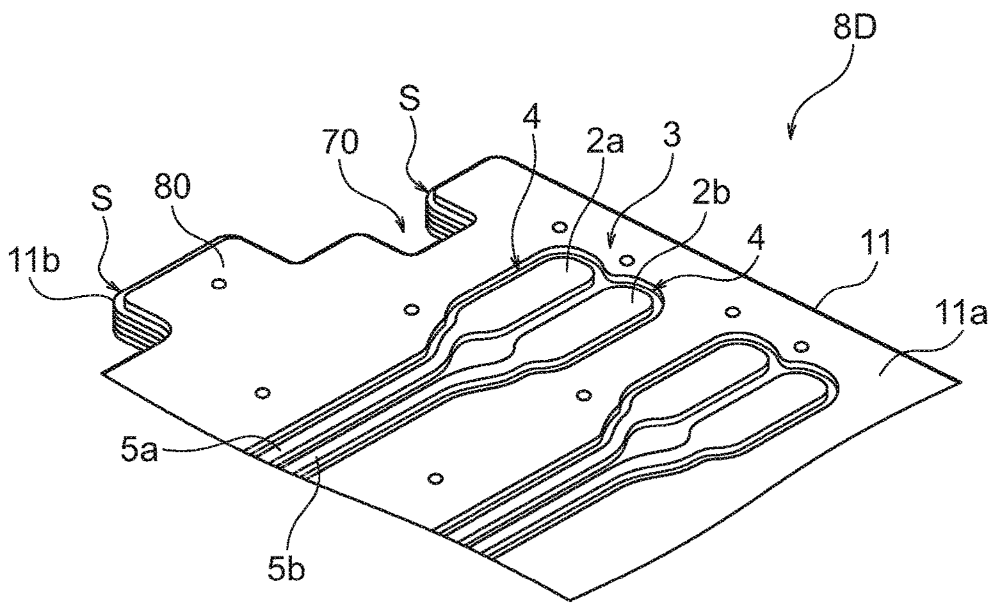
FIG. 8D is a partially enlarged view of the region 8D illustrated in FIG. 8C.

FIG. 8C is a top perspective view of the one main surface of the first substrate 11. The conductive layer 11*a* formed on one main surface of the insulating substrate 11*b* is provided with the pads 2*a*, 2*b* and wirings 5*a* and 5*b*. FIG. 8D is a partially enlarged view of the region 8D illustrated in FIG. 8C. The pads 2*a*, 2*b* and a ground layer 3 are formed at the one main surface side of the first substrate 11. As in the sixth example, grooves 4 having a width in accordance with a predetermined distance are formed between the pads 2*a*, 2*b* and the ground layer 3.

Figure 8E:
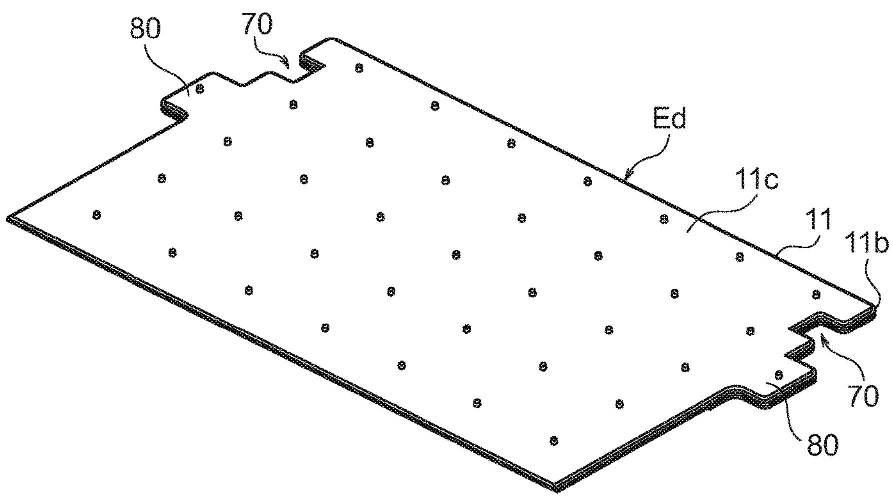
FIG. 8E is a bottom perspective view of another substrate of the printed wiring board illustrated in FIG. 8A.

FIG. 8E is a bottom perspective view of the conductive layer 11*c* formed at the other main surface side of the first substrate 11. The conductive layer 11*c* has a shield function and is to be connected to a ground contact.

Figure 8F:
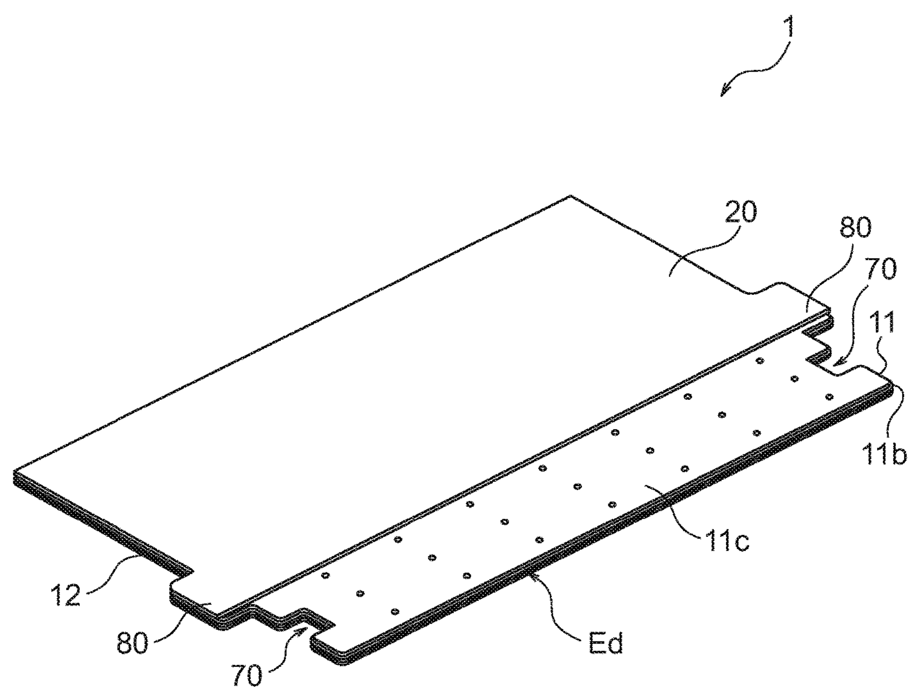
FIG. 8F is a bottom perspective view of the printed wiring board illustrated in FIG. 8A.

FIG. 8F is a bottom perspective view of the printed wiring board 1 illustrated in FIG. 8A. The coverlay 20 covers a region other than the region of the connection end portion E, within which the pads 2*a* and 2*b* are formed, of the conductive layer 11*c* at the other main surface side of the first substrate 11 which constitutes the bottom surface of the printed wiring board 1. The conductive layer 11*c* is exposed at a portion corresponding to the region including the connection end portion E within which the pads 2*a* and 2*b* are formed.

Figure 8G:
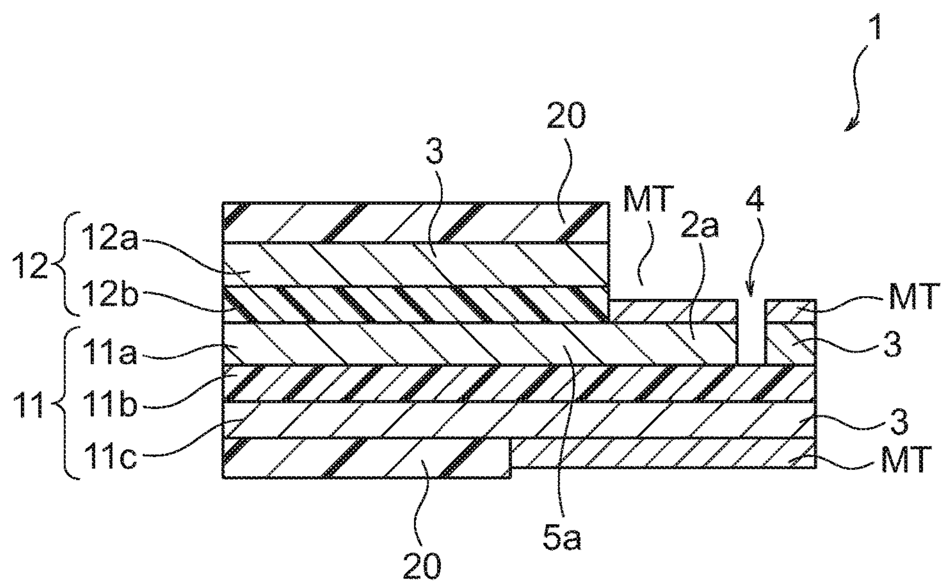
FIG. 8G is a cross-sectional view along the line 8G-8G of the printed wiring board illustrated in FIG. 8A.

FIG. 8G is a cross-sectional view along the line 8G-8G of the printed wiring board illustrated in FIG. 8A. That is, FIG. 8G is a cross-sectional view that includes the ground layer 3 formed at the one main surface of the second substrate 12, a pad 2*a* and wiring 5*a* formed at the one main surface of the first substrate 11, and the ground layer 3 formed at the other main surface of the first substrate 11. The pad 2*a*, wiring 5*a* and ground layers 3 appear along the line 8G-8G. The grooves 4 are present between the ground layer 3 and the pads 2*a*. Surface-treated layers MT are formed on the pads 2*a* of the first substrate 11. The pads 2*a* are to be connected to a connector with the surface-treated layers MT.

Figure 8H:
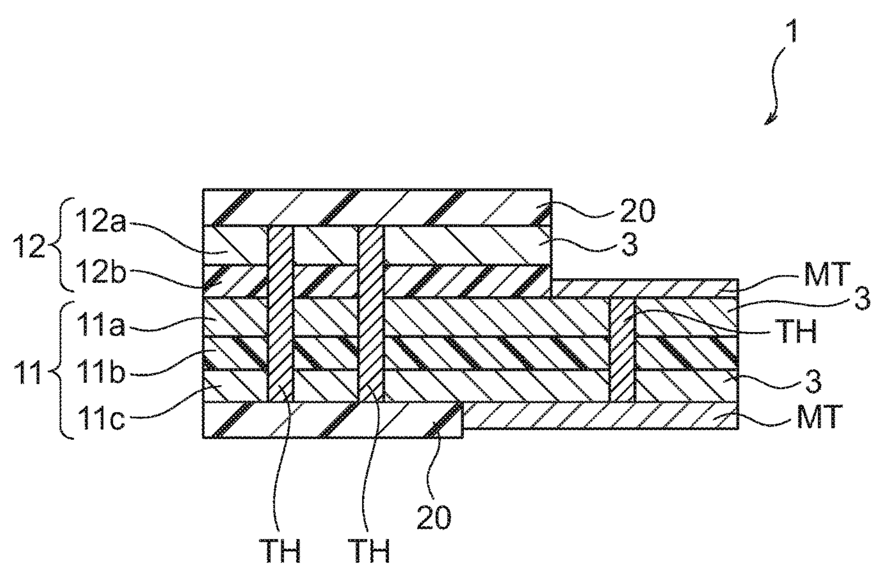
FIG. 8H is a cross-sectional view along the line 8H-8H of the printed wiring board illustrated in FIG. 5A.

FIG. 8H is a cross-sectional view along the line 8G-8G of the printed wiring board illustrated in FIG. 8A, that is, a cross-sectional view that includes the ground layer 3 of the conductive layer 11*a*. As illustrated in FIG. 8H, vias TH connect between the ground layer 3 at the one main surface side of the second substrate 12 and the ground layers 3 at both the one main surface and the other main surface of the first substrate 11, and these ground layers 3 are to be connected to a ground contact which is not illustrated.

In the eighth example, an example is described in which the wirings 5*a* and 5*b* formed in the first substrate 11 are pairs of differential signal lines, but the wirings 5 may have wiring patterns of signal lines for single-ended signals.

A method of manufacturing the printed wiring board 1 of the above-described eighth example according to the present embodiment will now be described. The scheme of producing the second substrate 12 and the scheme of producing the first substrate 11 are in common with those in the seventh example. As in the seventh example, the adhesive layer within a predetermined region corresponding to locations to be formed with the pads 2 (2*a*. 2*b*) is removed and the second substrate 12 and the first substrate 11 are attached to each other. After this lamination, a similar scheme to that in the third example is used to form the vias TH. Further, the conductive layer 12*a* and insulating substrate 12*b* of the second substrate 12 are removed from the predetermined region corresponding to the locations to be formed with the pads 2 (2*a*. 2*b*). A coverlay 20 is attached to the one main surface of the second substrate 12. The second substrate 12 and the coverlay 20 do not cover the connection end portion E. The pads 2 (2*a*. 2*b*) formed at the one main surface of the first substrate 11 are exposed. Common schemes with those in the seventh example are used for the above.

Another coverlay 20 is attached to the other main surface of the first substrate 11 except the region of the connection end portion E within which the pads 2*a* and 2*b* are formed. That is, the conductive layer 11*c* within the connection end portion E is exposed. Surface treatment, such as gold plating, is performed for the surfaces of the exposed portions of the conductive layer 11*a* including the pads 2*a* and 2*b* of the first substrate 11, and the surface of the exposed portion of the first substrate 11, to form the surface-treated layers MT. A metal die is preliminarily prepared and used to punch out the printed wiring board 1 into a shape having the engageable parts 70 and tab-like members 80. This allows the printed wiring board 1 of the eighth example according to the present embodiment to be obtained.

WORKING EXAMPLES

To confirm the effects of the present invention, tests regarding the antenna characteristics were performed. This will be described below.

In the present working examples, directional characteristics and radiation levels were studied with reference to those of an ideal nondirectional antenna. In the present working examples, a plurality of models was made for the printed wiring boards 1 of the present embodiment and the radiation levels were measured in the vicinity of the pads 2 to be connected to a connector, that is, within the connection end portion E. Similarly, a plurality of models was made for printed wiring boards to be comparative examples and the radiation levels were measured in the same manner in the vicinity of the pads 2 to be connected to a connector, that is, within the connection end portion E.

Conditions of measurement are listed in FIG. 10A and FIG. 10B.

FIG. 9A to FIG. 9D list the analyzed forms and the maximum values of antenna characteristics of Working Example 1 to Working Example 5 and Comparative Example 1 to Comparative Example 5 (including 5-1 and 5-2) according to respective models. In the columns listing the analyzed forms in FIG. 9A to FIG. 9D, columns (1) list those in a state in which the coverlay or coverlays 20 are formed, columns (2) in the figures list those in which the coverlay or coverlays are removed, and columns (3) in the figures list the shapes of the pads 2 and wirings 5 when the ground layer 3 is removed. The rightmost columns list the maximum values of antenna characteristics of Working Example 1 to Working Example 5 and Comparative Example 1 to Comparative Example 5.

Models of the printed wiring boards 1 used in the working examples and comparative examples to be described below were defined as follows. A copper clad substrate formed with copper foil on one main surface or copper foil layers on both surfaces of a polyimide firm of a thickness of 20 [μm] was used as each of substrates (substrates corresponding to the first substrate 11, second substrate 12 and third substrate or substrates of the present embodiment) constituting the printed wiring board 1. The arrangement of the pads 2*a* and 2*b* is as illustrated in the specified figure or figures in each description.

The pitch between the pads 2*a* and 2*b* according to each of the present working examples was 0.4 [mm]. The pitch of the pads 2*a*, 2*b* and ground layer or layers 3 was 0.4 [mm]. The width of the grooves 4 surrounding the pads 2*a* and 2*b* was 0.08 [mm]. Wirings according to the present working examples were composed of pairs of differential signal lines. The width of the wirings 5*a* and 5*b* (differential signal lines) was 0.1 [mm]. The pitch between a pair of the wirings (differential signal lines) was 0.18 [mm].

The pads 2*a*, 2*b*, wirings 5*a*, 5*b* and ground layer 3 were made of copper. The thickness of the pads 2*a*, 2*b*, wirings 5*a*, 5*b* and ground layer 3 was an approximately uniform thickness of 27 [μm] (copper foil: 12 [μm], copper plating: 15 [μm]). Gold plated layers as the surface-treated layers MT were formed on the pads 2*a*, 2*b* and a part of the ground layer 3, as necessary. Polyimide films of a thickness of 12.5 [μm] were used as the upper surface side coverlay 20 and lower surface side coverlay 20 of the printed wiring board. A polyimide film of a thickness of 12.5 [μm] was used as the reinforcement layer 30.

Working Example 1

Model 1 of the printed wiring board 1 of the above-described second example was defined as Working Example 1. Model 1 of the printed wiring board 1 of the second example has the structure illustrated in FIG. 2A to FIG. 2F. For comparison with Working Example 1, Model 1-2 of a printed wiring board according to Comparative Example 1 was defined. Model 1-2 of Comparative Example 1 was defined under the same conditions as those for Model 1 of Working Example 1 except that the grooves 4 surrounding the pads 2*a* and 2*b* were not provided.

Figure 9A:
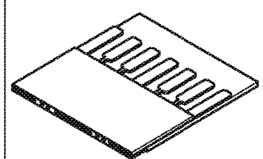
FIG. 9A is a diagram illustrating antenna characteristics of Working Example 1 and Working Example 2 according to an embodiment.
Figure 9A:
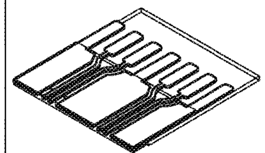
Figure 9A:
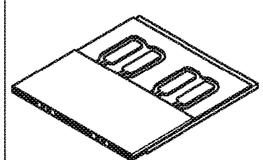
Figure 9A:
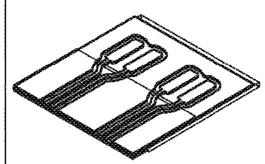
Figure 9A:
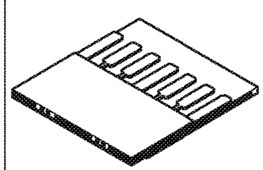
Figure 9A:
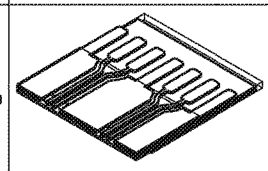
Figure 9A:
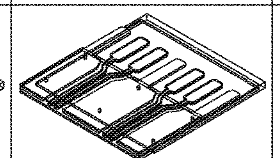
Figure 9A:
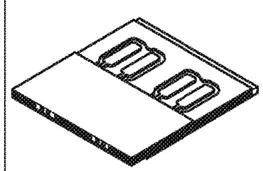
Figure 9A:
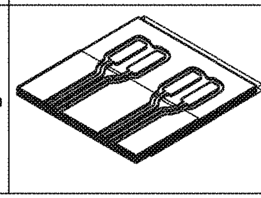
Figure 9A:
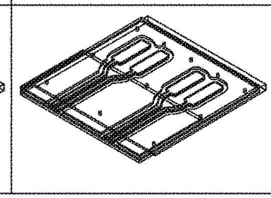

As illustrated in FIG. 9A, the ground layer 3 is formed around the pads 2*a* and 2*b* of Model 1 of the printed wiring board 1 according to Working Example 1 and the grooves 4 are formed between the pads 2*a*, 2*b* and the ground layer 3. On the other hand, Model 1-2 of a printed wiring board according to Comparative Example 1 is not formed with a ground layer (a member corresponding to the ground layer 3 of the present embodiment, here and hereinafter) around pads (members corresponding to the pads 2*a* and 2*b* of the present embodiment, here and hereinafter), and grooves (spaces corresponding to the grooves 4 of the present embodiment, here and hereinafter) are thus not present between the pads and ground layer.

The radiation level at the connection end portion E of the printed wiring board 1 according to Working Example 1 was lower than that of Comparative Example 1, and the radiation level of the printed wiring board 1 according to Working Example 1 was about 83% of that of Comparative Example 1.

Working Example 2

Model 2 as Working Example 2 was defined to have a structure in which another ground layer 3 was formed on the other main surface of the printed wiring board 1 according to the above-described second example. The number of conductive layers in the printed wiring board of Model 2 of Working Example 2 is two. Another ground layer is formed substantially on the whole surface of the other main surface of the insulating substrate. For comparison with Working Example 2, Model 2-2 of a printed wiring board according to Comparative Example 2 was defined. Model 2-2 of Comparative Example 2 was defined under the same conditions as those for Model 2 of Working Example 2 except that the ground layer surrounding entire circumferences of the pads were not formed on the one main surface of the insulating substrate.

As illustrated in FIG. 9A, Model 2 of the printed wiring board 1 according to Working Example 2 has the grooves 4 whereas the printed wiring board according to Model 2-2 of Comparative Example 2 has no grooves.

The radiation level at the connection end portion E of the printed wiring board 1 according to Working Example 2 was lower than that of Comparative Example 2, and the radiation level of the printed wiring board 1 according to Working Example 2 was about 53% of that of Comparative Example 2.

Working Example 3

Model 3 of the printed wiring board 1 according to the above-described eighth example was defined as Working Example 3. The number of conductive layers in the printed wiring board of Model 3 is three. The ground layer was not provided at the connection end portion E side than the pads on the one main surface of the insulating substrate, and the ground layer was provided only at the opposite side to the connection end portion E. Model 3 of the printed wiring board 1 according to the eighth example has the structure illustrated in FIG. 8A to FIG. 8H. For comparison with Model 3 of Working Example 3, Model 3-2 of a printed wiring board according to Comparative Example 3 was defined. Model 3-2 of Comparative Example 3 was defined under the same conditions as those for Model 3 of Working Example 3 except that the grooves 4 surrounding the pads 2*a* and 2*b* were not provided.

Figure 9B:
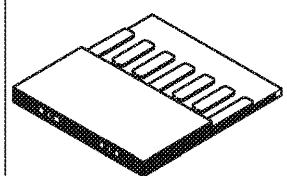
FIG. 9B is a diagram illustrating antenna characteristics of Working Example 3 according to an embodiment.
Figure 9B:
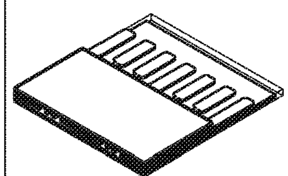
Figure 9B:
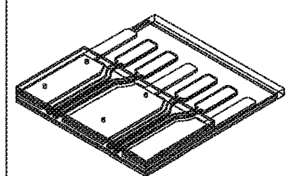
Figure 9B:
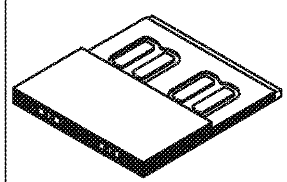
Figure 9B:
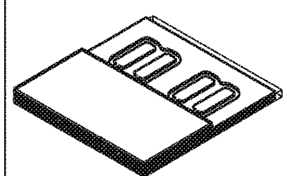
Figure 9B:
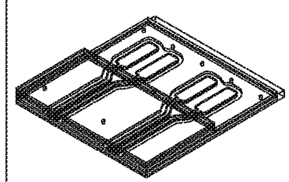
Figure 9C:
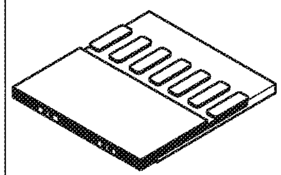
FIG. 9C is a diagram illustrating antenna characteristics of Working Example 4 according to an embodiment.
Figure 9C:
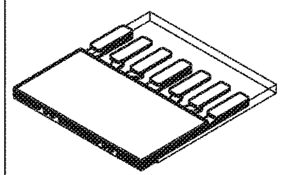
Figure 9C:
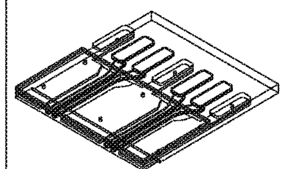
Figure 9C:
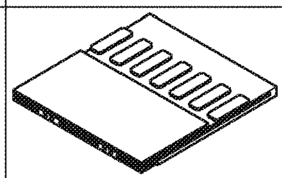
Figure 9C:
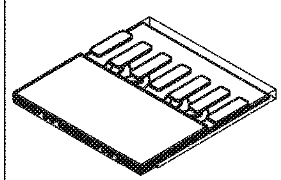
Figure 9C:
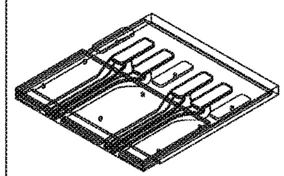
Figure 9C:
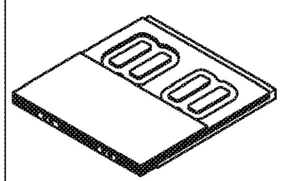
Figure 9C:
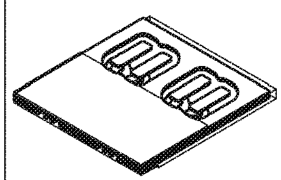
Figure 9C:
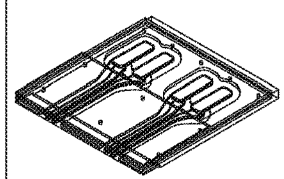
Figure 9D:
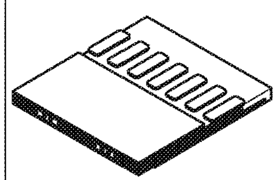
FIG. 9D is a diagram illustrating antenna characteristics of Working Example 5 according to an embodiment.
Figure 9D:
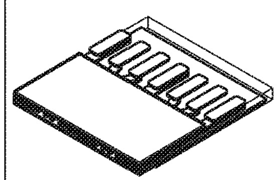
Figure 9D:
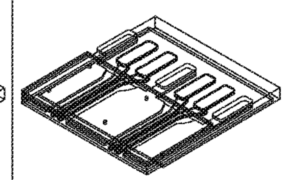
Figure 9D:
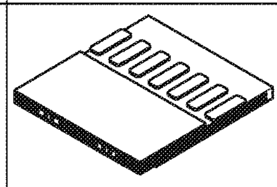
Figure 9D:
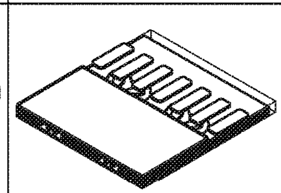
Figure 9D:
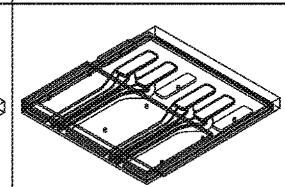
Figure 9D:
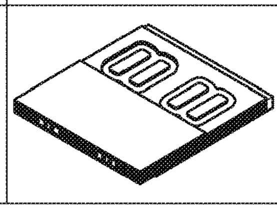
Figure 9D:
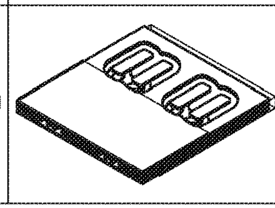
Figure 9D:
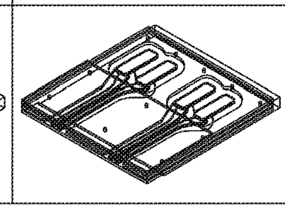

As illustrated in FIG. 9B, Model 3 of the printed wiring board 1 according to Working Example 3 has the grooves 4 whereas the printed wiring board according to Model 3-2 of Comparative Example 3 has no grooves.

The radiation level at the connection end portion E of the printed wiring board 1 according to Working Example 3 was lower than that of Comparative Example 3, and the radiation level of the printed wiring board 1 according to Working Example 3 was about 46% of that of Comparative Example 3.

Working Example 4

Model 4 of the printed wiring board 1 according to the above-described third example was defined as Working Example 4. The number of conductive layers in the printed wiring board of Model 4 is two. Model 4 of the printed wiring board 1 according to the third example has the structure illustrated in FIG. 3A to FIG. 3H. For comparison with Working Example 4, Models 4-21 and 4-22 of printed wiring boards according respectively to Comparative Examples 4-1 and 4-2 were defined. Model 4 of Working Example 4 is formed with a ground layer surrounding the pads on the whole surface of the one main surface of the insulating substrate and also with another ground layer surrounding the wirings on the whole surface of the other main surface of the insulating substrate.

In contrast, Model 4-21 of Comparative Example 4-1 is not formed with a ground layer surrounding the entire circumferences of the pads on the one main surface of the insulating layer. The ground layer was not provided at the connection end portion E side than the pads on the one main surface of the insulating substrate, and the ground layer was provided only at the opposite side to the connection end portion E. In Model 4-21 of Comparative Example 4-1, the ground layer was not provided only within a region at the connection end portion E side than formation locations of the pads on the other main surface (main surface formed with the wirings) of the insulating substrate, and the ground layer was provided only at the opposite side to the connection end portion E to surround the wirings.

As in Comparative Example 4-1, Model 4-22 of Comparative Example 4-2 is not formed with a ground layer surrounding the entire circumferences of the pads on the one main surface of the insulating layer. The ground layer was not provided at the connection end portion E side than the pads on the one main surface of the insulating substrate, and the ground layer was provided only at the opposite side to the connection end portion E. Different from Model 4-21 of Comparative Example 4-1, Model 4-22 of Comparative Example 4-2 is formed with a ground layer surrounding the wirings on the whole surface of the other main surface (main surface formed with the wirings) of the insulating substrate as in Working Example 4.

Both of Models 4-21 and 4-22 of Comparative Examples 4-1 and 4-2 do not have grooves 4 surrounding the pads 2*a* and 2*b*. Model of Comparative Example 4-1 does not have grooves 4 surrounding the end parts 5*a*' of wirings 5*a* and end parts 5*b*' of wirings 5*b*.

The radiation level at the connection end portion E of the printed wiring board 1 according to Working Example 4 was lower than those of Comparative Example 4-1 and Comparative Example 4-2, and the radiation level of the printed wiring board 1 according to Working Example 4 was about 5% of that of Comparative Example 4-1. The radiation level of the printed wiring board 1 according to Working Example 4 was about 32% of that of Comparative Example 4-2.

Working Example 5

Model 5 of the printed wiring board 1 according to the above-described fourth example was defined as Working Example 5. The number of conductive layers in the printed wiring board of Model 5 is three. Model 5 of the printed wiring board 1 according to the fourth example has the structure illustrated in FIG. 4A to FIG. 4I. For comparison with Working Example 5, Models 5-21 and 5-22 of printed wiring boards according respectively to Comparative Examples 5-1 and 5-2 were defined. Model 5 of Working Example 5 is formed with a ground layer surrounding the pads on the whole surface of the one main surface of the insulating substrate and also with another ground layer surrounding the wirings on the whole surface of the other main surface of the insulating substrate. A further ground layer is formed substantially on the whole surface of another insulating substrate via the conductive layer on the other main surface formed with the wirings.

In contrast, Model 5-21 of Comparative Example 5-1 is not formed with a ground layer surrounding the entire circumferences of the pads on the one main surface of the insulating layer. The ground layer was not provided at the connection end portion E side than the pads on the one main surface of the insulating substrate, and the ground layer was provided only at the opposite side to the connection end portion E. In Model 5-21 of Comparative Example 5-1, the ground layer was not provided only within a region at the connection end portion E side than formation locations of the pads on the other main surface (main surface formed with the wirings) of the insulating substrate, and the ground layer was provided only at the opposite side to the connection end portion E to surround the wirings. A ground layer was formed substantially on the whole surface of the other main surface of an insulating substrate that was laminated on the conductive layer on the other main surface formed with the wirings. This ground layer is the lowermost layer of the three conductive layers.

As in Model 5-21 of Comparative Example 5-1, Model 5-22 of Comparative Example 5-2 is not formed with a ground layer surrounding the entire circumferences of the pads on the one main surface of the insulating layer. The ground layer was not provided at the connection end portion E side than the pads on the one main surface of the insulating substrate, and the ground layer was provided only at the opposite side to the connection end portion E. Different from Model 5-21 of Comparative Example 5-1, Model 5-22 of Comparative Example 5-2 is formed with a ground layer surrounding the wirings on the whole surface of the other main surface of the insulating substrate. A ground layer was formed substantially on the whole surface of the other main surface of an insulating substrate that was laminated on the conductive layer at the other main surface formed with the wirings. This ground layer is the lowermost layer of the three conductive layers.

Both of Models 5-21 and 5-22 of Comparative Examples 5-1 and 5-2 do not have grooves 4 surrounding the pads 2*a* and 2*b*. Different from Model 5 of Working Example 5, Model 5-21 of Comparative Example 5-1 does not have grooves 4 surrounding the end parts 5*a*' of wirings 5*a* and end parts 5*b*' of wirings 5*b*.

The radiation level at the connection end portion E of the printed wiring board 1 according to Working Example 5 was lower than those of Comparative Example 5-1 and Comparative Example 5-2, and the radiation level of the printed wiring board 1 according to Working Example 5 was about 11% of that of Comparative Example 5-1. The radiation level of the printed wiring board 1 according to Working Example 5 was about 22% of that of Comparative Example 5-2.

As the above, the radiation levels can be reduced in all the forms of Working Examples 1 to 5.

DESCRIPTION OF REFERENCE NUMERALS

1 Printed wiring board
10 Substrate
11 First substrate
11*a* Conductive layer
11*b* Insulating substrate
12 Second substrate
2 Pad
2*a* First pad
2*b* Second pad
3 Ground layer
3*a* Pad surrounding part
4 Groove
5 Wiring
5*a* First wiring
5*b* Second wiring
20 Coverlay
30 Reinforcement layer
70 Engageable part
80 Tab-like members
E Connection end portion
Ed End edge
S Offset part

The invention claimed is:

1. A printed wiring board comprising a first substrate, the first substrate comprising:

a plurality of pairs of pads to be connected to a connector, wherein the pads align along a connection end portion of the first substrate to be connected to the connector, each of the pairs includes a first pad and a second pad, the first pad is disposed on one main surface of the first substrate and transmits a first signal, and the second pad is disposed in parallel with the first pad, is separated from the first pad by a groove, and transmits a second signal that is a reverse-phase signal of the first signal; and a first ground layer to be connected to a ground contact, wherein the first ground layer has an inner edge that surrounds an entire circumference of a region of each of the pairs and the inner edge of the first ground layer is at an approximately uniform distance from an outer edge of the region with a groove between the first ground layer and the region.

2. The printed wiring board according to claim 1, further comprising:

wirings disposed on another main surface of the first substrate, wherein the wirings include a first wiring and a second wiring, the first wiring is electrically connected to the first pad with a via penetrating through the first substrate, the second wiring is disposed in parallel with the first wiring and electrically connected to the second pad with a via penetrating through the first substrate, and the wirings function as differential signal lines; and a second ground layer to be connected to a ground contact, wherein the second ground layer has an inner edge that surrounds an entire circumference of a region including the first wiring and the second wiring, and the inner edge of the second ground layer is located at a location separated from an outer edge of the region by a groove.

3. The printed wiring board according to claim 1, further comprising a coverlay that does not cover the first pad and the second pad.

4. The printed wiring board according to claim 1, further comprising:

a second substrate laminated directly on another main surface of the first substrate, or laminated on the other main surface with another substrate of the printed wiring board, the another substrate being interposed between the second substrate and the other main surface; and a reinforcement layer provided within a region including the connection end portion, wherein the reinforcement layer is disposed on a main surface of the second substrate to face the other main surface of the first substrate.

5. The printed wiring board according to claim 1, wherein the first ground layer is disposed on a whole surface of the one main surface and surrounds the entire circumference of the region, and an outer edge of the first ground layer is located inside, by a predetermined offset amount, from an outer edge of the main surface of the first substrate which is forming with the first ground layer and includes tab-like members that extend rightward and leftward at side edge parts of the connection end portion.

6. The printed wiring board according to claim 1, wherein the pairs each comprising the first pad and the second pad are disposed in parallel, on the one main surface of the first substrate, along the connection end portion, and the first ground layer covers spaces between the pairs.

7. The printed wiring board according to claim 6, wherein a pitch between the pairs for which the first ground layer is formed is longer than a width of the groove formed between the first pad and the second pad.

* * * * *